United States Patent
Park et al.

(10) Patent No.: US 11,713,952 B2
(45) Date of Patent: *Aug. 1, 2023

(54) ORGANIC PHOTOELECTRIC DEVICE, IMAGE SENSOR, AND ELECTRONIC DEVICE

(71) Applicant: Samsung Electronics Co., Ltd., Suwon-si (KR)

(72) Inventors: Kyung Bae Park, Hwaseong-si (KR); Sung Jun Park, Yongin-si (KR); Hiromasa Shibuya, Suwon-si (KR); Sung Young Yun, Suwon-si (KR); Gae Hwang Lee, Seongnam-si (KR); Yong Wan Jin, Seoul (KR); Chui Joon Heo, Busan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 384 days.

This patent is subject to a terminal disclaimer.

(21) Appl. No.: 16/875,188

(22) Filed: May 15, 2020

(65) Prior Publication Data
US 2020/0284568 A1    Sep. 10, 2020

(30) Foreign Application Priority Data
May 17, 2019    (KR) .................. 10-2019-0058372

(51) Int. Cl.
*H10K 30/30*    (2023.01)
*F42B 35/00*    (2006.01)
(Continued)

(52) U.S. Cl.
CPC .............. *F42B 35/00* (2013.01); *G02B 21/18* (2013.01); *G06T 7/0004* (2013.01);
(Continued)

(58) Field of Classification Search
CPC ................ H01I 51/0053; H01I 51/0072; H01I 51/0046; H01I 51/4253; H10K 85/621;
(Continued)

(56) References Cited

U.S. PATENT DOCUMENTS 6,300,612 B1    10/2001    Yu
7,129,466 B2    10/2006    Iwasaki
(Continued)

FOREIGN PATENT DOCUMENTS

CN    107141243 A    9/2017
EP    3739641 A1    11/2020
(Continued)

OTHER PUBLICATIONS

Extended European Search Report dated Sep. 25, 2020, issued in corresponding European Patent Application No. 20174990.0.
(Continued)

*Primary Examiner* — Uyen M Tran
(74) *Attorney, Agent, or Firm* — Harness, Dickey & Pierce, P.L.C.

(57) ABSTRACT

Disclosed are an organic photoelectric device including a first electrode and a second electrode facing each other and a photoelectric conversion layer between the first electrode and the second electrode, wherein the photoelectric conversion layer includes a p-type semiconductor, an n-type semi-
(Continued)

US 11,713,952 B2
Page 2 conductor, and an n-type dopant represented by Chemical Formula 1, and an image sensor and an electronic device including the same.

[Chemical Formula 1]

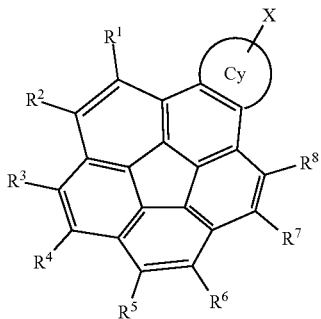

Definitions of Chemical Formula 1 are the same as defined in the detailed description.

22 Claims, 17 Drawing Sheets

(51) Int. Cl.
G02B 21/18 (2006.01)
G06T 7/00 (2017.01)
H10K 85/60 (2023.01)
H10K 85/20 (2023.01)

(52) U.S. Cl.
CPC ....... H10K 85/621 (2023.02); H10K 85/6572 (2023.02); *H10K 30/30* (2023.02); *H10K 85/211* (2023.02)

(58) Field of Classification Search
CPC .. H10K 85/6572; H10K 85/211; H10K 30/35; H10K 30/30
See application file for complete search history.

(56) References Cited

U.S. PATENT DOCUMENTS

| | | | |
|---|---|---|---|
| 7,566,943 B2 | 7/2009 | Yokoyama | |
| 7,794,854 B2 | 9/2010 | Yamada et al. | |
| 7,969,646 B2 | 6/2011 | Miteva et al. | |
| 7,973,307 B2 | 7/2011 | Rand et al. | |
| 8,035,708 B2 | 10/2011 | Takizawa et al. | |
| 8,426,727 B2 | 4/2013 | Pfeiffer et al. | |
| 8,592,931 B2 | 11/2013 | Hayashi et al. | |
| 8,625,016 B2 | 1/2014 | Fossum et al. | |
| 8,704,213 B2 | 4/2014 | Suzuki | |
| 8,907,352 B2 | 12/2014 | Naito | |
| 9,114,377 B2 | 8/2015 | Swager et al. | |
| 9,231,214 B2 | 1/2016 | Tolbert et al. | |
| 10,256,414 B2 | 4/2019 | Lim et al. | |
| 10,505,146 B2 | 12/2019 | Heo et al. | |
| 2007/0012955 A1 | 1/2007 | Ihama | |
| 2008/0142792 A1 | 6/2008 | Park et al. | |
| 2010/0297009 A1 | 11/2010 | Olson et al. | |
| 2012/0241003 A1* | 9/2012 | Wachi | H10K 30/81 136/263 |
| 2012/0313088 A1 | 12/2012 | Yofu et al. | |
| 2013/0154040 A1 | 6/2013 | Huh et al. | |
| 2014/0209173 A1 | 7/2014 | Momose | |
| 2016/0013248 A1 | 1/2016 | Sawaki | |
| 2017/0069690 A1 | 3/2017 | Sakurai et al. | |
| 2017/0331050 A1 | 11/2017 | Yagi et al. | |
| 2018/0006090 A1 | 1/2018 | Leem et al. | |
| 2018/0062112 A1 | 3/2018 | Heo et al. | |
| 2018/0114935 A1 | 4/2018 | Liang et al. | |
| 2018/0123050 A1 | 5/2018 | Rosselli et al. | |
| 2019/0081251 A1 | 3/2019 | Obana et al. | |
| 2019/0363206 A1 | 11/2019 | Fukuda et al. | |
| 2021/0043846 A1 | 2/2021 | Arai et al. | |

FOREIGN PATENT DOCUMENTS

| | | | |
|---|---|---|---|
| JP | 2012089725 A | 5/2012 | |
| JP | 2012248766 A | 12/2012 | |
| JP | 5227511 B2 | 7/2013 | |
| JP | 5323025 B2 | 10/2013 | |
| JP | 2017218381 A | 12/2017 | |
| JP | 2018513558 A | 5/2018 | |
| JP | 2018090684 A | 6/2018 | |
| KR | 20120131866 A | 12/2012 | |
| KR | 20130070892 A | 6/2013 | |
| KR | 20150066616 A | 6/2015 | |
| KR | 101709941 B1 | 2/2017 | |
| KR | 20180002272 A | 1/2018 | |
| KR | 20180024296 A | 3/2018 | |
| WO | WO-2017159025 A1 | 9/2017 | |

OTHER PUBLICATIONS

Extended European Search Report dated Sep. 25, 2020, issued in corresponding European Patent Application No. 20174222.8.
E.M. Cabaleiro-Lago et al., A theoretical study of complexes between fullerenes and concave receptors with interest in photovoltaics *Phys. Chem. Chem. Phys.*, vol. 19, 2017, pp. 26787-26798.
Ru-Qiang Lu et al., 'Cocrystallization of Imide-Fused Corannulene Derivatives and C60: Guest-Induced Conformational Switching and 1:1 Segregated Packing' *Chemistry: An Asian Journal*, vol. 13, 2018, pp. 2934-2938.
C. Mejuto et al., 'Self-Assembly of Di-N-Heterocyclic Carbene-Gold-Adorned Corannulenes on C60' *Chemistry: A European Journal*, vol. 23, 2017, pp. 10644-10651.
R. Chen et al., 'Corannulene derivatives for organic electronic: From molecular engineering to applications' *Chinese Chemical Letters*, vol. 27, 2016, pp. 1175-1183.
U.S. Appl. No. 16/875,168, dated May 15, 2020.
Notice of Allowance dated Jan. 5, 2022, issued in corresponding U.S. Appl. No. 16/875,168.
Y. Bando et al., 'Corannulene-Fused Anion-Responsive p-Conjugated Molecules that Form Self-Assemblies with Unique Electronic Properties' *Chemistry—An Asian Journal*, vol. 8, 2013, pp. 2088-2095.
K. G. Upul R. Kumarasinghe et al., 'Bis-corannulenoanthracene: An Angularly Fused Pentacene as a Precursor for Barrelene-Tethered Receptors for Fullerenes' *Organic Letters*, vol. 18, No. 3, 2016, pp. 3054-3057.
D. Josa et al., 'Ring-annelated corannulenes as fullerene receptors. A DFT-D study' *RSC Advances*, vol. 4, 2014, pp. 29826-29833.
R. Chen et al., 'Corannulene derivatives for organic electronics: From molecular engineering to applications' *Chinese Chemical Letters*, vol. 27, 2016, pp. 1175-1183.
B. M. Schmidt et al., 'Electron-poor N-substituted imide-fused corannulenes' *Chem. Communications*, vol. 48, 2012, pp. 6520-6522.
L. Meng et al., 'Thiophene-Fused π☐Systems from Diarylacetylenes and Elemental Sulfur' *Journal of the American Chemistry Society*, vol. 138, 2016, pp. 10351-10355.
C. Lin et al., 'High Photoelectric Conversion Efficiency of Metal Phthalocyanine/Fullerene Heterojunction Photovoltaic Device' *International Journal of Molecular Sciences*, vol. 12, 2011, pp. 476-505.
M.D. Iosip et al., 'New dithieno[3,2-b:2',3'-d]thiophene oligomers as promising materials for organic field-effect transistor applications' *Synthetic Metals*, vol. 146, 2004, pp. 251-257.
D.V. Konarev et al. "Donor-acceptor interaction of fullerence $C_{60}$ with triptycene in molecular complex TPC•$C_{60}$" J. Mol. Struct. vol. 526, 2000, pp. 25-29. dated Dec. 10, 1999.

(56) References Cited

OTHER PUBLICATIONS

Keita Sakakibara et al., "Chiroptical properties of an alternatingly functionalized cellotriose bearing two porphyrin groups" Chem. Commun., vol. 48, 2012, pp. 7672-7674. dated Mar. 21, 2012.
Tobias Hahn et al., "Role of Intrinsic Photogeneration in Single Layer and Bilayer Solar Cells with $C_{60}$ and PCBM" J. Phys. Chem. C, vol. 120, 2016, pp. 25083-25091. published Oct. 12, 2013.
S.J. Kim et al., 'Organic-on-silicon complementary metal-oxide-semiconductor colour image sensors' Scientific Reports 5:7708, Jan. 2015.
V. Rodin et al., 'Generalized effective-medium model for the carrier mobility in amorphous organic semiconductors' Physical Review B, 91, 155203, 2015.
F. Suzuki et al., 'Effects of Structural and Energetic Disorders on Charge Transports in Crystal and Amorphous Organic Layers' Scientific Reports, 8:5203, Mar. 2018.
Yuchuan Shao et al., "Origin and elimination of photocurrent hysteresis by fullerene passivation in $CH_3NH_3PbI_3$ planar heterojunction solar cells" Nature Communications pp. 1-7 published Dec. 15, 2014.
Y. Kim et al., 'Benzocyclobutene-fullerene bisadducts as novel electron acceptors for enhancing open-circuit voltage in polymer solar cells' *Solar Energy Materials & Solar Cells*, vol. 141, May 2015, pp. 87-92.
M. J. Frisch, et al., Gaussian 09, Revision D.01; Gaussian, Inc.: Wallingford, CT 2009.
Juha Alakarhu, 'Image Sensors and Image Quality in Mobile Phones' *International Image Sensor Workshop*, Jun. 2007, pp. 1-4.
Office Action dated Oct. 10, 2022, issued in corresponding European Patent Application No. 20174990.0.

\* cited by examiner

ORGANIC PHOTOELECTRIC DEVICE, IMAGE SENSOR, AND ELECTRONIC DEVICE

CROSS-REFERENCE TO RELATED APPLICATION

This application claims priority to and the benefit of Korean Patent Application No. 10-2019-0058372, filed in the Korean Intellectual Property Office on May 17, 2019, the entire contents of which are incorporated herein by reference.

BACKGROUND

1. Field

Example embodiments provide an organic photoelectric device, an image sensor, and an electronic device.

2. Description of Related Art

A photoelectric device converts light into an electrical signal using photoelectric effects, it may include a photodiode, a phototransistor, and the like, and it may be applied to an image sensor, a solar cell, an organic light emitting diode, and the like.

An image sensor including a photodiode requires high resolution and thus a small pixel. At present, a silicon photodiode is widely used, but it has a problem of deteriorated sensitivity since silicon photodiode has a smaller absorption area due to small pixels. Accordingly, an organic material that is capable of replacing silicon has been researched.

The organic material has a high extinction coefficient and selectively absorbs light in a particular wavelength region depending on a molecular structure, and thus may simultaneously replace a photodiode and a color filter and resultantly improve sensitivity and contribute to high integration.

However, the organic material may differ from silicon due to its high binding energy and recombination behavior, so that an organic photovoltaic device including the organic material may exhibit relatively lower characteristics than silicon-based photovoltaic devices.

SUMMARY

Example embodiments provide an organic photoelectric device capable of increasing wavelength selectivity and improving photoelectric conversion characteristics, heat resistance, and charge mobility.

Example embodiments also provide an image sensor including the organic photoelectric device.

Example embodiments also provide an electronic device including the image sensor.

According to example embodiments, an organic photoelectric device includes a first electrode and a second electrode facing each other; and a photoelectric conversion layer between the first electrode and the second electrode. The photoelectric conversion layer includes a p-type semiconductor, an n-type semiconductor, and an n-type dopant. The n-type dopant is represented by Chemical Formula 1.

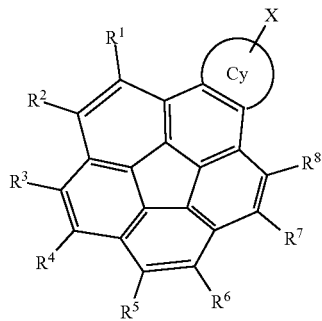

[Chemical Formula 1]

In Chemical Formula 1,

Cy is a cyclic hydrocarbon group selected from a C3 to C20 alicyclic hydrocarbon group and a C6 to C20 aromatic hydrocarbon group, or a fused ring group of two or more cyclic hydrocarbon groups, X is at least one bulky substituent selected from a substituted or unsubstituted C3 to C30 branched alkyl group, a substituted or unsubstituted C3 to C30 cycloalkyl group, a substituted or unsubstituted C3 to C30 heterocycloalkyl group, a substituted or unsubstituted C6 to C30 aryl group, and a substituted or unsubstituted C2 to C30 heteroaryl group, and $R^1$ to $R^8$ are independently hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, provided that at least one of $R^1$ to $R^8$ is a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof.

In some embodiments, at least one of the p-type semiconductor and the n-type semiconductor may be a light absorbing material configured to selectively absorb one of red light, green light, and blue light.

In some embodiments, then-type semiconductor may include fullerene or a fullerene derivative.

In some embodiments, one of the p-type semiconductor and the n-type semiconductor may be a light absorbing material that is configured to selectively absorb green light having a maximum absorption wavelength at about 520 nm to about 580 nm.

In some embodiments, in Chemical Formula 1, at least one of $R^1$ to $R^3$ and at least one of $R^6$ to $R^8$ may be the same or different; and at least one of $R^1$ to $R^3$ and at least one of $R^6$ to $R^8$ may be a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof.

In some embodiments, in Chemical Formula 1, at least one bulky substituent of $R^1$ to $R^3$ and at least one bulky substituent of $R^6$ to $R^8$ may be present symmetrically with respect to an axis through Cy.

In some embodiments, in Chemical Formula 1, at least one of $R^1$ and $R^2$ and at least one of $R^7$ and $R^8$ may be the same or different; and, at least one of $R^1$ and $R^2$ and at least one of $R^7$ and $R^8$ may be a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof.

In some embodiments, in Chemical Formula 1, $R^2$ and $R^7$ may be a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, and $R^1$, $R^3$, $R^4$, $R^5$, $R^6$, and $R^8$ may be hydrogen, deuterium, a halogen, a cyano group, a C1 to C20 linear alkyl group, or a combination thereof.

In some embodiments, in Chemical Formula 1, two adjacent substituents of $R^1$ to $R^3$ and two adjacent substituents of $R^6$ to $R^8$ may be linked to each other to form a C3 to C20 alicyclic hydrocarbon group.

In some embodiments, then-type dopant represented by Chemical Formula 1 may be a compound represented by Chemical Formula 1A.

[Chemical Formula 1A]

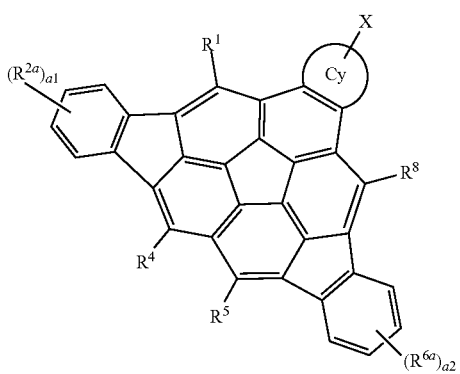

In Chemical Formula 1A,

Cy is a cyclic hydrocarbon group selected from a C3 to C20 alicyclic hydrocarbon group and a C6 to C20 aromatic hydrocarbon group or a fused ring group of two or more cyclic hydrocarbon groups, X is at least one bulky substituent selected from a substituted or unsubstituted C3 to C30 branched alkyl group, a substituted or unsubstituted C3 to C30 cycloalkyl group, a substituted or unsubstituted C3 to C30 heterocycloalkyl group, a substituted or unsubstituted C6 to C30 aryl group, and a substituted or unsubstituted C2 to C30 heteroaryl group, $R^1$, $R^{2a}$, $R^4$, $R^5$, $R^{6a}$, and $R^8$ are independently hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, and a1 and a2 are independently an integer of 1 to 4.

In some embodiments, the cyclic hydrocarbon group in Cy may be a heterocyclic group including at least one functional group selected from —N═, —NR—, —O—, —S—, —Se—, —Te—, —C(═O)—, —C(═S)—, —C(═Se)—, —C(═Te)—, —C(═C(CN)$_2$)—, and —C(═NR)— in the ring wherein R is a C1 to C10 alkyl group.

In some embodiments, n-type dopant in the photoelectric conversion layer may be in an upper portion of the photoelectric conversion layer.

In some embodiments, a content of the n-type dopant may be increased toward the surface of the upper portion of the photoelectric conversion layer.

The photoelectric conversion layer may include a first photoelectric conversion layer and a second photoelectric conversion layer. The first photoelectric conversion layer may include a p-type semiconductor and an n-type semiconductor. The second photoelectric conversion layer may include a p-type semiconductor, an n-type semiconductor, and the n-type dopant represented by Chemical Formula 1.

In some embodiments, a second composition ratio ($p^2/n^2$) of the p-type semiconductor relative to the total amount of the n-type semiconductor and the n-type dopant of the second photoelectric conversion layer may be smaller than a first composition ratio ($p^1/n^1$) of the p-type semiconductor relative to the n-type semiconductor of the first photoelectric conversion layer.

In some embodiments, the first photoelectric conversion layer may be thicker than the second photoelectric conversion layer.

According to another embodiment, an image sensor including the organic photoelectric device is provided.

According to another embodiment, an electronic device including the image sensor is provided.

According to example embodiments, an organic photoelectric device includes a first electrode and a second electrode facing each other; and a photoelectric conversion layer between the first electrode and the second electrode. The photoelectric conversion layer includes a p-type semiconductor, an n-type semiconductor, and an n-type dopant. The n-type dopant is represented by Chemical Formula 1.

[Chemical Formula 1]

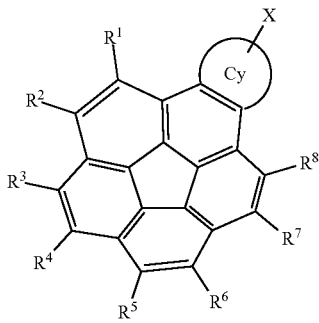

In Chemical Formula 1,

Cy includes a C3 to C20 alicyclic hydrocarbon group and a C6 to C20 aromatic hydrocarbon group, or a fused ring group of two or more cyclic hydrocarbon groups, X includes a substituted or unsubstituted C3 to C30 branched alkyl group, a substituted or unsubstituted C3 to C30 cycloalkyl group, a substituted or unsubstituted C3 to C30 heterocycloalkyl group, a substituted or unsubstituted C6 to C30 aryl group, and a substituted or unsubstituted C2 to C30 heteroaryl group, and $R^1$ to $R^8$ are independently hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, provided that at least one of $R^1$ to $R^8$ includes a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof.

In some embodiments, the n-type semiconductor may be a fullerene or a fullerene derivative.

In some embodiments, the n-type semiconductor may be a light absorbing material that is configured to selective absorb green light having a maximum absorption wavelength in a range of about 520 nm to about 580 nm.

According to another embodiment, an image sensor including the organic photoelectric device is provided.

According to another embodiment, an electronic device including the image sensor is provided.

In example embodiments, the wavelength selectivity of the organic photoelectric device may be improved and photoelectric conversion characteristics, heat resistance, and charge mobility may be improved.

DETAILED DESCRIPTION

Figure 1:
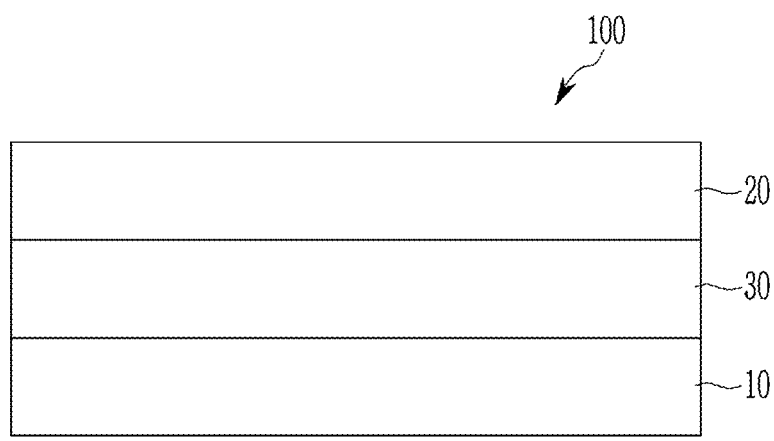
FIG. 1 is a cross-sectional view illustrating an organic photoelectric device according to an embodiment.

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the drawings, parts having no relationship with the description are omitted for clarity of the embodiments, and the same or similar constituent elements are indicated by the same reference numeral throughout the specification.

As used herein, "combination" includes two or more mixtures, inter-substitutions, and two or more stacked structures.

As used herein, when specific definition is not otherwise provided, "substituted" refers to replacement of a hydrogen of a compound, a functional group, or a moiety by a halogen atom (—F, —Cl, —Br, or —I), a hydroxyl group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, phosphoric acid group or a salt thereof, a C1 to C20 alkyl group, a C1 to C20 alkoxy group, a C2 to C20 alkenyl group, a C2 to C20 alkynyl group, a C6 to C30 aryl group, a C7 to C30 arylalkyl group, a C1 to C20 alkoxy group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, or a combination thereof (e.g., a C1 to C20 haloalkyl group such as a C1 to C20 trifluoroalkyl group).

As used herein, when a definition is not otherwise provided, "hetero" refers to one including one to three heteroatoms selected from N, O, S, P, Se, Te, and Si, and remaining carbons in a compound, a functional group, or a moiety.

As used herein, when a definition is not otherwise provided, "aryl group" refers to a group including at least one hydrocarbon aromatic moiety, for example all the elements of the hydrocarbon aromatic moiety having p-orbitals which form conjugation such as a phenyl group or a naphthyl group; two or more hydrocarbon aromatic moieties linked by a sigma bond such as a biphenyl group, a terphenyl group, or a quarterphenyl group; and two or more hydrocarbon aromatic moieties fused directly or indirectly to provide a non-aromatic fused ring such as a fluorenyl group.

As used herein, when a definition is not otherwise provided, "heterocyclic group" is a generic concept of a C2 to C30 (e.g., C2 to C20) heteroaryl group, a C2 to C30 (e.g., C2 to C20) heterocycloalkyl group, or a fused cyclic group thereof, and may include at least one (e.g., 1 to 3) heteroatom instead of carbon (C) in a ring such as an aryl group, a cycloalkyl group, a fused cyclic group thereof, or a combination thereof, wherein the heteroatom may be for example N, O, S, P, Se, Te, and/or Si, but is not limited thereto. When the heterocyclic group is a fused cyclic group, at least one (e.g., 1 to 3) heteroatom may be included in an entire ring or each ring of the heterocyclic group.

As used herein, when a definition is not otherwise provided, "heteroaryl group" refers to an aryl group including at least one heteroatom, wherein the heteroatom may be for example N, O, S, P, Se, Te, and/or Si, but is not limited thereto. At least two heteroaryl groups may be linked directly through a sigma bond or at least two heterocyclic groups may be fused with each other. When the heteroaryl group is a fused ring, each ring may include one to three heteroatoms.

As used herein, when a definition is not otherwise provided, "heteroalkyl group" refers to an alkyl group including at least one heteroatom in the main chain of the alkyl group and may be specifically an alkyl group in which at least one methylene group is replaced by —O—, —S—, —C(=O)—, —C(=S)—, —OC(=O)—, and —C(=O)O—.

As used herein, when a definition is not otherwise provided, "cyclic hydrocarbon group" refers to a C3 to C20 alicyclic hydrocarbon group, a C6 to C20 aromatic hydrocarbon group, a fused cyclic group of two or more cyclic hydrocarbon groups, or a heterocyclic group including a heteroatom therein.

As used herein, when a definition is not otherwise provided, "alicyclic hydrocarbon group" refers to at least one non-aromatic ring (alicyclic ring) or a fused ring in which these non-aromatic rings are fused to each other which is selected from a C3 to C30 cycloalkyl group, for example a C3 to C20 cycloalkyl group or a C3 to C10 cycloalkyl group; a C3 to C30 cycloalkenyl group, for example a C3 to C20 cycloalkenyl group or a C3 to C10 cycloalkenyl group; and a C2 to C30 heterocycloalkyl group, for example a C2 to C20 heterocycloalkyl group or a C3 to C10 heterocycloalkyl group.

As used herein, when a definition is not otherwise provided, "aromatic hydrocarbon group" may include at least one aromatic ring (arene ring) or a fused ring thereof such as a C6 to C30 aryl group, for example a C6 to C20 aryl group or a C6 to C10 aryl group.

As used herein, when a definition is not otherwise provided, "bulky substituent" refers to a substituted or unsubstituted branched alkyl group, a substituted or unsubstituted branched alkoxy group, a substituted or unsubstituted branched alkylsilyl group, a substituted or unsubstituted branched heteroalkyl group, a substituted or unsubstituted aryl group, a substituted or unsubstituted heteroaryl group, a substituted or unsubstituted cycloalkyl group, a substituted or unsubstituted heterocycloalkyl group, or a combination thereof. In some embodiment, the "bulky substituent" refers to a substituted or unsubstituted C3 to C20 (e.g., C4 to C20) branched alkyl group, a substituted or unsubstituted C3 to C20 (e.g., C4 to C20) branched alkoxy group, a substituted or unsubstituted C3 to C20 (e.g., C4 to C20) branched alkylsilyl group, a substituted or unsubstituted C3 to C20 (e.g., C4 to C20) branched heteroalkyl group, a substituted or unsubstituted C6 to C30 (e.g., C6 to C20) aryl group, a substituted or unsubstituted C2 to C30 (e.g., C3 to C20) heteroaryl group, a substituted or unsubstituted C3 to C30 (e.g., C4 to C20) cycloalkyl group, a substituted or unsubstituted C3 to C30 (e.g., C4 to C20) heterocycloalkyl group, and a combination thereof.

Expressions such as "at least one of," when preceding a list of elements (e.g., A, B, and C), modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C.

When the term "about" is used in this specification in connection with a numerical value, it is intended that the associated numerical value include a tolerance of ±10% around the stated numerical value. When ranges are specified, the range includes all values therebetween such as increments of 0.1%.

Hereinafter, an organic photoelectric device according to an embodiment is described.

FIG. 1 is a cross-sectional view illustrating an organic photoelectric device according to an embodiment.

Referring to FIG. 1, an organic photoelectric device 100 according to an embodiment includes a first electrode 10 and a second electrode 20 facing each other and a photoelectric conversion layer 30 disposed between the first electrode 10 and the second electrode 20, wherein the photoelectric conversion layer 30 includes a p-type semiconductor, an n-type semiconductor, and an n-type dopant. The n-type dopant may be represented by Chemical Formula 1.

[Chemical Formula 1]

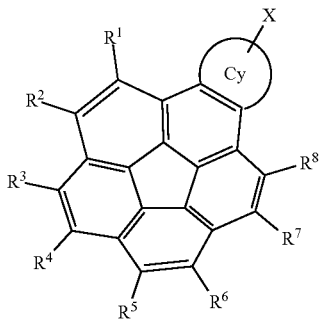

In Chemical Formula 1,

Cy is a cyclic hydrocarbon group selected from a C3 to C20 alicyclic hydrocarbon group and a C6 to C20 aromatic hydrocarbon group or a fused ring group of two or more cyclic hydrocarbon groups, X is at least one bulky substituent selected from a substituted or unsubstituted C3 to C30 branched alkyl group, a substituted or unsubstituted C3 to C30 cycloalkyl group, a substituted or unsubstituted C3 to C30 heterocycloalkyl group, a substituted or unsubstituted C6 to C30 aryl group, and a substituted or unsubstituted C2 to C30 heteroaryl group, and $R^1$ to $R^8$ are independently hydrogen, deuterium, a halogen, a cyano group, a substituted or unsubstituted C1 to C20 linear or branched alkyl group, a substituted or unsubstituted C3 to C20 linear or branched alkylsilyl group, a substituted or unsubstituted C1 to C20 linear or branched alkoxy group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, provided that at least one of $R^1$ to $R^8$ is a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof.

The organic photoelectric device 100 may include a substrate (not shown) and may be disposed at the side of the first electrode 10 or the second electrode 20. The substrate may be for example made of an inorganic material such as glass; an organic material such as polycarbonate, polymethylmethacrylate, polyethyleneterephthalate, polyethylenenaphthalate, polyamide, polyethersulfone, or a combination thereof; or a silicon wafer.

One of the first electrode 10 and the second electrode 20 is an anode and the other is a cathode. For example, the first electrode 10 may be a cathode and the second electrode 20 may be an anode.

At least one of the first electrode 10 and the second electrode 20 may be a light-transmitting electrode and the light-transmitting electrode may be for example made of a conductive oxide such as an indium tin oxide (ITO), indium zinc oxide (IZO), zinc oxide (ZnO), tin oxide (SnO), aluminum tin oxide (AITO), and fluorine doped tin oxide (FTO), or a metal thin layer of a single layer or a multilayer. When one of the first electrode 10 and the second electrode 20 is a non-light-transmitting electrode, it may be made of for example an opaque conductor such as aluminum (Al), silver (Ag), or gold (Au). For example, the first electrode 10 and the second electrode 20 may be all light-transmitting electrodes. For example, the second electrode 20 may be a light receiving electrode disposed at a light receiving side.

The photoelectric conversion layer 30 is a layer in which a p-type semiconductor, an n-type semiconductor, and an n-type dopant form a pn junction, and absorbs external light to generate excitons and then separates the generated excitons into holes and electrons.

The p-type semiconductor and the n-type semiconductor included in the photoelectric conversion layer 30 may absorb light in at least a portion of the wavelength range of the visible light wavelength region, for example, selectively absorb a portion of green light, blue light, and red light.

Each of the p-type semiconductor and the n-type semiconductor may be a light absorbing material, for example, a light absorbing material absorbing light in the visible light region. For example, at least one of the p-type semiconductor and the n-type semiconductor may be a light absorbing material that selectively absorbs one of green light, blue light, and red light. For example, one of the p-type semiconductor and the n-type semiconductor may be a light absorbing material that selectively absorbs one of green light, blue light, and red light. For example, the p-type semiconductor may be a light absorbing material configured to selectively absorb one of green light, blue light, and red light, and the n-type semiconductor may be a fullerene or a fullerene derivative. For example, the p-type semiconductor and the n-type semiconductor may be light absorbing materials that selectively absorb green light having a maximum absorption wavelength at about 520 nm to about 580 nm. For example, the p-type semiconductor may be a light absorbing material that selectively absorbs green light having a maximum absorption wavelength at about 520 nm to about 580 nm, and the n-type semiconductor may be a fullerene or a fullerene derivative.

For example, one of a p-type semiconductor and an n-type semiconductor included in the photoelectric conversion layer 30 may be a light absorbing material having an energy band gap of about 1.7 eV to about 2.3 eV. Within the range of the energy bandgap, it may have a maximum absorption wavelength (λmax) at about 520 nm to about 580 nm to selectively absorb light in a green wavelength region and may have high external quantum efficiency (EQE) to improve photoelectric conversion efficiency. For example, one of a p-type semiconductor and an n-type semiconductor included in the photoelectric conversion layer 30 may be an absorbing material having an energy band gap of about 1.8 eV to about 2.2 eV, and for example, a light absorbing material having an energy band gap of about 1.9 eV to about 2.1 eV.

For example, the p-type semiconductor may be a light absorbing material having an energy band gap of about 1.7 eV to about 2.3 eV, and the n-type semiconductor may be a fullerene or a fullerene derivative.

For example, the p-type semiconductor may have a core structure including an electron donating moiety, a pi-conjugation linker, and an electron accepting moiety. Herein, the electron donating moiety is capable of donating electrons when receiving light to form holes, and the electron accepting moiety is capable of accepting electrons when receiving light. As a specific example of the p-type semiconductor, the compounds disclosed in US Patent Publication No. 2018-0062112 may be used. The entirety of US Patent Publication No. 2018-0062112 is incorporated herein by reference.

For example, the fullerene may be fullerenes of C60 to C120, and for example, may be C60, C70, C74, C76, C78, C80, C82, C84, C90, or C96, but is not limited thereto.

The fullerene derivative refers to a compound having a substituent on the fullerene. Examples of the substituent may be an alkyl group, an aryl group, or a heterocyclic group. The alkyl group may be a C1 to C12 alkyl group, for example, a C1 to C5 alkyl group. The aryl group may be a phenyl group, a naphthyl group, or an anthracenyl group. Herein, the heterocyclic group may be a furyl group, a thienyl group, a pyrrolyl group, an oxazolyl group, a pyridyl group, a quinolyl group, or a carbazolyl group.

Non-limiting examples of the fullerene derivative may include phenyl-C61-butyric acid methylester (PCBM, [6,6]-phenyl-C61-butyric acid methyl ester), and ICBA (indene-C60 bisadduct), and ICMA (indene-C60 monoadduct), but are not limited thereto.

The n-type dopant may be a fullerene subunit derivative including a corannulene structure represented by Chemical Formula 1. The n-type dopant includes a hydrocarbon cyclic group (Cy) having at least one bulky substituent (X) and further includes at least one bulky substituent at a position (at least one of $R^1$ to $R^8$) besides Cy and thereby crystallinity of the n-type dopant may be suppressed effectively. The n-type dopant effectively interacts with the p-type semiconductor and the n-type semiconductor to improve the charge mobility of the photoelectric conversion layer (30). In addition, the n-type semiconductor suppresses aggregation of the p-type semiconductor and the n-type semiconductor, in particular, the n-type semiconductor, thereby significantly reducing light absorption in the blue region (about 400 nm to about 500 nm) to improve color clarity of the device.

The bulky substituent (X) may effectively control steric hindrance between the n-type dopants to maintain a constant interval. Bulky substituents of at least one of $R^1$ to $R^8$ may lower crystallinity of the n-type dopant and is mixed well with p-type semiconductor and n-type semiconductor in the photoelectric conversion layer 30. In addition, bulky substituents of at least one of $R^1$ to $R^8$ may inhibit aggregation of the n-type dopant by allowing a corannulene skeleton of the n-type dopant to surround the n-type semiconductor. In addition, the bulky substituent of at least one of $R^1$ to $R^8$ may improve thermal stability of the n-type dopant which may improve high temperature characteristics when applied to a device.

The n-type dopant has a structure capable of inhibiting aggregation of the n-type semiconductor, but does not expand the conjugated structure of corannulene, thereby suppressing an increase in crystallinity and enabling sublimation purification to be advantageous in a thin film formation process.

The cyclic group hydrocarbon may include one or more heteroatoms in the ring. Specifically, the cyclic hydrocarbon group may be a heterocyclic group including at least one functional group selected from —N=, —NR—, —O—, —S—, —Se—, —Te—, —C(=O)—, —C(=S)—, —C(=Se)—, —C(=Te)—, —C(=C(CN)$_2$)—, and —C(=NR)— in the ring wherein R is a C1 to C10 alkyl group. As such, when Cy is a heterocyclic group, n-type properties of the n-type dopant may be further enhanced.

The HOMO/LUMO levels of the n-type dopant may be adjusted by a combination of the cyclic hydrocarbon group and the bulky substituent (X) substituted therein. For example, when Cy is a hydrocarbon group that does not include an electron withdrawing functional group (e.g., —C(=O)—, —N=, —NR—, etc.), an electron withdrawing functional group may be introduced into the bulky substituent (X). Examples of the bulky substituent (X) having an electron withdrawing functional group include an N-containing cyclic group such as a pyrrolyl group, a pyridyl group, a pyrimidyl group, a triazinyl group, and the like; or a C6 to C20 aryl group substituted with a fluorine (F) group, a cyano (CN) group, a C1 to C10 carboxyl group or an ester group (e.g., acetate group) or a C1 to C10 trifluoroalkyl group (e.g., trifluoromethyl (CF$_3$)).

At least two, for example three or four of $R^1$ to $R^8$ may be a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof.

In Chemical Formula 1, at least one of $R^1$ to $R^3$ and at least one of $R^6$ to $R^8$ may be the same or different, and may be a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof.

In Chemical Formula 1, at least one bulky substituent of $R^1$ to $R^3$ and at least one bulky substituent of $R^6$ to $R^8$ may be present at positions symmetrical with respect to an axis through Cy.

In Chemical Formula 1, at least two of $R^1$ to $R^8$ may be a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof.

In Chemical Formula 1, when including two or more bulky substituents at positions symmetrical with respect to Cy, the n-type dopant may effectively cover the n-type semiconductor (fullerene or the fullerene derivative), thereby suppressing their aggregation.

In Chemical Formula 1, at least one of $R^1$ to $R^3$ and at least one of $R^6$ to $R^8$ may be the same or different, and may be a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof. In this case, steric hindrance may be effectively controlled to suppress aggregation of fullerene or fullerene derivative in the deposition process.

In Chemical Formula 1, at least one of $R^1$ and $R^2$ and at least one of $R^7$ and $R^8$ may be the same or different, and may be a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, and $R^3$, $R^4$, $R^5$, and $R^6$ may be hydrogen, deuterium, a halogen, a cyano group, a C1 to C20 linear alkyl group, or a combination thereof. In this case, steric hindrance may be effectively controlled to suppress aggregation of fullerene or fullerene derivative in the deposition process.

In Chemical Formula 1, $R^2$ and $R^7$ may be a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, and $R^1$, $R^3$, $R^4$, $R^5$, $R^6$, and $R^8$ may be hydrogen, deuterium, a halogen, a cyano group, a C1 to C20 linear alkyl group, or a combination thereof. In this case, by having a bulky substituent on both sides with respect to Cy, the steric hindrance effect may be effectively controlled to suppress aggregation of fullerene or fullerene derivative in the deposition process.

According to an embodiment, in Chemical Formula 1, two adjacent substituents of $R^1$ to $R^3$ and two adjacent substituents of $R^6$ to $R^8$ may be linked to each other to form a C3 to C20 alicyclic hydrocarbon group. Such C3 to C20 alicyclic hydrocarbon group may inhibit expansion of the conjugated structure of corannulene to inhibit an increase in crystallinity. The C3 to C20 alicyclic hydrocarbon group may be fused with a C6 to C20 aromatic hydrocarbon group.

In Chemical Formula 1, $R^2$ and $R^3$ may be linked to each other to form a C3 to C20 alicyclic hydrocarbon group, and $R^6$ and $R^7$ may be linked to each other to form a C3 to C20 alicyclic hydrocarbon group. The C3 to C20 alicyclic hydrocarbon group may be fused with a C6 to C20 aromatic hydrocarbon group. The C3 to C20 alicyclic hydrocarbon group may be a pentagonal ring, and a structure in which the pentagonal ring may be fused with a benzene ring is represented by Chemical Formula 1A.

[Chemical Formula 1A]

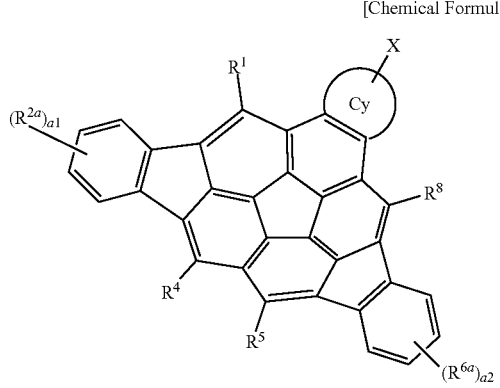

In Chemical Formula 1A,

Cy is a cyclic hydrocarbon group selected from a C3 to C20 alicyclic hydrocarbon group and a C6 to C20 aromatic hydrocarbon group or a fused ring group of two or more cyclic hydrocarbon groups, X is at least one bulky substituent selected from a substituted or unsubstituted C3 to C30 branched alkyl group, a substituted or unsubstituted C3 to C30 cycloalkyl group, a substituted or unsubstituted C3 to C30 heterocycloalkyl group, a substituted or unsubstituted C6 to C30 aryl group, and a substituted or unsubstituted C2 to C30 heteroaryl group, $R^1$, $R^{2a}$, $R^4$, $R^5$, $R^{6a}$, and $R^8$ are independently hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, and a1 and a2 are independently an integer of 1 to 4.

In Chemical Formula 1 and/or 1A, Cy may be pyrrole, furan, pyrroline, pyrrolidinedione, cyclopentanediene, cyclopentanedione, pyrrolo imidazole, pyrrolo imidazole including a ketone (C=O) group in the ring, pyridine, pyrimidine, indole, phthalimide, benzimidazole, benzothiazole, or a fused ring of these and benzene rings.

In Chemical Formula 1 and/or 1A, Cy may be a moiety represented by Chemical Formula 2A.

[Chemical Formula 2A]

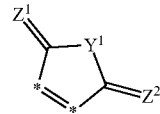

In Chemical Formula 2A, $Y^1$ is $CR^aR^b$ or $NR^c$, $R^a$ and $R^b$ are independently hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, provided that at least one of $R^a$ and $R^b$ is a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, $R^c$ is a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, $Z^1$ and $Z^2$ are O, S, Se, Te, $C(CN)_2$, or $NR^d$, wherein $R^d$ is a C1 to C10 alkyl group or is linked to $Y^1$ of Chemical Formula 2A to provides a fused ring, and

*=* is a linking portion with Chemical Formula 1.

For example, the moiety represented by Chemical Formula 2A may be a moiety represented by Chemical Formula 2A-1.

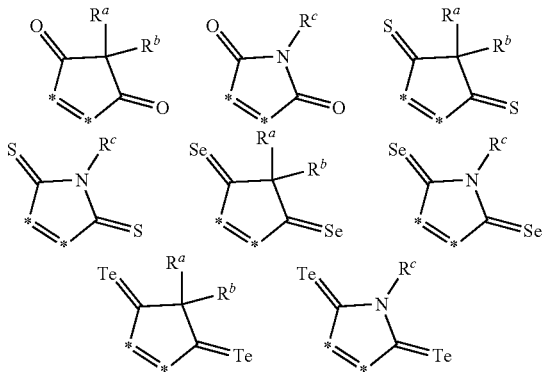

[Chemical Formula 2A-1]

In Chemical Formula 2A-1, $R^a$ and $R^b$ are independently hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, provided that at least one of $R^a$ and $R^b$ is a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, $R^c$ is a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, and

*=* is a linking portion with Chemical Formula 1.

When $Z^2$ is $NR^d$ and $R^d$ is linked to $Y^1$ of Chemical Formula 2A to form a fused ring, Chemical Formula 2A may be a moiety represented by Chemical Formula 2A-2.

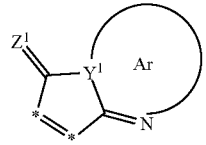

[Chemical Formula 2A-2]

In Chemical Formula 2A-2, $Y^1$ is $CR^a$ or N, $Z^1$ is O, S, Se, Te, $C(CN)_2$, or $NR^d$, and Ar is a C6 to C30 aryl group or a C3 to C30 heteroaryl group.

In Chemical Formula 1, Cy may be a moiety represented by Chemical Formula 2B.

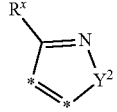

[Chemical Formula 2B]

In Chemical Formula 2B, $Y^2$ is $CR^aR^b$, $NR^c$, O, S, Se, or Te, wherein $R^a$, $R^b$, and $R^c$ are independently hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, $R^x$ is hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, when $Y^2$ is $CR^aR^b$ or $NR^c$, at least one of $R^a$, $R^b$, and $R^x$ and at least one of $R^c$ and $R^x$ are a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, when $Y^2$ is O, S, Se, or Te, $R^x$ is a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, and

*=* is a linking portion with Chemical Formula 1.

For example, the moiety represented by Chemical Formula 2B may be a moiety represented by Chemical Formula 2B-1.

[Chemical Formula 2B-1]

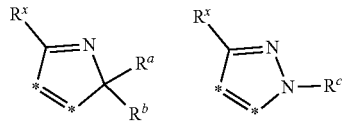

In Chemical Formula 2B-1, $R^a$, $R^b$, and $R^c$ are independently hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, $R^x$ is hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, at least one of $R^a$, $R^b$, and $R^x$ and at least one of $R^c$ and $R^x$ are a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, and

*=* is a linking portion with Chemical Formula 1.

For example, the moiety represented by Chemical Formula 2B may be selected from moieties represented by Chemical Formula 2B-2.

[Chemical Formula 2B-2]

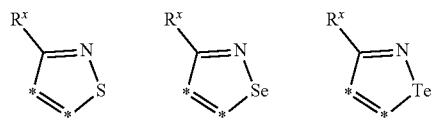

In Chemical Formula 2B-2, $R^x$ is a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, and

*=* is a linking portion with Chemical Formula 1.

In Chemical Formula 1, Cy may be a moiety represented by Chemical Formula 2C.

[Chemical Formula 2C]

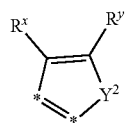

In Chemical Formula 2C, $Y^2$ is $CR^aR^b$, $NR^c$, O, S, Se, or Te, wherein $R^c$ is hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, $R^x$ and $R^y$ are hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, when $Y^2$ is $CR^aR^b$ or $NR^c$, at least one of $R^a$, $R^b$, $R^x$, and $R^y$ and at least one of $R^c$, $R^x$, and $R^y$ are a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, when $Y^2$ is O, S, Se, or Te, at least one of $R^x$ and $R^y$ is a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, and

*—* is a linking portion with Chemical Formula 1.

For example, the moiety represented by Chemical Formula 2C may be a moiety represented by Chemical Formula 2C-1.

[Chemical Formula 2C-1]

In Chemical Formula 2C-1, $R^c$ is hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, $R^x$ and $R^y$ are hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, at least one of $R^c$, $R^x$, and $R^y$ is a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, and

*—* is a linking portion with Chemical Formula 1.

For example, the moiety represented by Chemical Formula 2C may be a moiety represented by Chemical Formula 2C-2.

[Chemical Formula 2C-2]

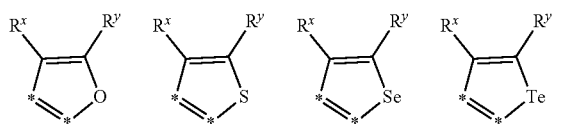

In Chemical Formula 2C-2, $R^x$ and $R^y$ are hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, at least one of $R^x$ and $R^y$ is a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, and

*—* is a linking portion with Chemical Formula 1.

In Chemical Formula 1, Cy may be selected from moieties represented by Chemical Formulae 3A to 3D.

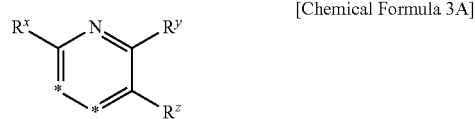

[Chemical Formula 3A]

In Chemical Formula 3A, $R^x$, $R^y$, and $R^z$ are independently hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, at least one of $R^x$, $R^y$, and $R^z$ is a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, and

*—* is a linking portion with Chemical Formula 1.

[Chemical Formula 3B]

In Chemical Formula 3B, $R^x$ and $R^y$ are independently hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, at least one of $R^x$ and $R^y$ is a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, and

*=* is a linking portion with Chemical Formula 1.

[Chemical Formula 3C]

In Chemical Formula 3C, $R^x$ and $R^y$ are independently hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, at least one of $R^x$ and $R^y$ is a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, and

*=* is a linking portion with Chemical Formula 1.

[Chemical Formula 3D]

In Chemical Formula 3D, $R^x$ and $R^y$ are independently hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, at least one of $R^x$ and $R^y$ is a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, and

*=* is a linking portion with Chemical Formula 1.

In Chemical Formula 1, Cy may be a moiety represented by Chemical Formula 4A.

[Chemical Formula 4A]

In Chemical Formula 4A, $Y^1$ is $CR^aR^b$ or $NR^c$, $R^a$ and $R^b$ are independently hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, provided that at least one of $R^a$ and $R^b$ is a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, $R^c$ is a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, $R^p$, $R^q$, $R^r$, and $R^s$ are independently hydrogen, deuterium, or a C1 to C10 alkyl group, n is an integer of 0 to 2, $Z^1$ and $Z^2$ are O, S, Se, Te, $C(CN)_2$, or $NR^d$, wherein $R^d$ is a C1 to C10 alkyl group or is linked to $Y^1$ of Chemical Formula 4A to provides a fused ring, and

*=* is a linking portion with Chemical Formula 1.

For example, the moiety represented by Chemical Formula 4A may be a moiety represented by Chemical Formula 4A-1. Chemical Formula 4A-1 illustrates the case where n of Chemical Formula 4A is 0, but the compound where n of Chemical Formula 4A is 1 or 2 may be represented in the same manner as in Chemical Formula 4A-1.

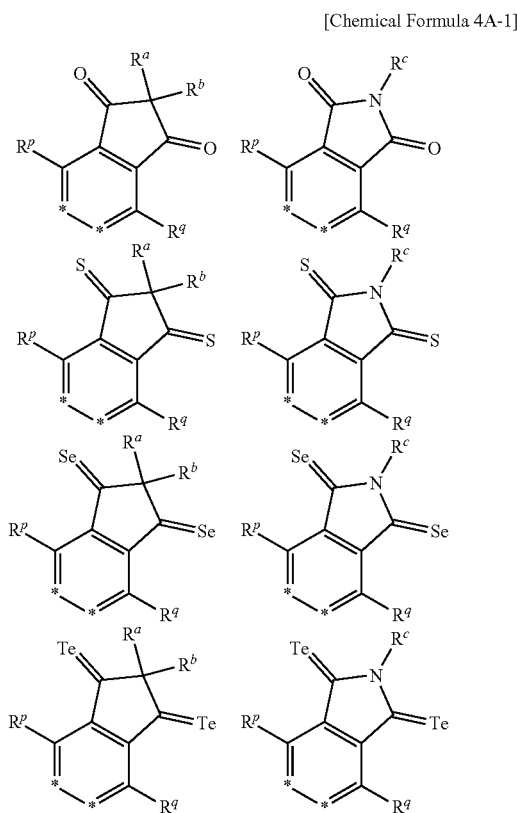

[Chemical Formula 4A-1]

In Chemical Formula 4A-1, $R^a$ and $R^b$ are independently hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, provided that at least one of $R^a$ and $R^b$ is a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, $R^c$ is a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, $R^p$ and $R^q$ are independently hydrogen, deuterium, or a C1 to C10 alkyl group, and

*=* is a linking portion with Chemical Formula 1.

In Chemical Formula 1, Cy may be a moiety represented by Chemical Formula 4B.

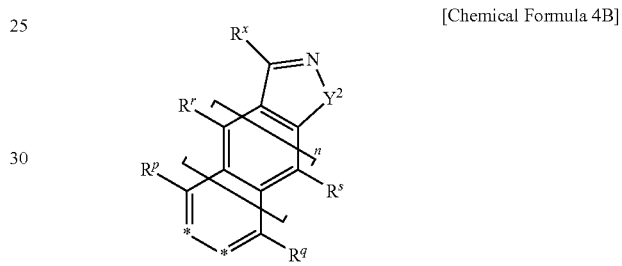

[Chemical Formula 4B]

In Chemical Formula 4B, $Y^2$ is $CR^aR^b$, $NR^c$, O, S, Se, or Te, wherein $R^a$, $R^b$, and $R^c$ are independently hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, $R^x$ is hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, when $Y^2$ is $CR^aR^b$ or $NR^c$, at least one of $R^a$, $R^b$, and $R^x$ and at least one of $R^c$ and $R^x$ are a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, when $Y^2$ is O, S, Se, or Te, $R^x$ is a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, and $R^p$, $R^q$, $R^r$, and $R^s$ are independently hydrogen, deuterium, or a C1 to C10 alkyl group, n is an integer of 0 to 2, and

*=* is a linking portion with Chemical Formula 1.

For example, the moiety represented by Chemical Formula 4B may be a moiety represented by Chemical Formula 4B-1. Chemical Formula 4B-1 illustrates the case where n of Chemical Formula 4B is 0, but the compound where n of Chemical Formula 4B is 1 or 2 may be represented in the same manner as in Chemical Formula 4B-1.

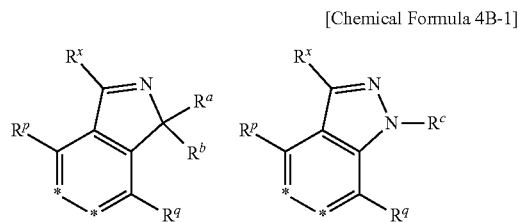

[Chemical Formula 4B-1]

In Chemical Formula 4B-1, $R^a$ and $R^b$ are independently hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, $R^x$ is hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, at least one of $R^a$, $R^b$, and $R^x$ and at least one of $R^c$ and $R^x$ are a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, and $R^p$ and $R^q$ are independently hydrogen, deuterium, or a C1 to C10 alkyl group, and

*=* is a linking portion with Chemical Formula 1.

For example, the moiety represented by Chemical Formula 4B may be a moiety represented by Chemical Formula 4B-2. Chemical Formula 4B-2 illustrates the case where n of Chemical Formula 4B is 0, but the compound where n of Chemical Formula 4B is 1 or 2 may be represented in the same manner as in Chemical Formula 4B-2.

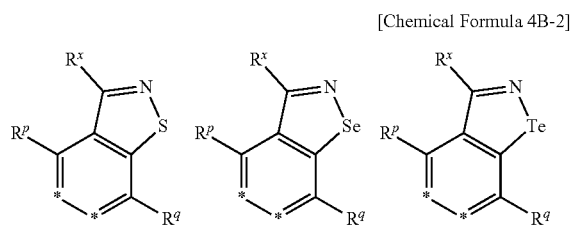

[Chemical Formula 4B-2]

In Chemical Formula 4B-2, $R^x$ is a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, $R^p$ and $R^q$ are independently hydrogen, deuterium, or a C1 to C10 alkyl group, and

*=* is a linking portion with Chemical Formula 1.

In Chemical Formula 1, Cy may be selected from a moiety represented by Chemical Formula 4C.

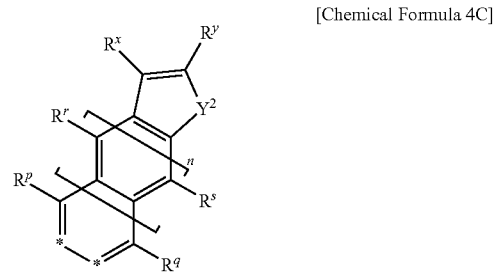

[Chemical Formula 4C]

In Chemical Formula 4C, $Y^2$ is $CR^aR^b$, $NR^c$, O, S, Se, or Te, wherein $R^a$, $R^b$, and $R^c$ are independently hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, $R^x$ and $R^y$ are hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, when $Y^2$ is $CR^aR^b$ or $NR^c$, at least one of $R^a$, $R^b$, $R^x$, and $R^y$ and at least one of $R^c$, $R^x$, and $R^y$ are a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, when $Y^2$ is O, S, Se, or Te, at least one of $R^x$ and $R^y$ is a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, and $R^p$, $R^q$, $R^r$, and $R^s$ are independently hydrogen, deuterium, or a C1 to C10 alkyl group, n is an integer of 0 to 2, and

*=* is a linking portion with Chemical Formula 1.

For example, the moiety represented by Chemical Formula 4C may be a moiety represented by Chemical Formula 4C-1. Chemical Formula 4C-1 illustrates the case where n of Chemical Formula 4C is 0, but the compound where n of Chemical Formula 4C is 1 or 2 may be represented in the same manner as in Chemical Formula 4C-1.

[Chemical Formula 4C-1]

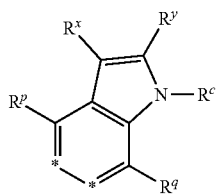

In Chemical Formula 4C-1, $R^c$ is hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, $R^x$ and $R^y$ are hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, at least one of $R^c$, $R^x$, and $R^y$ is a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, $R^p$ and $R^q$ are independently hydrogen, deuterium, or a C1 to C10 alkyl group, and

*=* is a linking portion with Chemical Formula 1.

For example, the moiety represented by Chemical Formula 4C may be a moiety represented by Chemical Formula 4C-2. Chemical Formula 4C-2 illustrates the case where n of Chemical Formula 4C is 0, but the compound where n of Chemical Formula 4C is 1 or 2 may be represented in the same manner as in Chemical Formula 4C-2.

[Chemical Formula 4C-2]

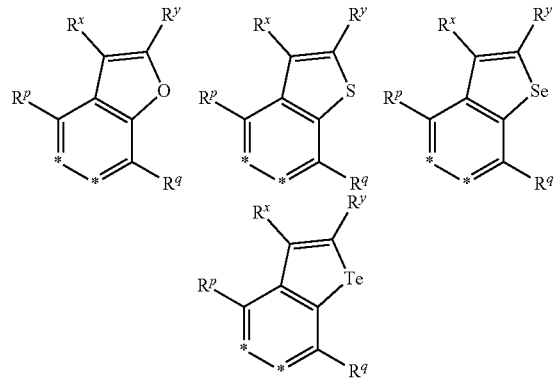

In Chemical Formula 4C-2, $R^x$ and $R^y$ are hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, at least one of $R^x$ and $R^y$ is a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, $R^p$ and $R^q$ are independently hydrogen, deuterium, or a C1 to C10 alkyl group, and

*=* is a linking portion with Chemical Formula 1.

In an embodiment, the substituted or unsubstituted C3 to C20 branched alkyl group and a substituted or unsubstituted C3 to C20 branched alkoxy group may be represented by Chemical Formula 5A.

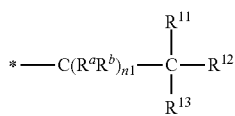

[Chemical Formula 5A]

In Chemical Formula 5A, $R^a$ and $R^b$ are hydrogen, a halogen, a cyano group, or a C1 to C6 alkyl group, n1 is an integer of 0 to 10, and $R^{11}$ to $R^{13}$ are hydrogen, a halogen, a cyano group, a C1 to C10 alkyl group, a C1 to C10 alkoxy group, a C2 to C10 alkenyl group, a C2 to C10 alkynyl group, or a C1 to C10 alkylsilyl group, provided that at least two of $R^{11}$ to $R^{13}$ are a C1 to C10 alkyl group, a C1 to C10 alkoxy group, a C2 to C10 alkenyl group, or a C2 to C10 alkynyl group.

In an embodiment, the C3 to C20 branched alkyl group may be an isopropyl group, a 1-methylpropyl group, an isobutyl group, a 1-methylbutyl group, a 1-ethylbutyl group, a 1-propylbutyl group, an isopentyl group, a 1-methylpentyl group, a 1-ethylpentyl group, a 1-propylpentyl group, a 2-methylpentyl group, a 2-ethylpentyl group, a 2-propylpentyl group, a 3-methylpentyl group, a 3-ethylpentyl group, a 3-propylpentyl group, an isohexyl group, a 1-methylhexyl group, a 1-ethylhexyl group, a 1-propylhexyl group, a 2-methylhexyl group, a 2-ethylhexyl group, a 2-propylhexyl group, a 3-methylhexyl group, a 3-ethylhexyl group, a 3-propylhexyl group, an isoheptyl group, a 1-methylheptyl group, a 1-ethylheptyl group, a 1-propylheptyl group, a 2-methylheptyl group, a 2-ethylheptyl group, a 2-propylheptyl group, a 3-methylheptyl group, a 3-ethylheptyl group, a 3-propylheptyl group, an isooctyl group, a 1-methyloctyl group, a 1-ethyloctyl group, a 1-propyloctyl group, a 2-methyloctyl group, a 2-ethyloctyl group, a 2-propyloctyl group, a 3-methyloctyl group, a 3-ethyloctyl group, a 3-propyloctyl group, a 1-methylnonyl group, a 1,1-dimethylnonyl group, a t-butyl group, a t-pentyl group, a t-hexyl group, a neopentyl group, or a neohexyl group, but is not limited thereto.

In an embodiment, the C3 to C20 branched heteroalkyl group may be a group in which —C($R^c R^d$)— is replaced by a functional group selected from —O—, —S—, —S(=O)—, —S(=O)$_2$—, —C(=O)—, —C(=O)O—, —OC(=O)—, or a combination thereof and may be represented by Chemical Formula 5B.

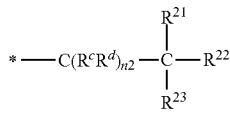

[Chemical Formula 5B]

In Chemical Formula 5B, $R^c$ and $R^d$ are hydrogen, a halogen, a cyano group, a C1 to C6 alkyl group, a C1 to C6 alkoxy group, a C2 to C10 ether group, or a C2 to C10 ester group, n2 is an integer of 2 to 10, and $R^{21}$ to $R^{23}$ are hydrogen, a halogen, a cyano group, a C1 to C10 alkyl group, a C1 to C10 alkoxy group, a C2 to C10 alkenyl group, or a C2 to C10 alkynyl group, provided that at least two of $R^{21}$ to $R^{23}$ are a C1 to C10 alkyl group, a C1 to C10 alkoxy group, a C2 to C10 alkenyl group, or a C2 to C10 alkynyl group.

In an embodiment, the substituted or unsubstituted C3 to C20 branched alkylsilyl group may be represented by Chemical Formula 5C.

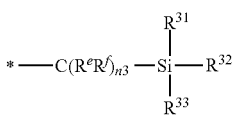

[Chemical Formula 5C]

In Chemical Formula 5C, $R^e$ and Rf are hydrogen, a halogen, a cyano group, or a C1 to C6 alkyl group, n3 is an integer of 0 to 10, and $R^{31}$ to $R^{33}$ are hydrogen, a halogen, a cyano group, a C1 to C10 alkyl group, a C1 to C10 alkoxy group, a C2 to C10 alkenyl group, a C2 to C10 alkynyl group, or a C1 to C10 alkylsilyl group, provided that at least two of $R^{31}$ to $R^{33}$ are a C1 to C10 alkyl group, a C1 to C10 alkoxy group, a C2 to C10 alkenyl group, or a C2 to C10 alkynyl group.

Specific examples of the n-type dopant include compounds of Groups 1 to 9.

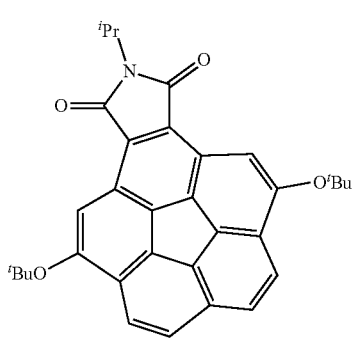

[Group 1]

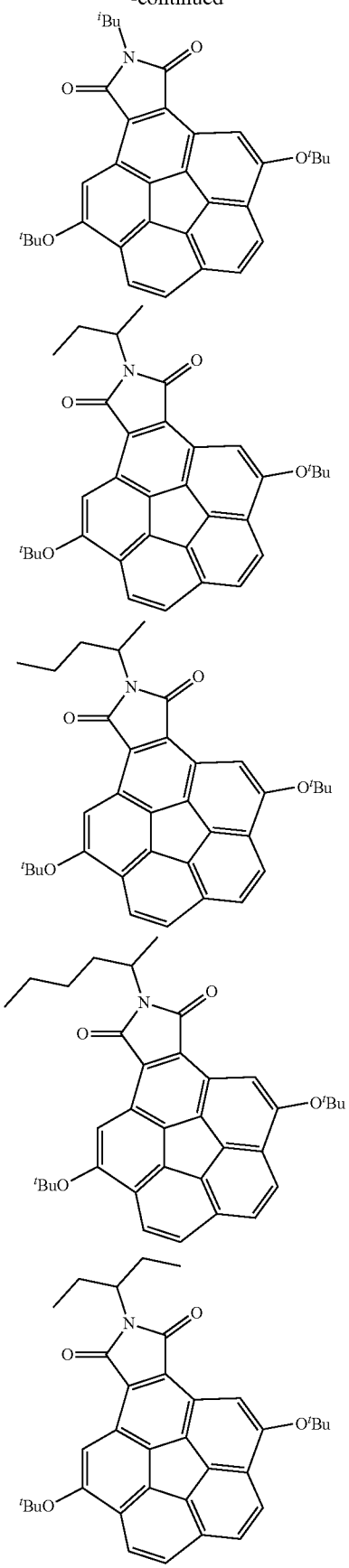

33
-continued
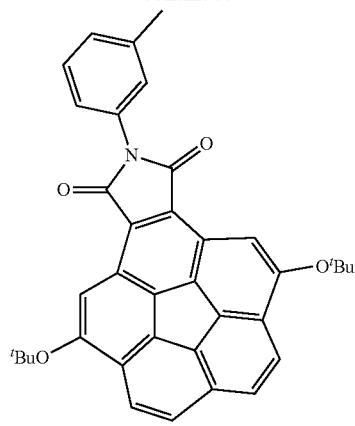
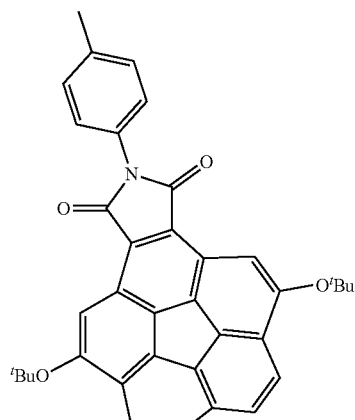
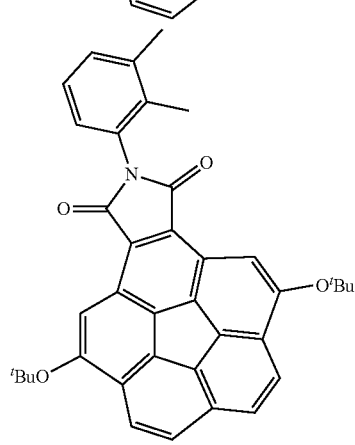
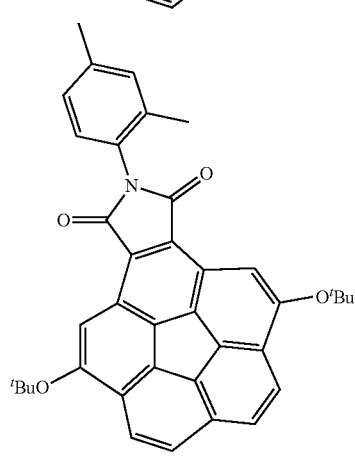
34
-continued
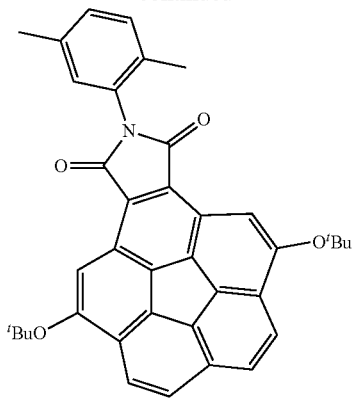
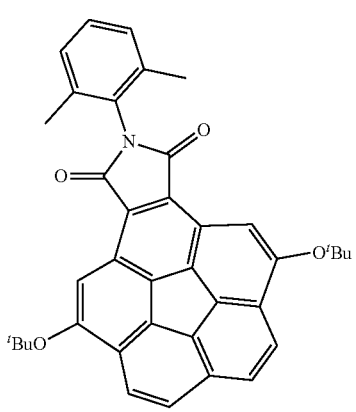
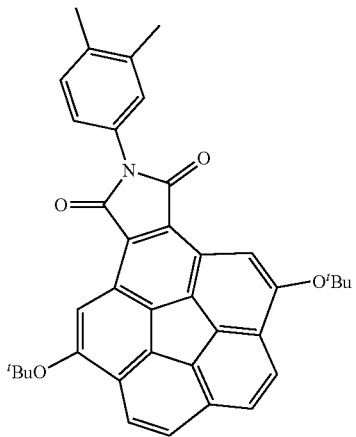
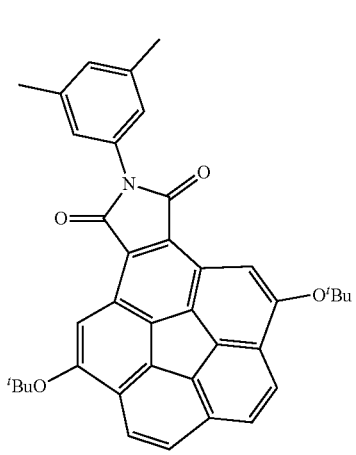

35
-continued
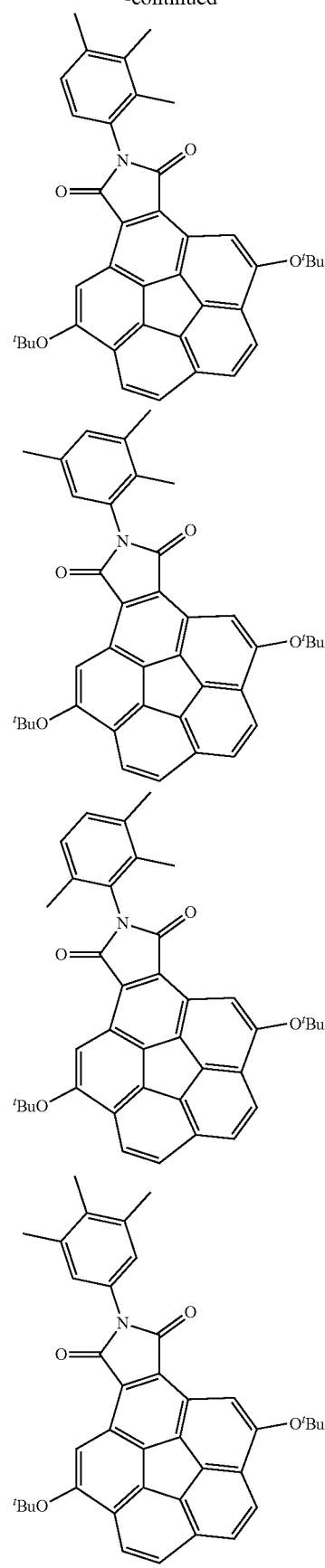
36
-continued
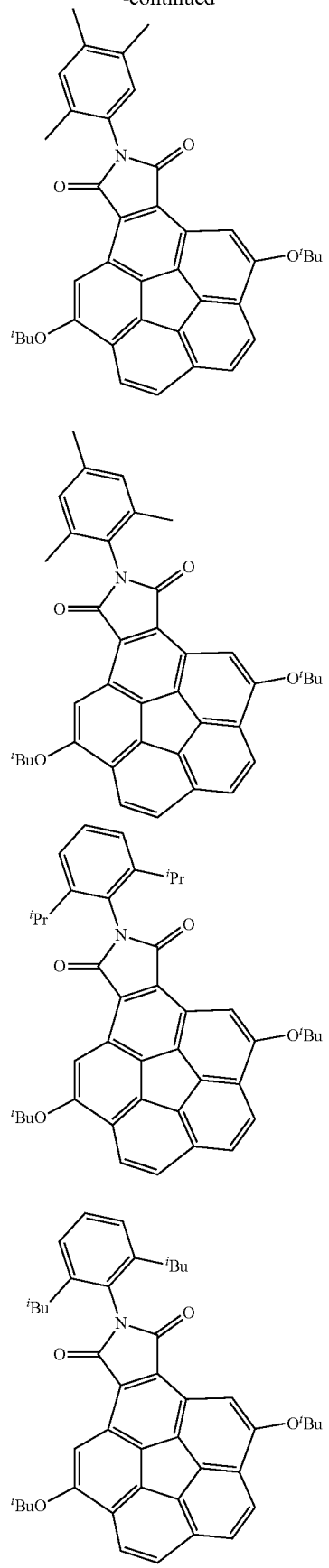

37
-continued
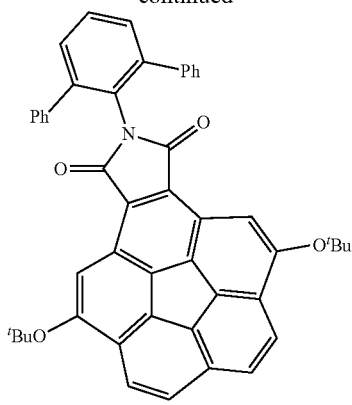
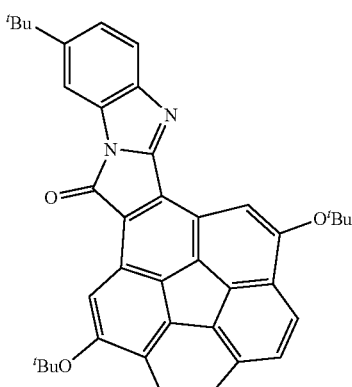
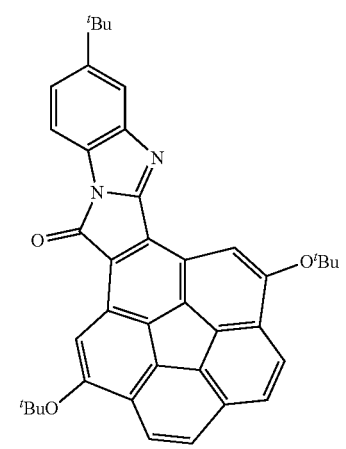
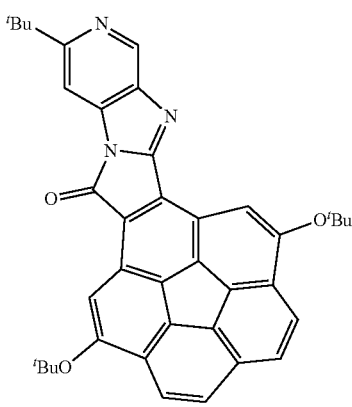
38
-continued
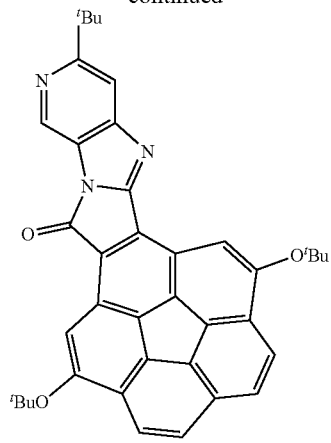
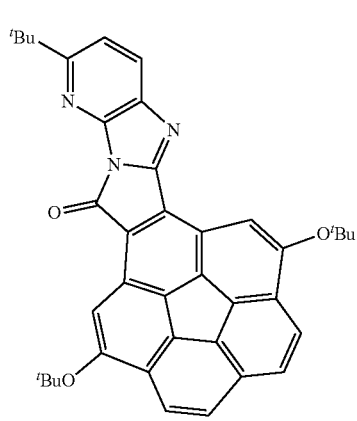
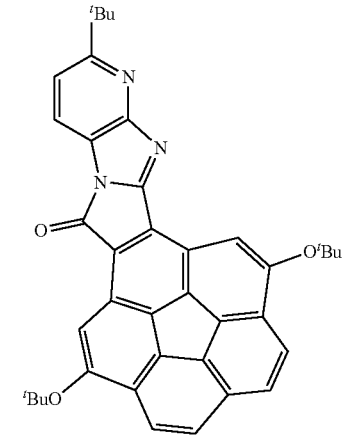
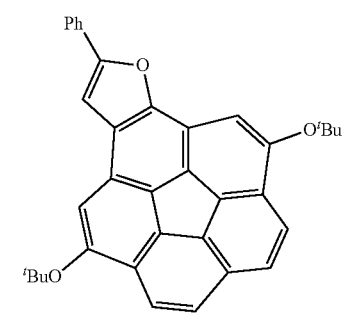

-continued
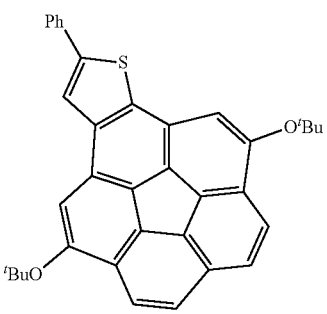
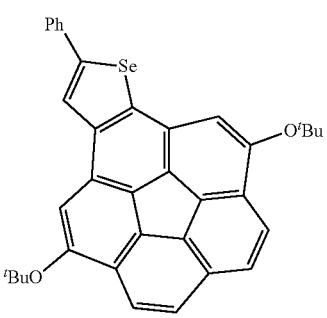
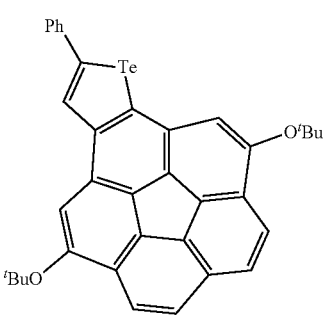
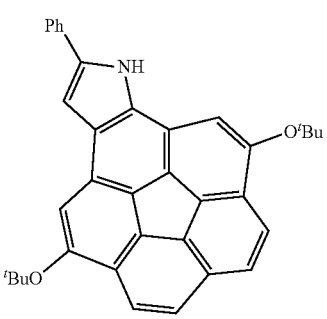
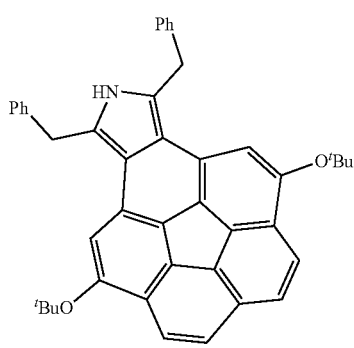
-continued
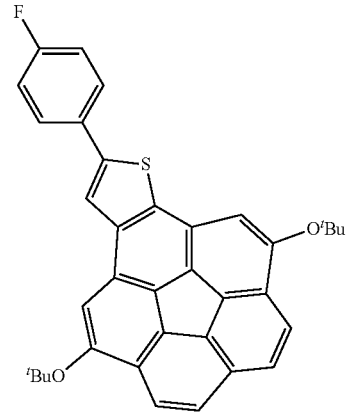
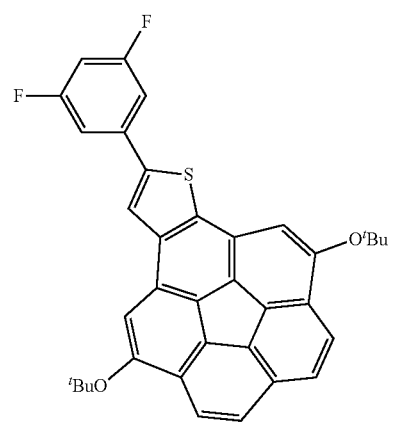
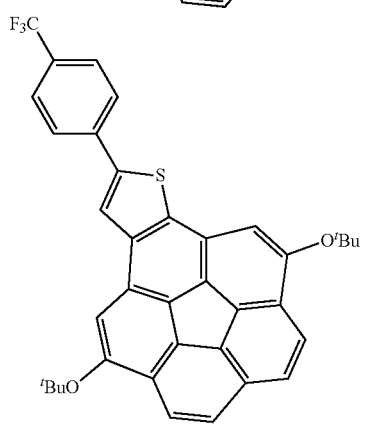
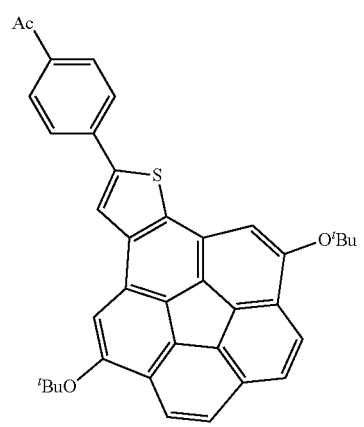

-continued

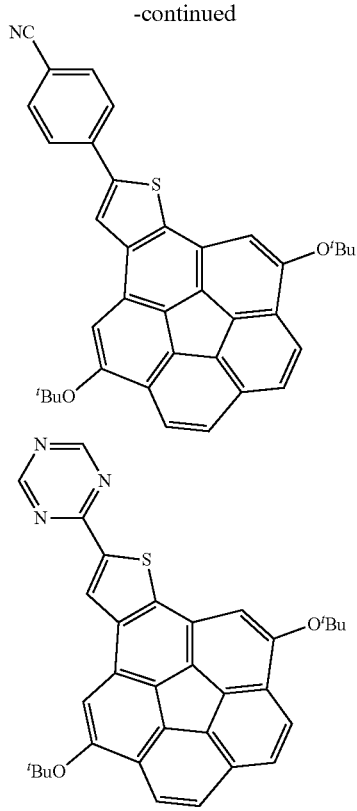

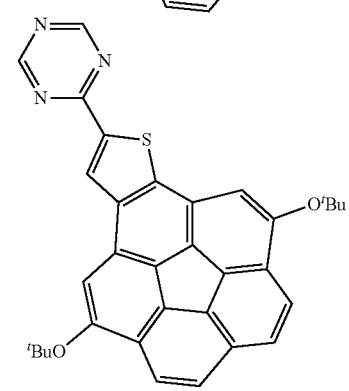

Branched alkyl groups such as an isopropyl (iPr) group, a tertiary butyl (tBu) group, a 2-methyl propyl group, a trimethylsilyl (TMS) group, etc. may be substituted instead of the two substituents (OtBu) groups of the corannulene of Group 1. Group 2 illustrates structures which are substituted with a tertiary butyl (tBu) group instead of the two substituents (OtBu) groups of corannulene in Group 1 and Group 3 illustrates structures which are substituted with a trimethylsilyl (TMS) group.

[Group 2]

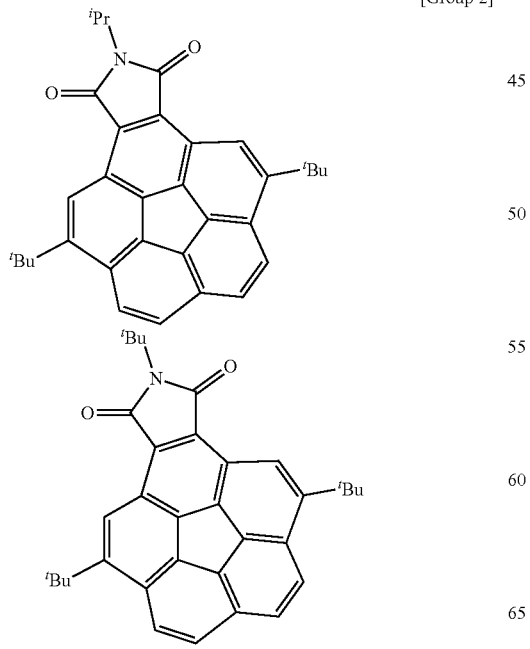

-continued

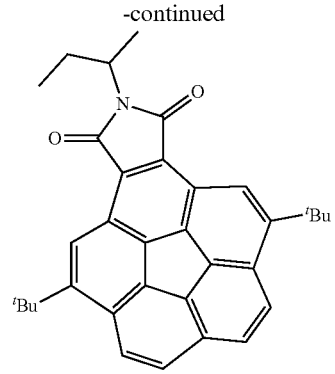

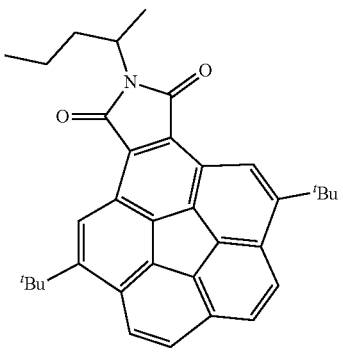

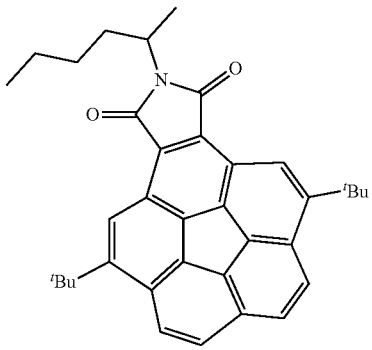

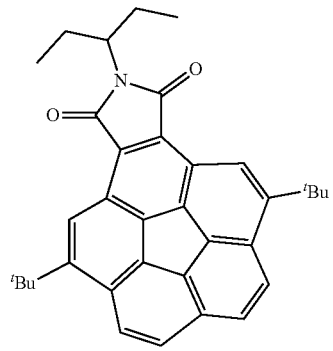

-continued
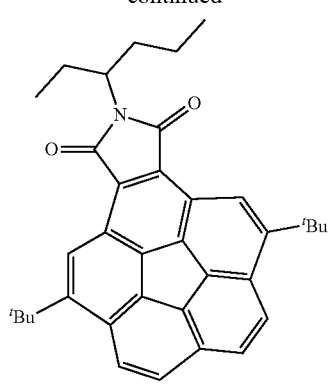
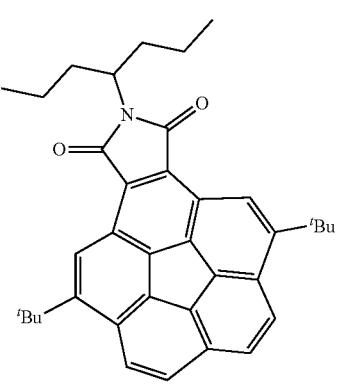
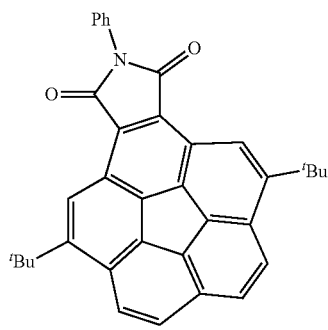
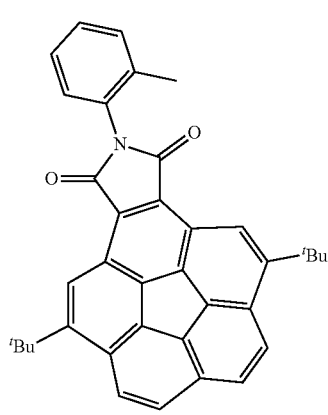
-continued
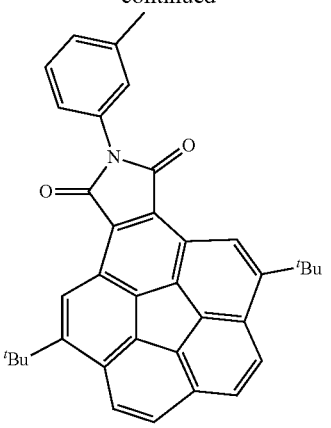
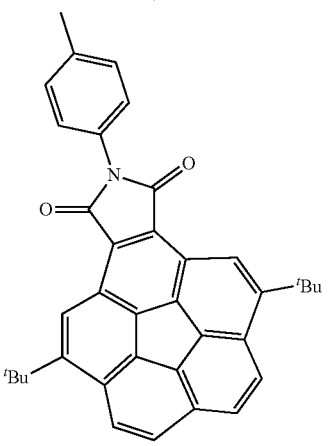
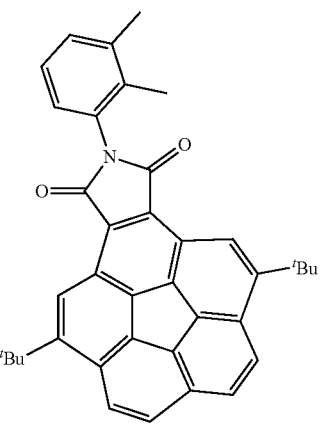
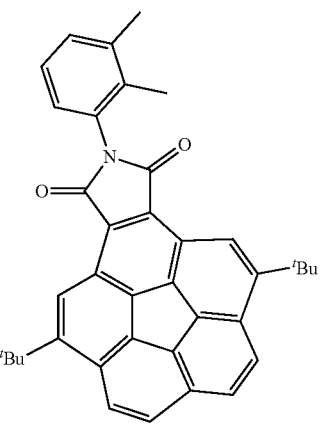

-continued
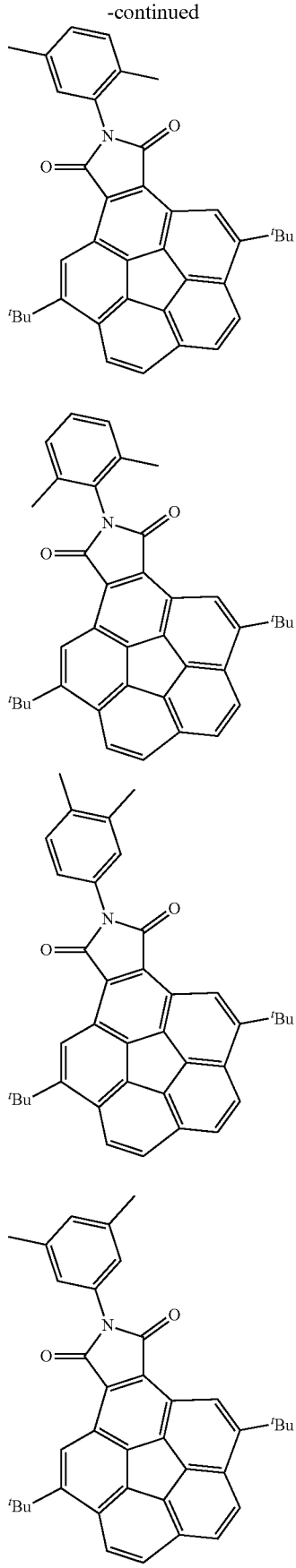
-continued
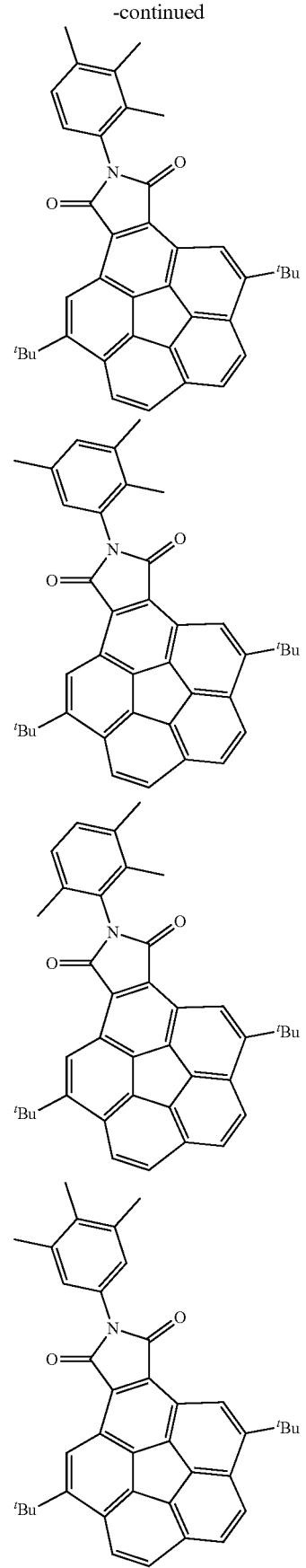

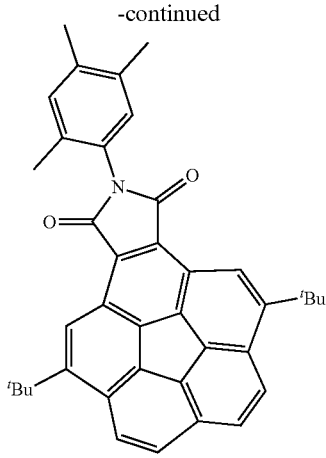
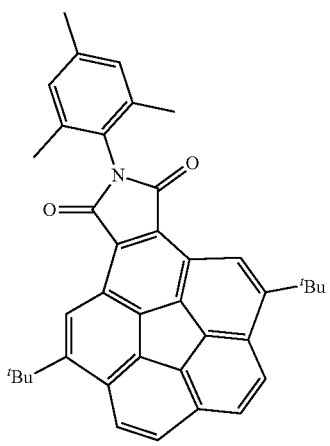
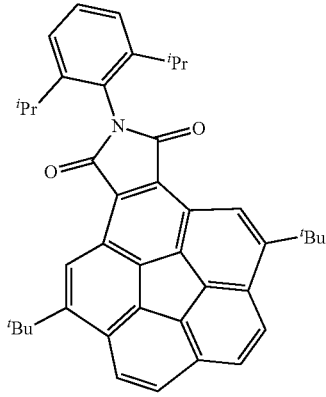
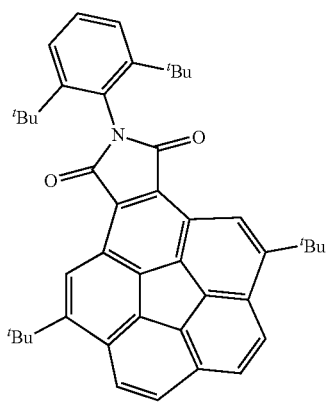
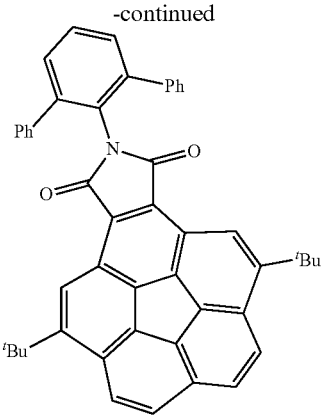
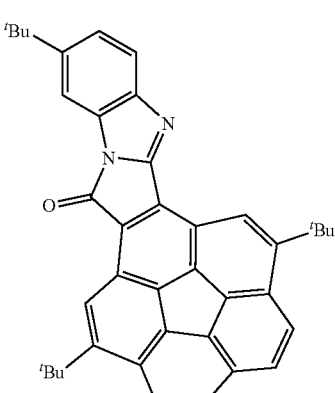
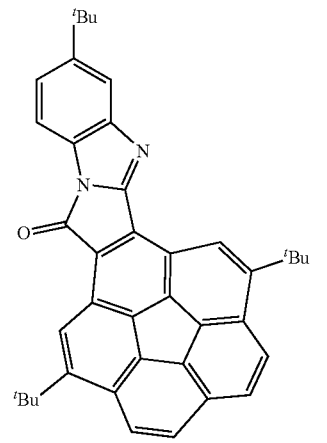
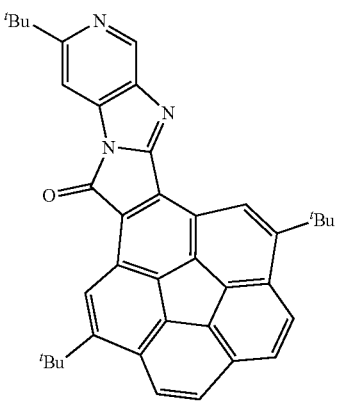

-continued
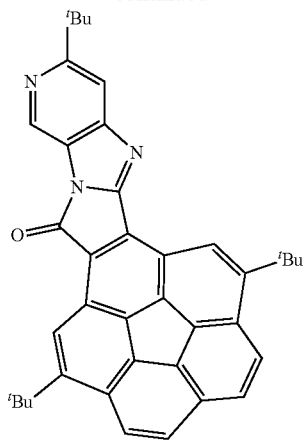
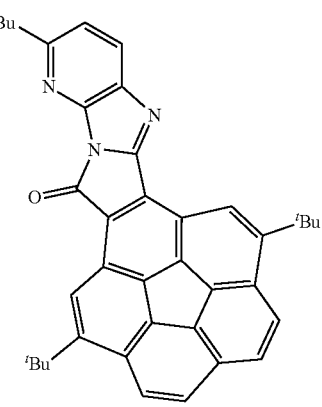
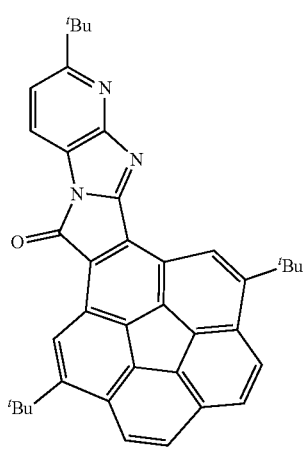
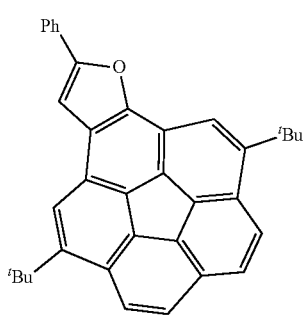
-continued
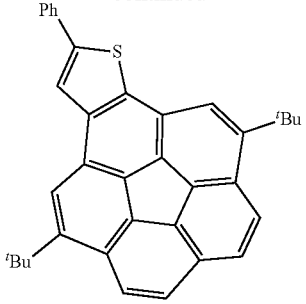
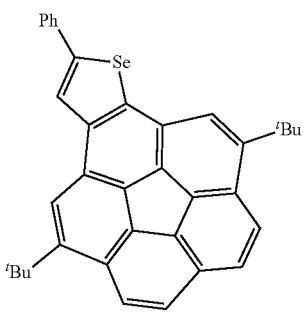
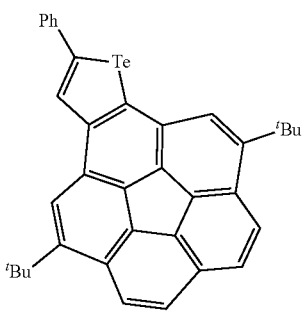
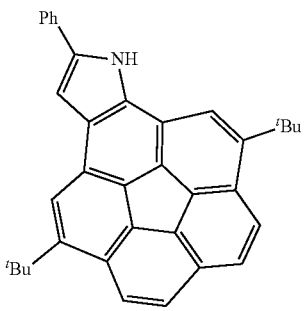
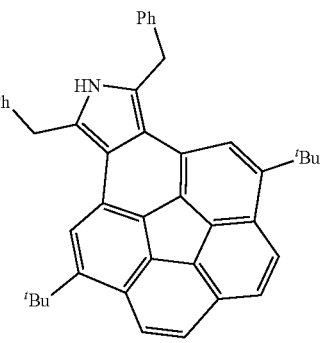

[Group 3]
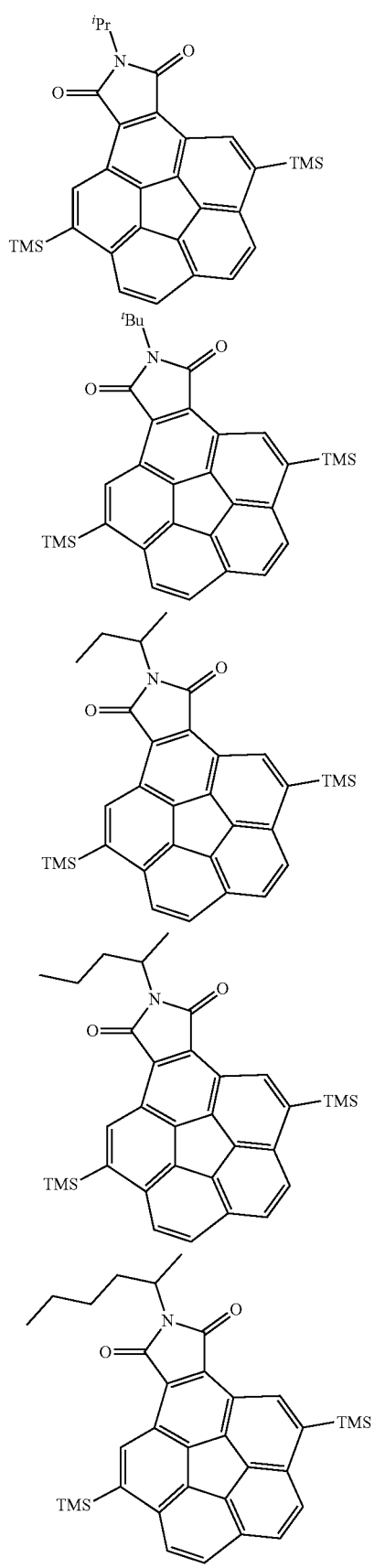
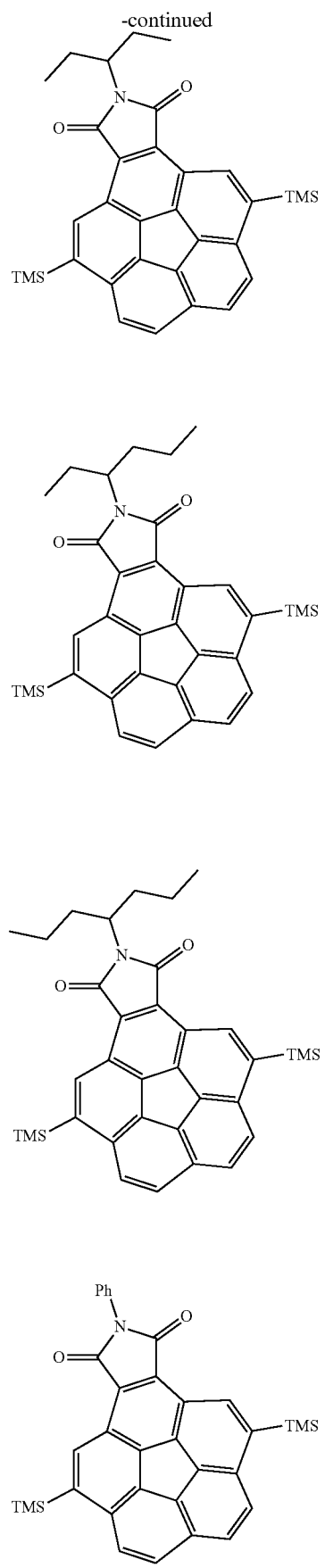

53
-continued
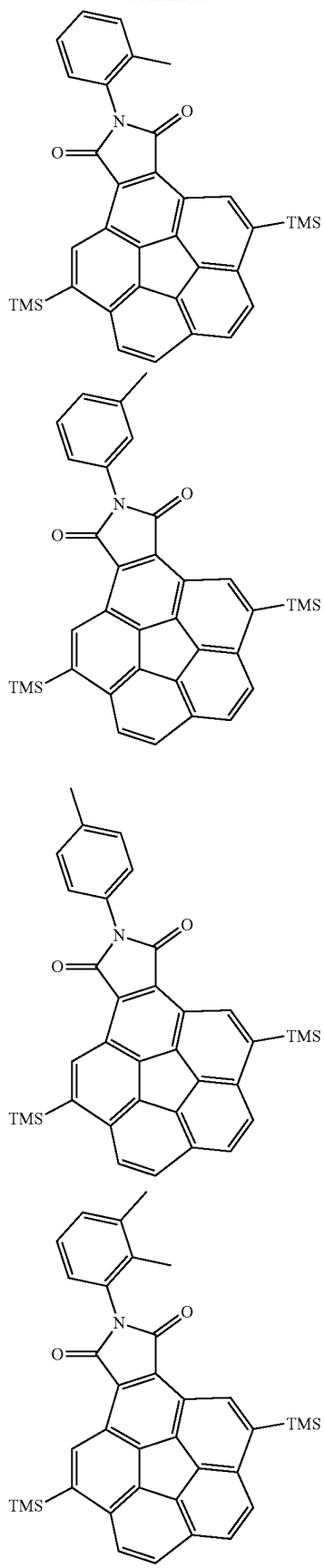
54
-continued
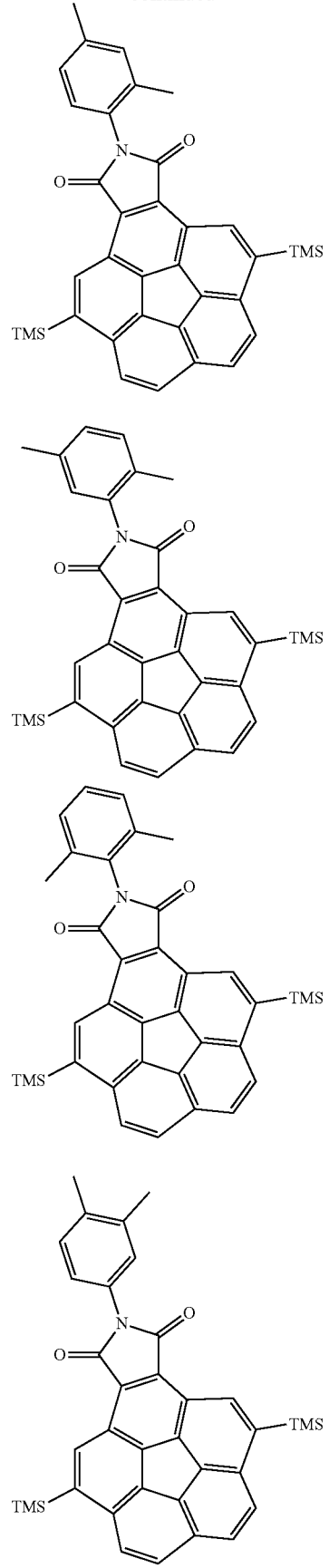

55
-continued
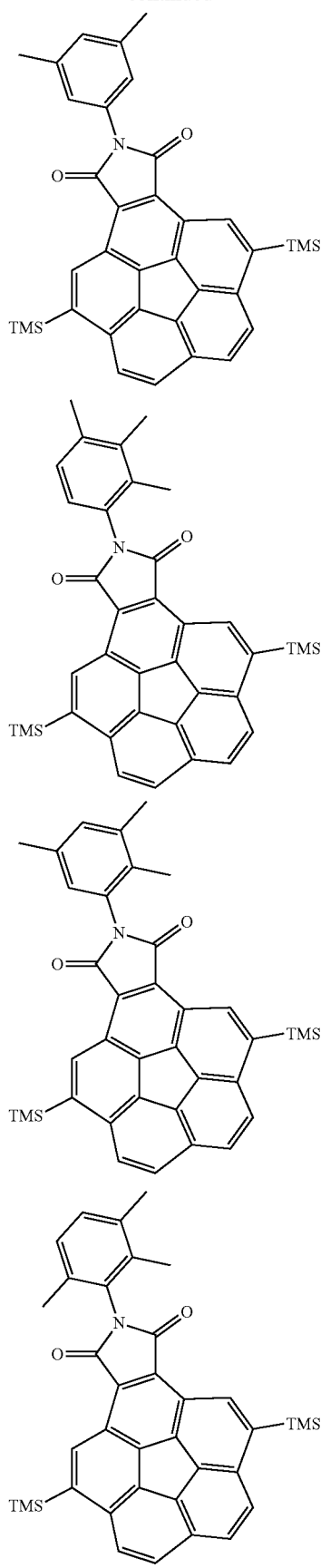
56
-continued
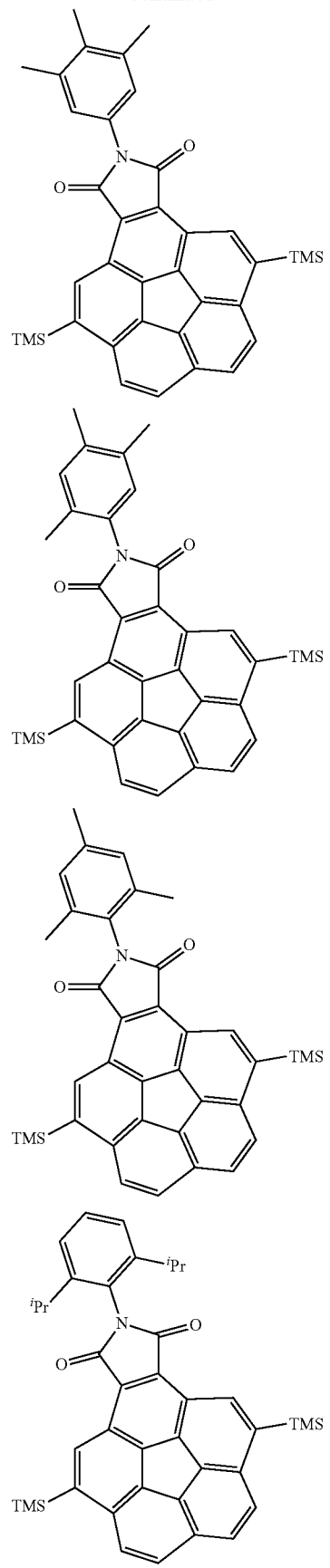

-continued
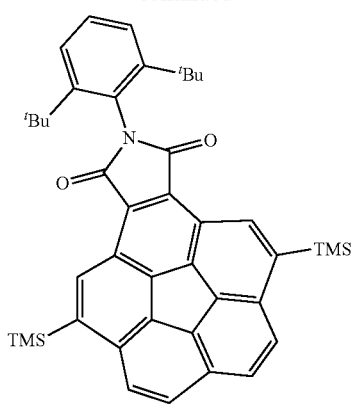
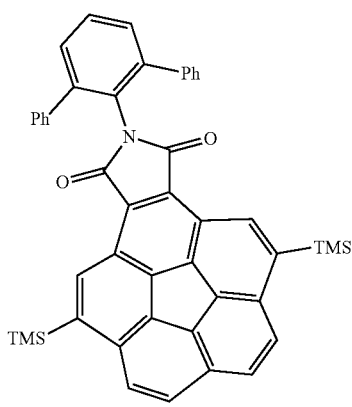
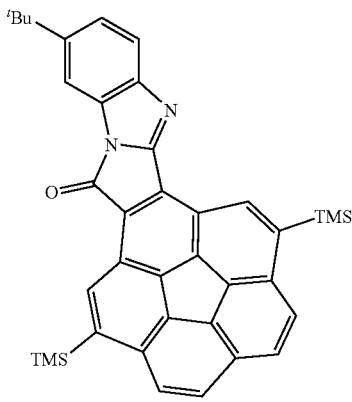
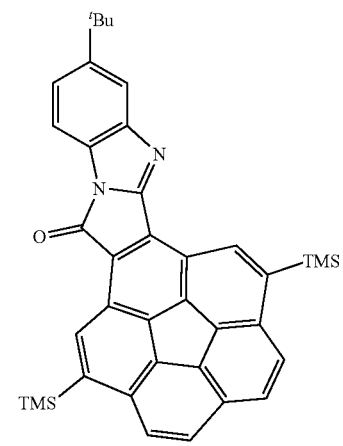
-continued
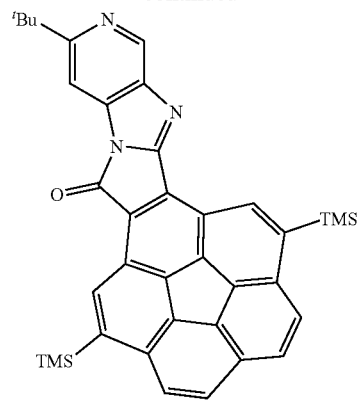
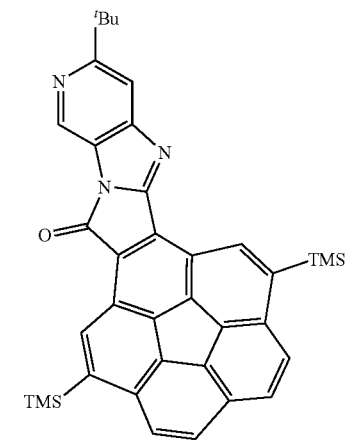
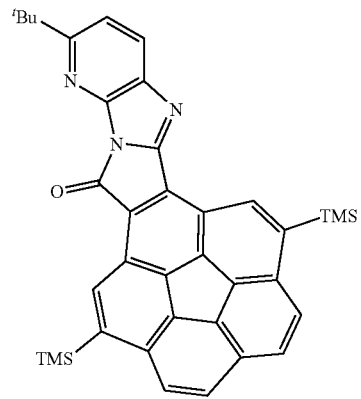
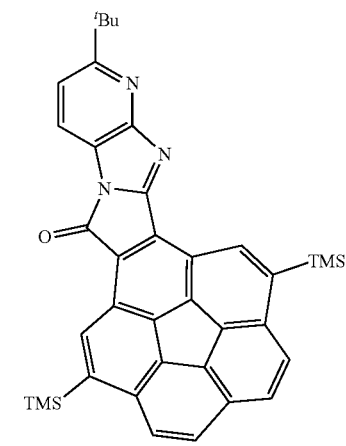

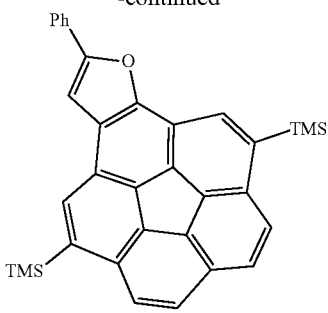
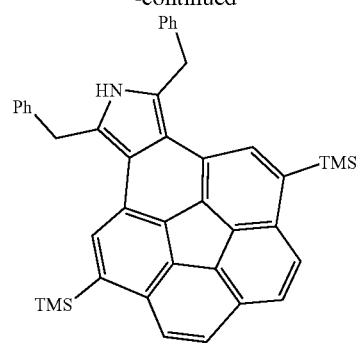
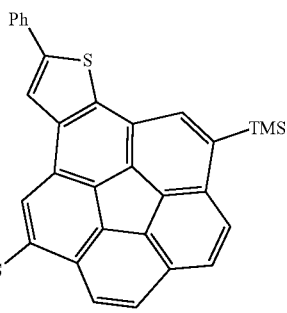
Group 4 illustrates structures which are substituted with a phenyl group instead of the two substituents (OtBu) groups of the corannulene of Group 1.
[Group 4]
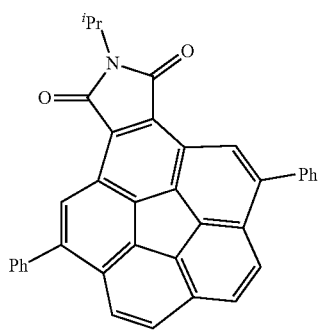
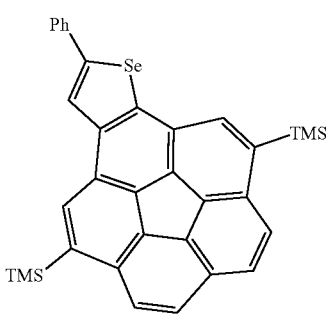
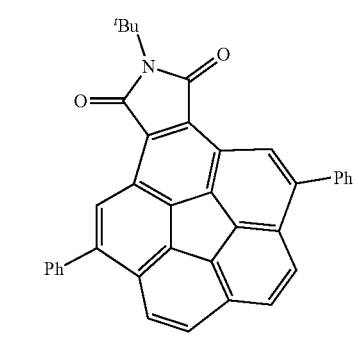
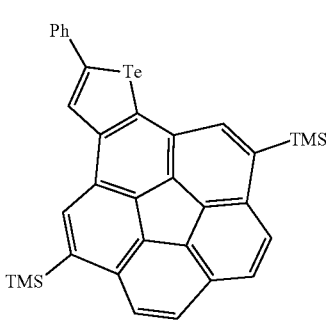
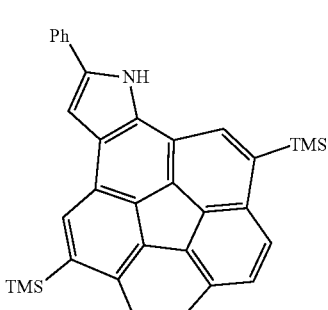
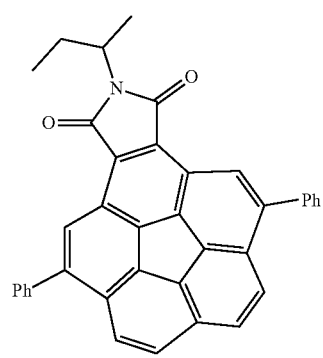

61
-continued
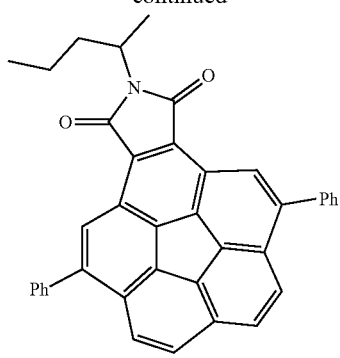
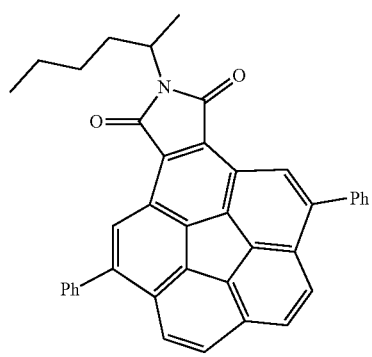
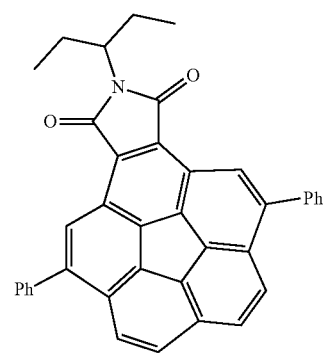
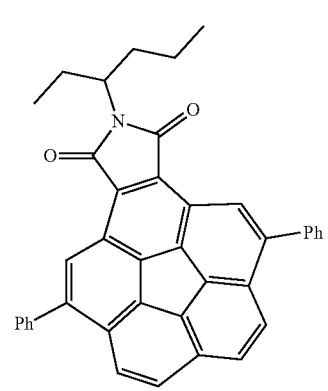
62
-continued
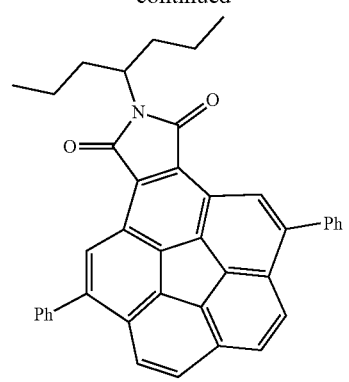
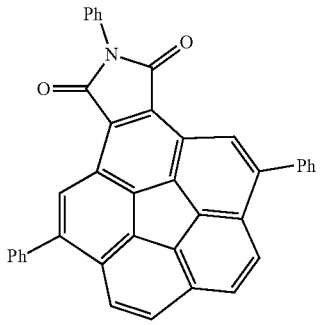
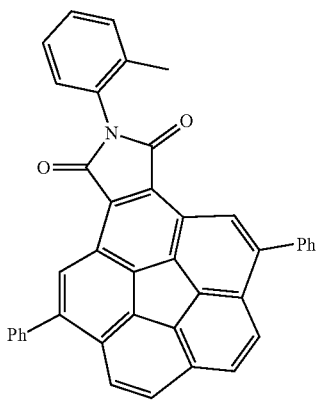
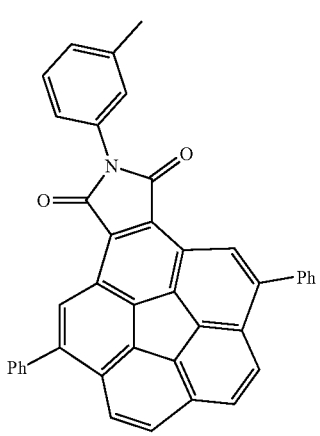

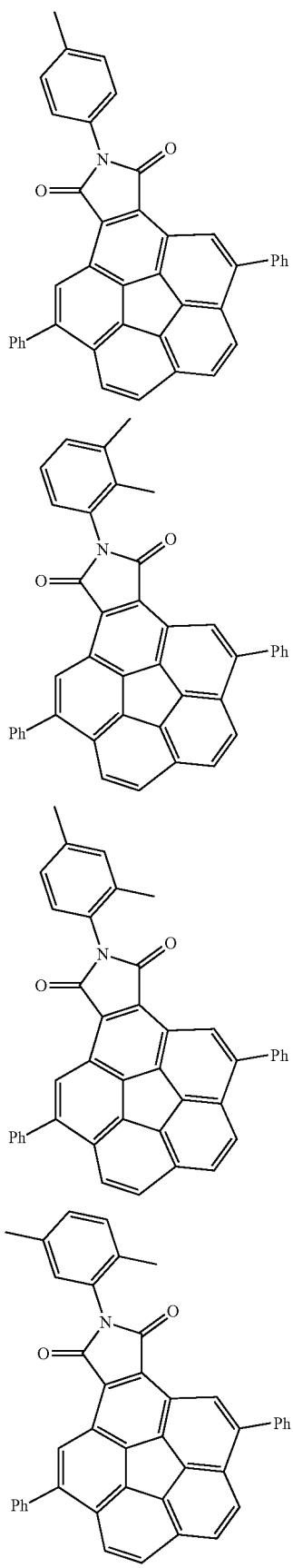
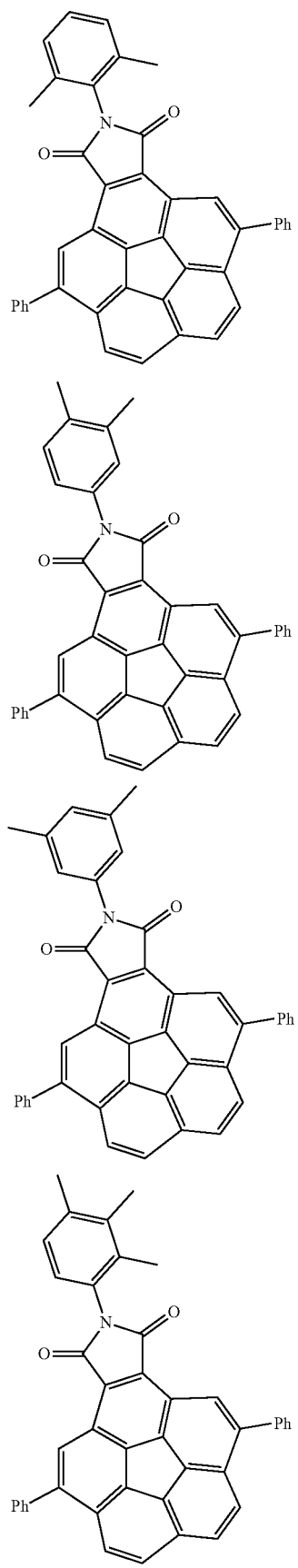

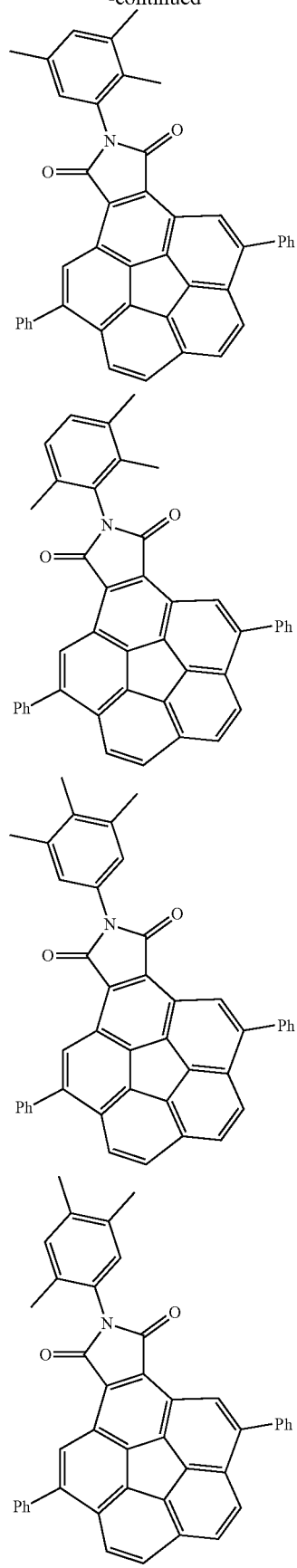
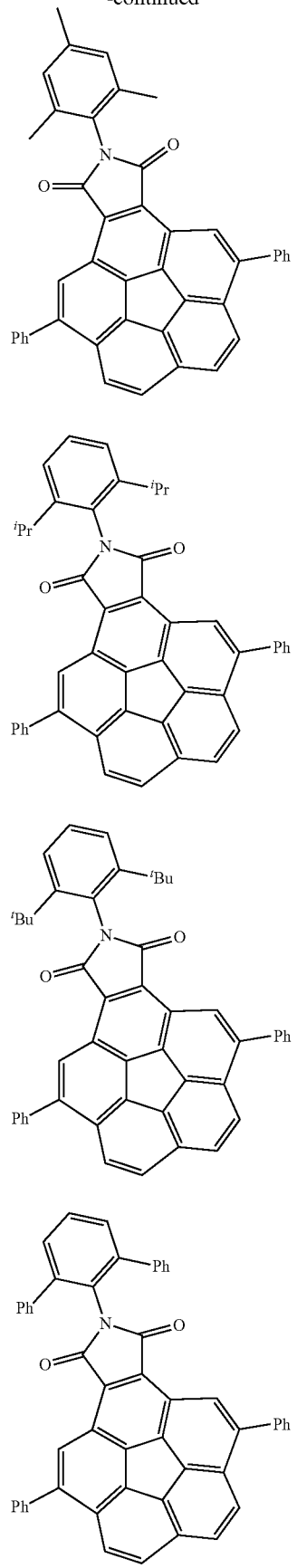

-continued
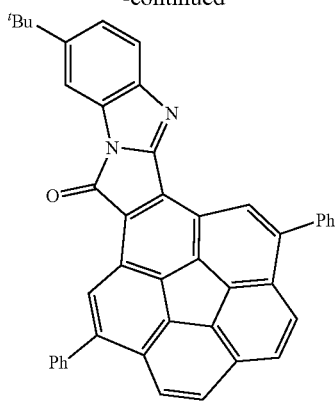
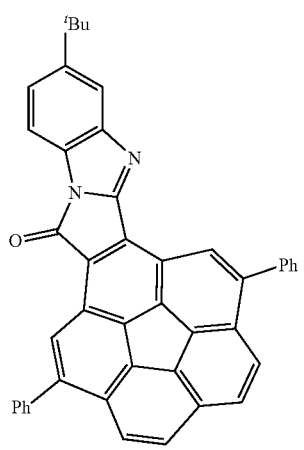
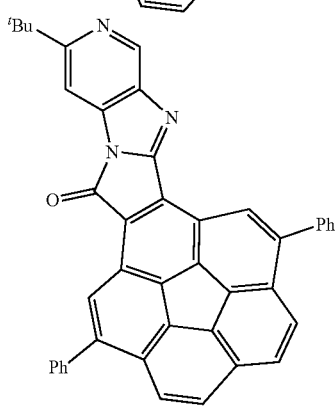
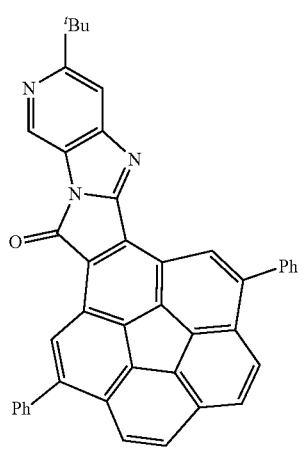
-continued
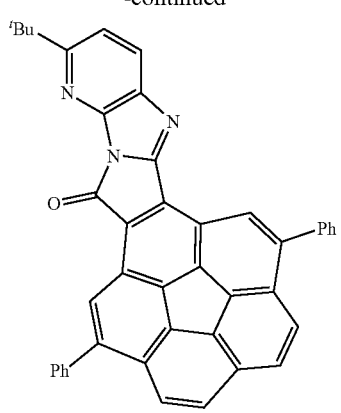
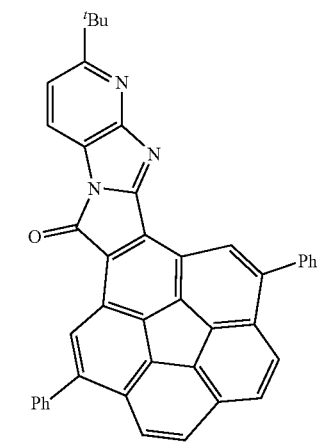
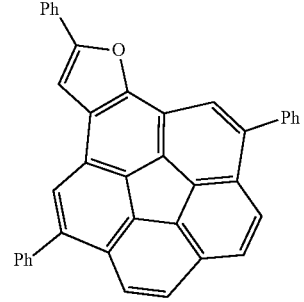
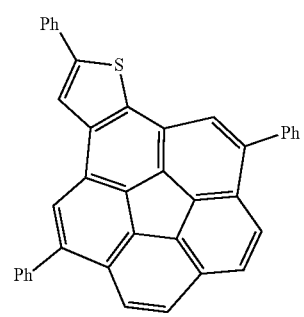

-continued

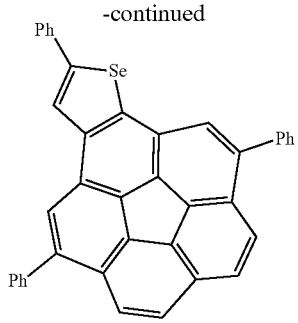

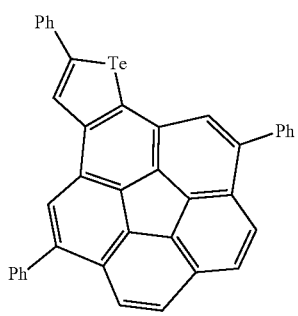

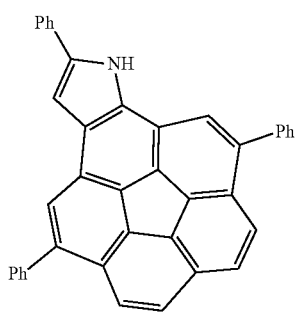

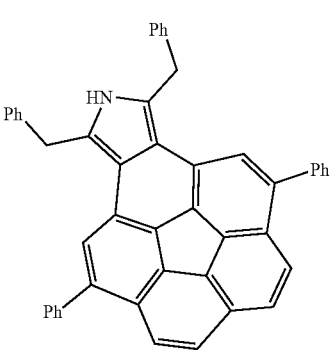

In Group 4, two phenyl (Ph) groups which are substituents of corannulene are substituted with at least one substituent selected from a C1 to C20 linear alkyl group, a C3 to C20 branched alkyl group, a C6 to C12 aryl group, and a C3 to C12 heteroaryl group. These substituents may be present in plural, in which case they may be the same or different from one another. The positions of the substituents may be at an ortho, meta, or para position. For example, structures which substituted with an isopropyl group or t-butyl group at an ortho position are shown in Group 5.

[Group 5]

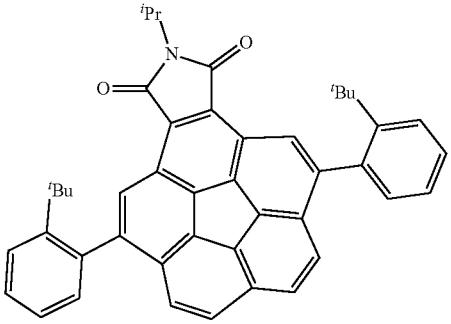

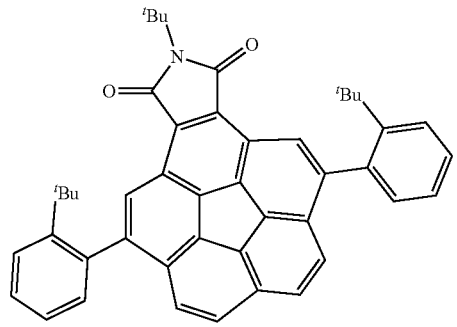

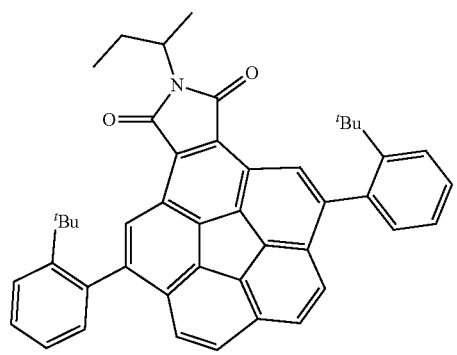

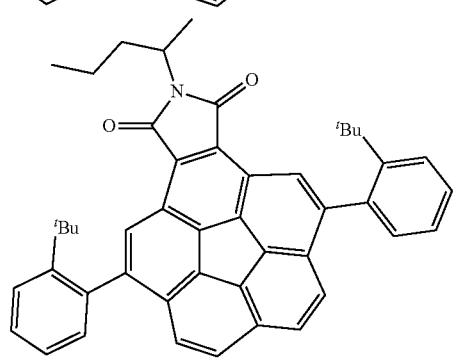

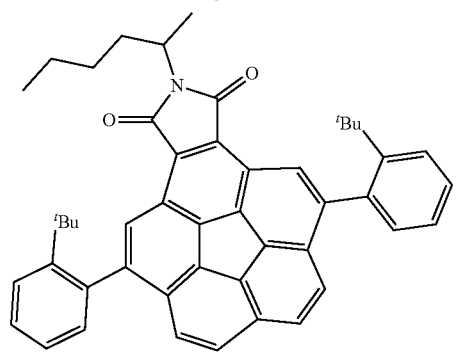

71
-continued
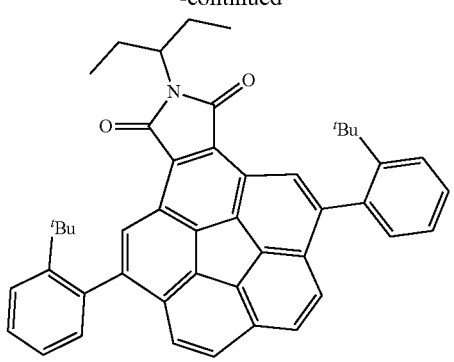
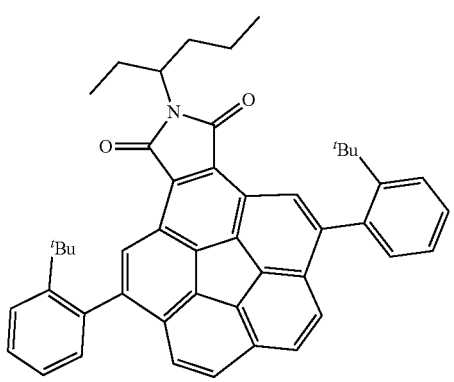
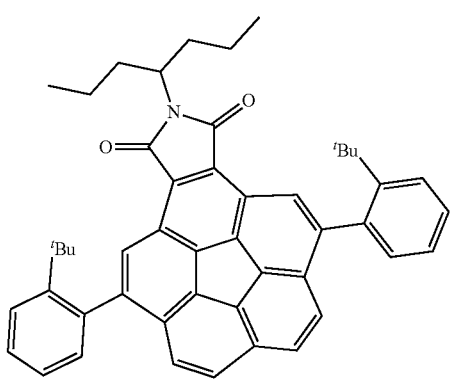
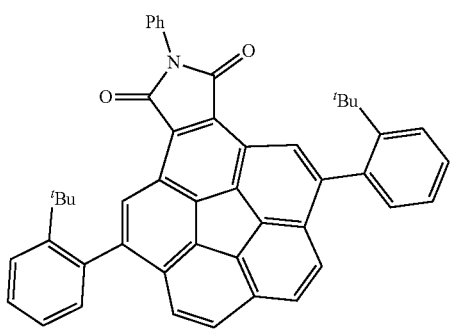
72
-continued
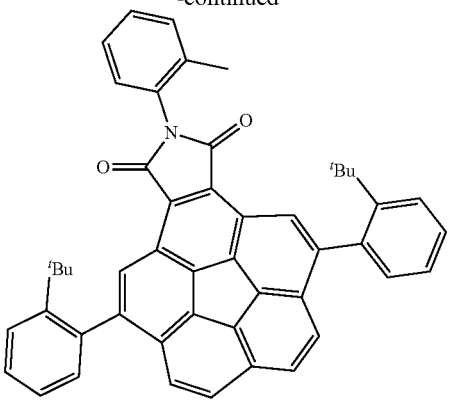
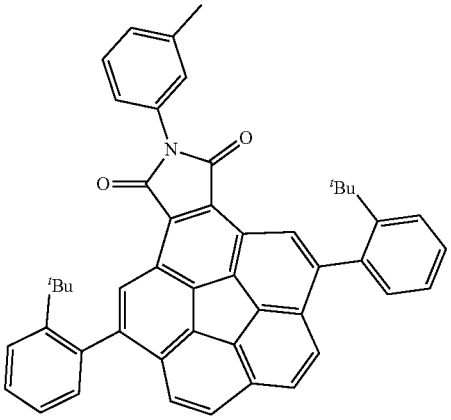
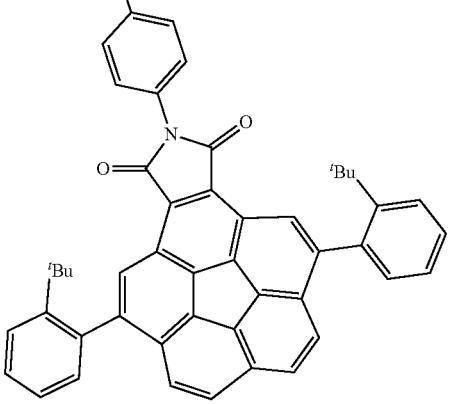
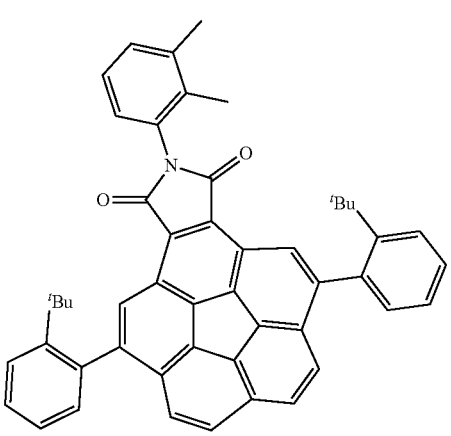

73
-continued
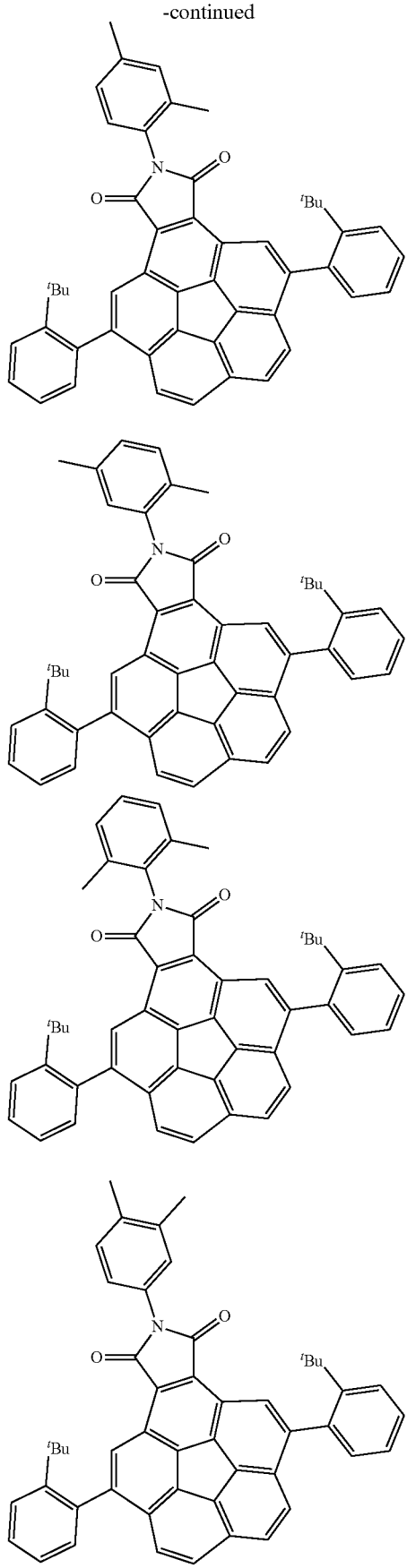
74
-continued
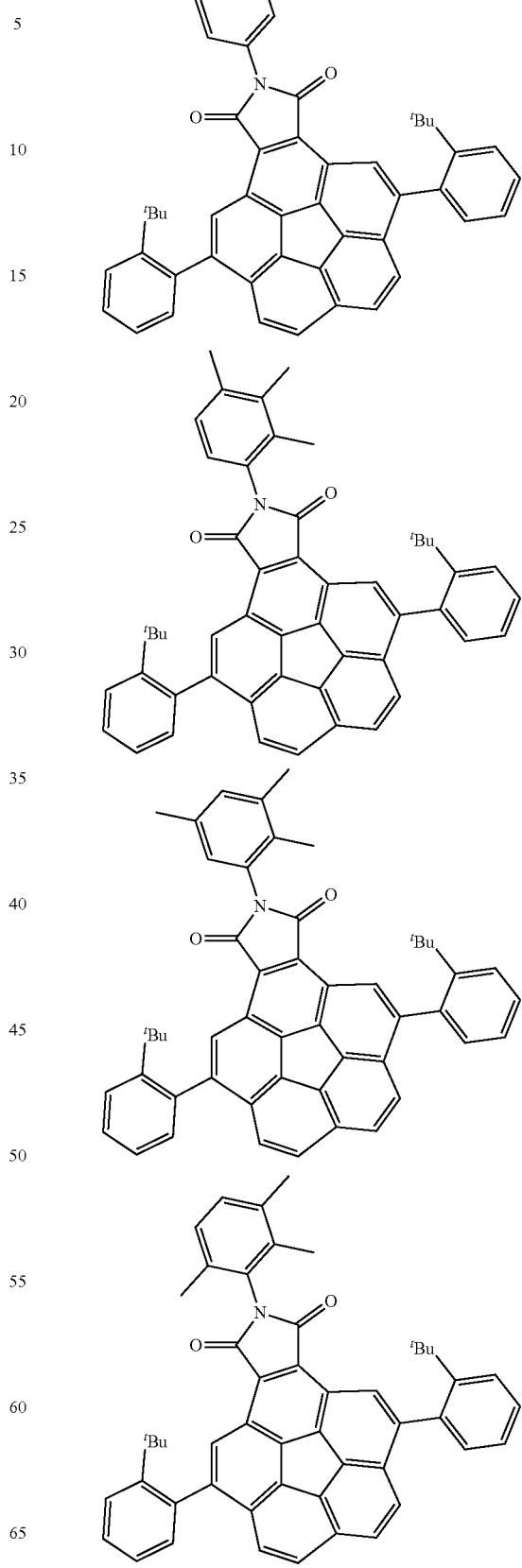

-continued
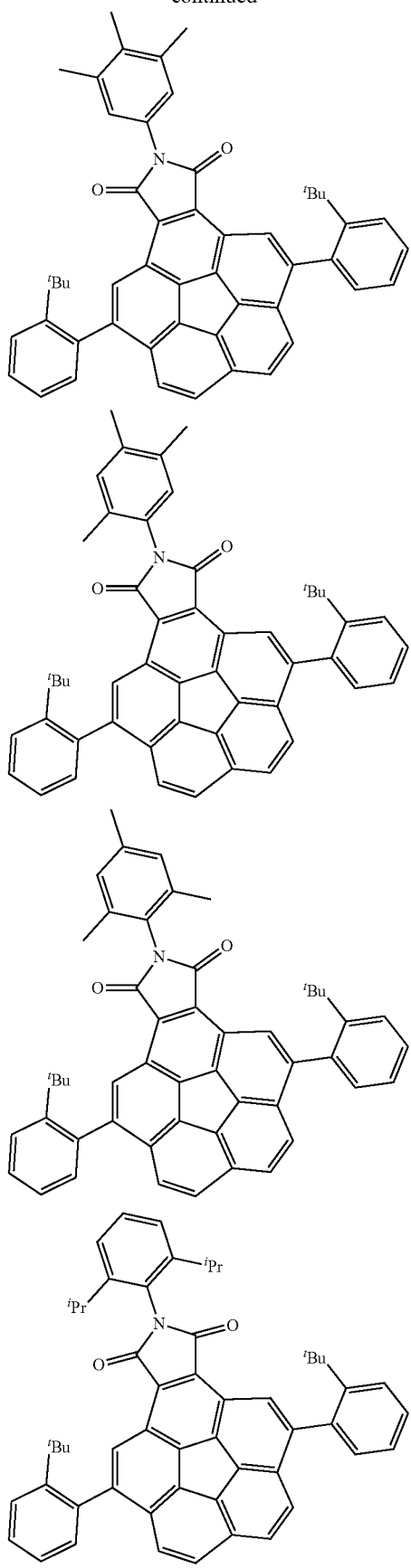
-continued
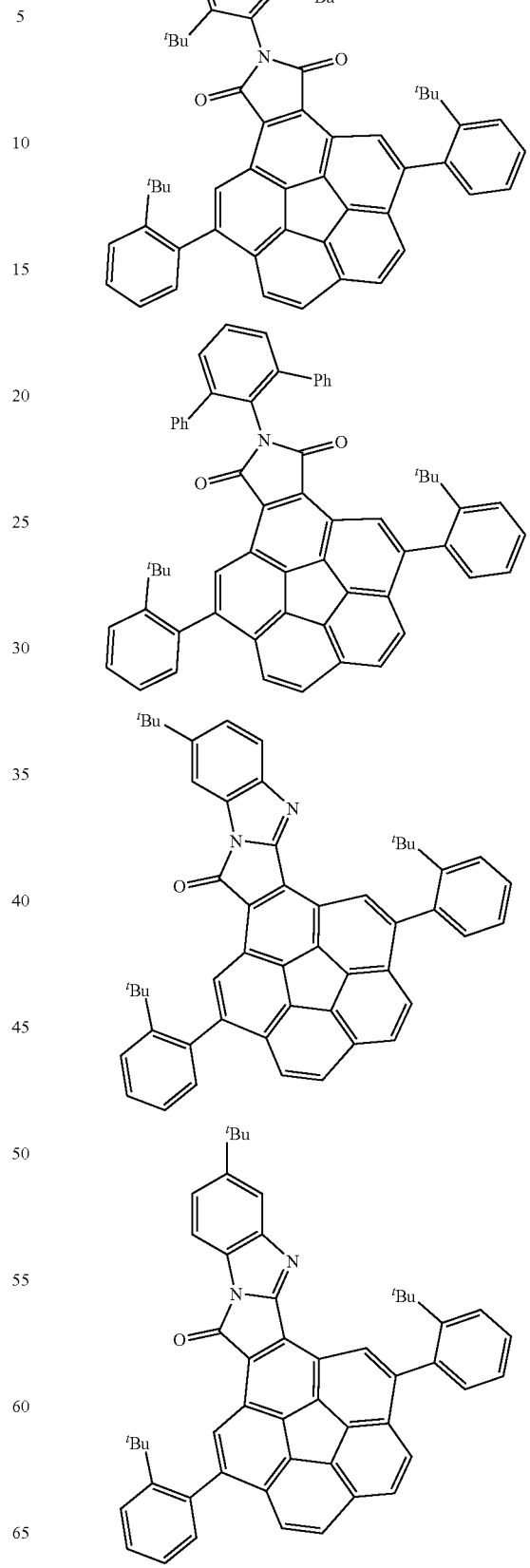

77
-continued
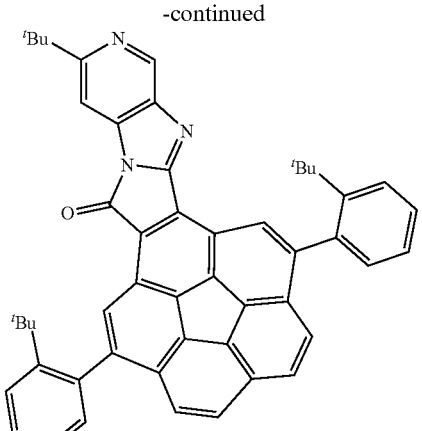
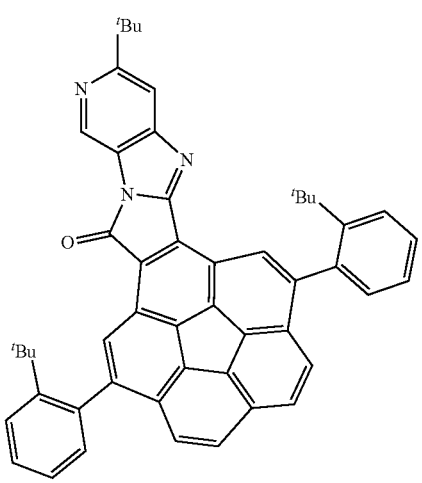
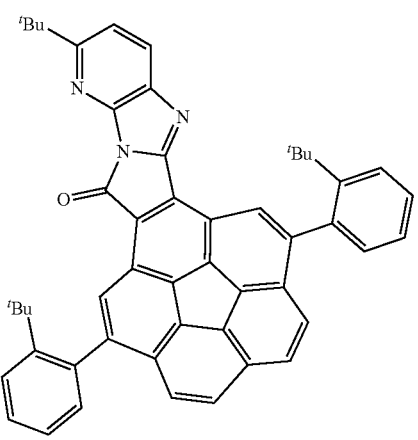
78
-continued
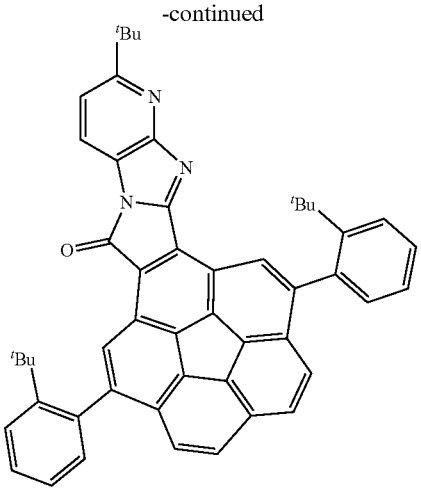
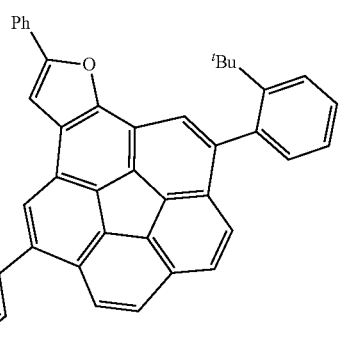
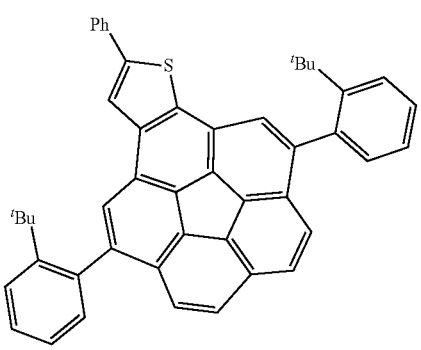
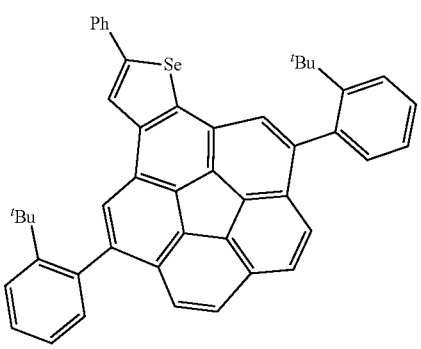

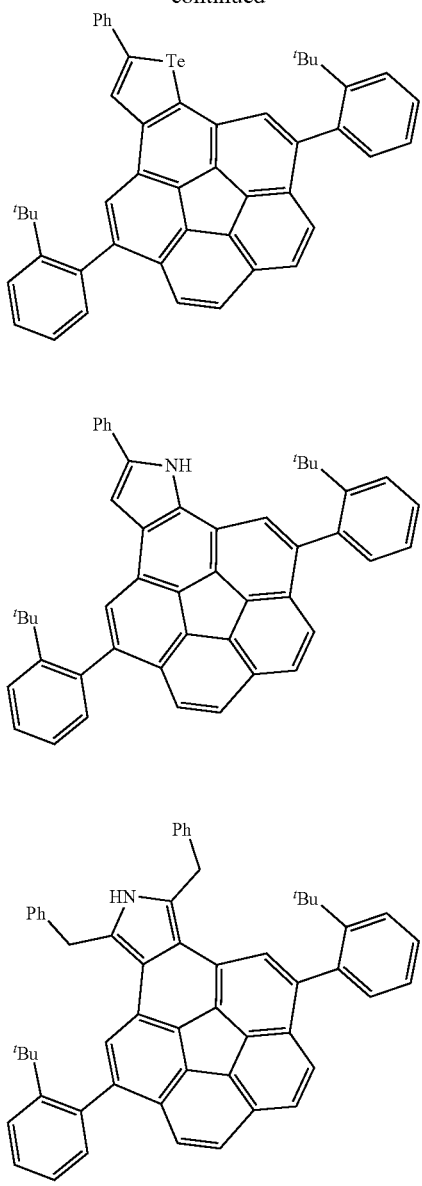

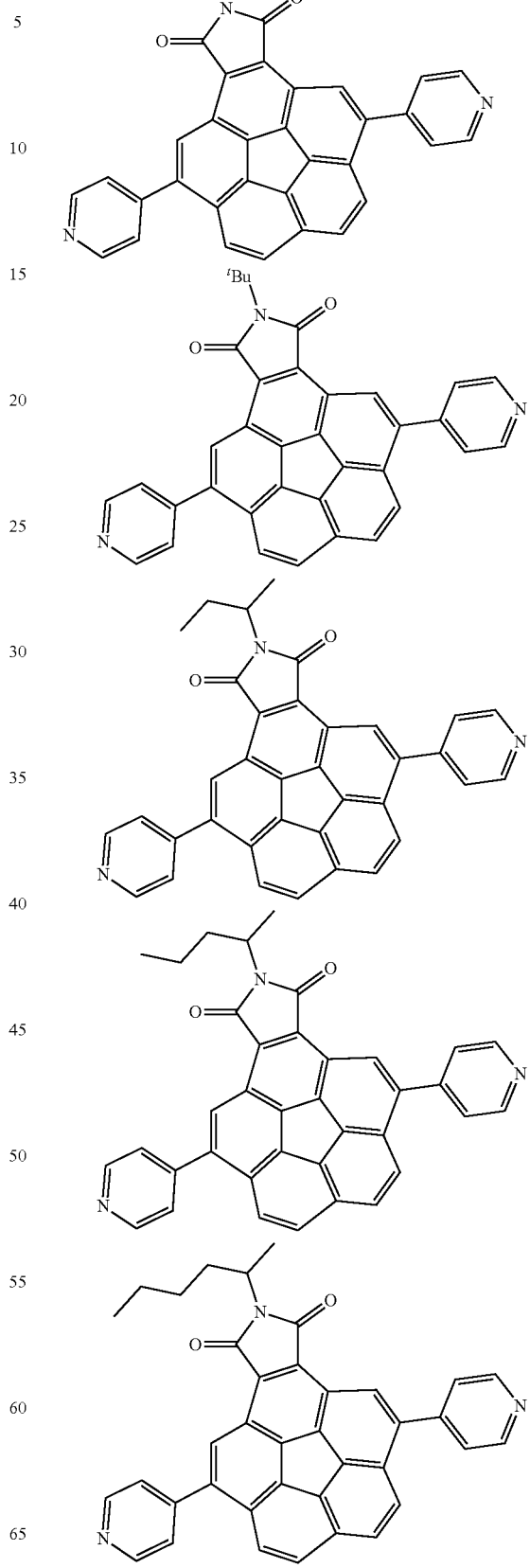

[Group 6]

The corannulene of Group 1 may be substituted with a substituted or unsubstituted C2 to C30 heteroaryl group (for example, pyridyl group, pyrimidyl group, triazinyl group, thienyl group, etc.) instead of the two substituents (OtBu). The position of the heteroatom (for example, nitrogen, sulfur, etc.) of the substituted or unsubstituted C2 to C30 heteroaryl group may be present at the ortho, meta, or para position with respect to the bonding position. The heteroaryl group may be substituted with at least one substituent selected from a C1 to C20 linear alkyl group, a C3 to C20 branched alkyl group, a C6 to C12 aryl group, and a C3 to C12 heteroaryl group.

Group 6 exemplifies a structure which substituted with a pyridyl group as the heteroaryl group and Group 7 exemplifies structure which substituted with a thienyl group, a furanyl group, a pyrroylyl group, a selenophenyl group, or a tellurophenyl group as the heteroaryl group.

81
-continued
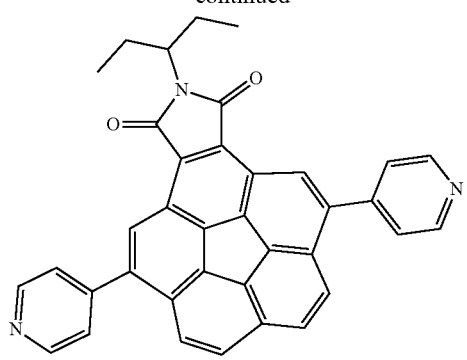
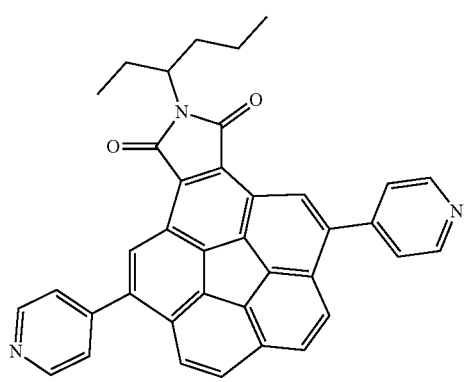
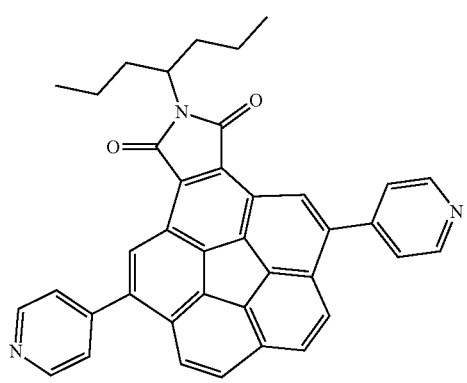
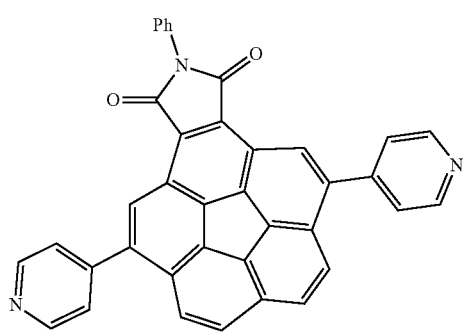
82
-continued
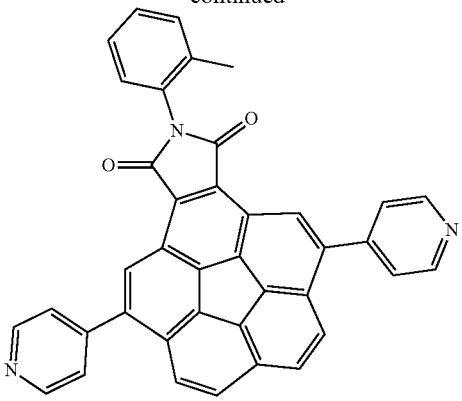
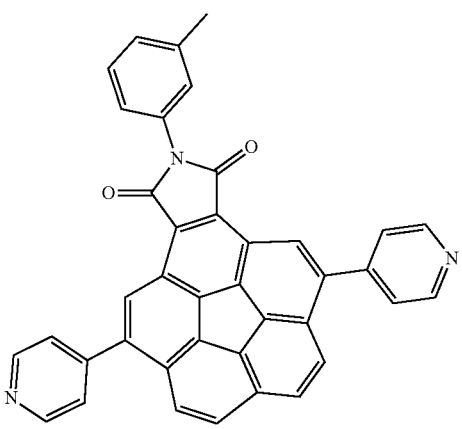
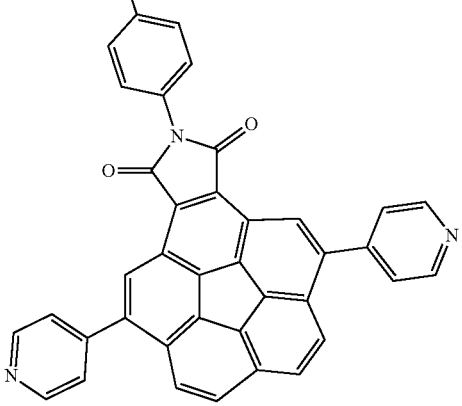
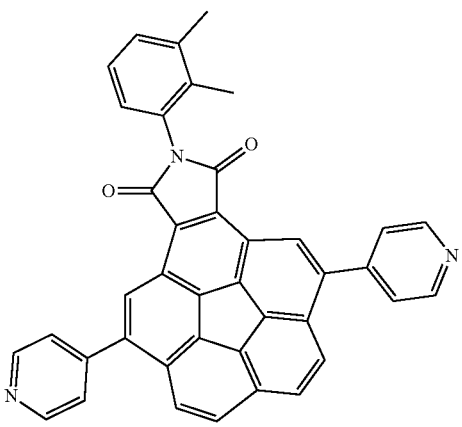

83
-continued
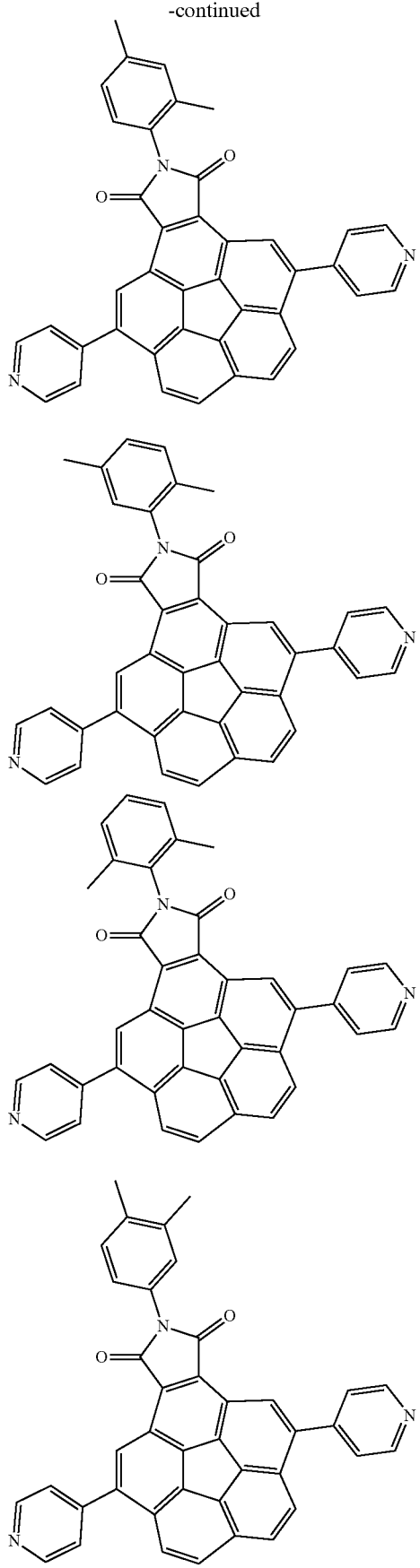
84
-continued
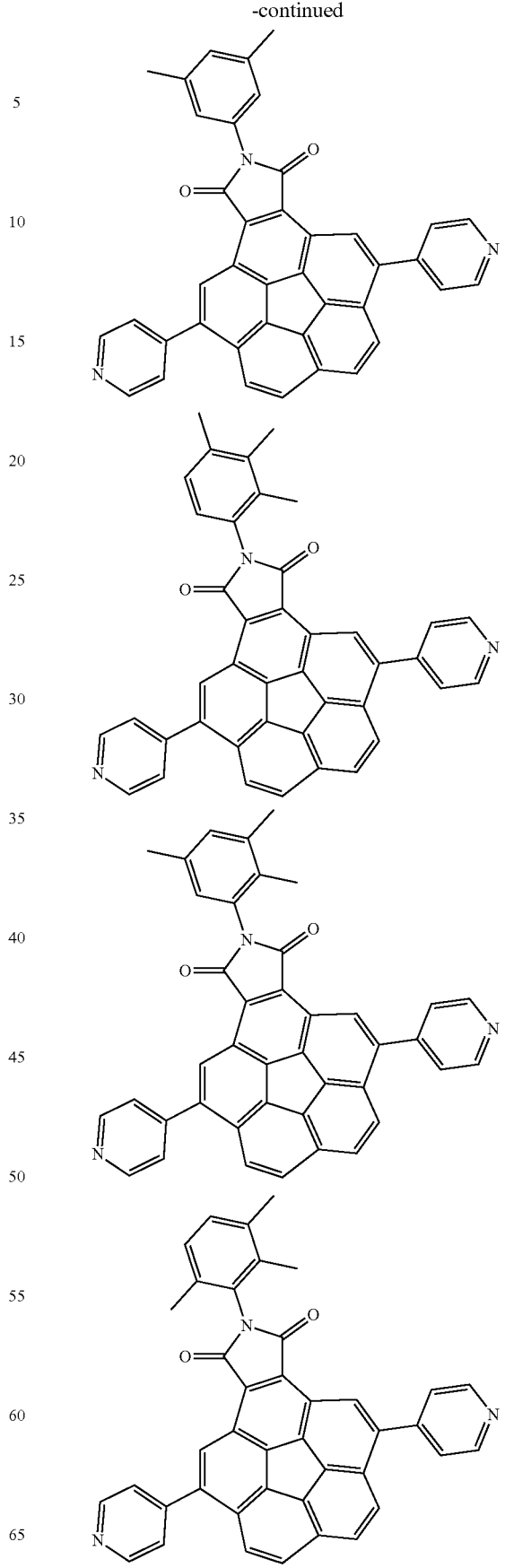

85
-continued
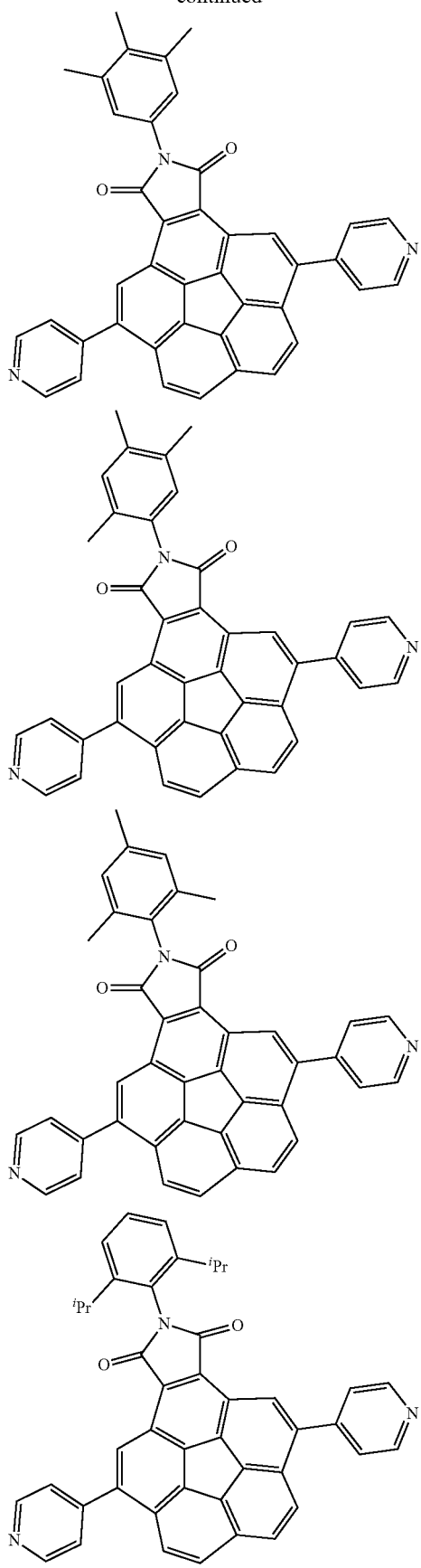
86
-continued
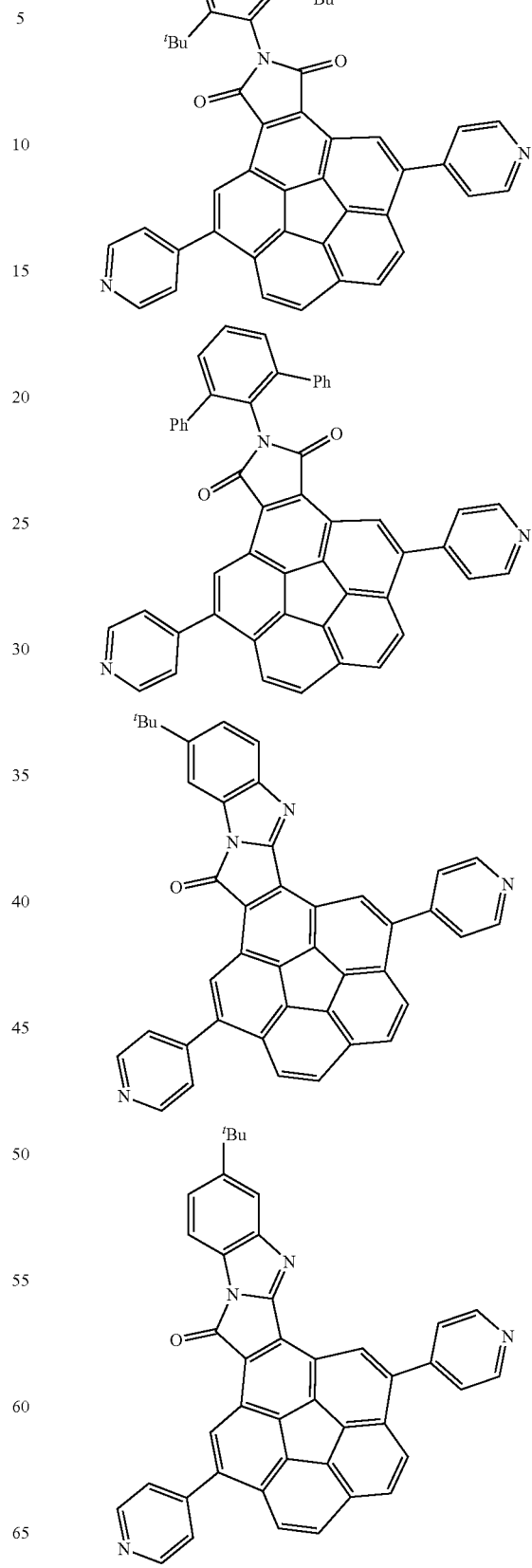

-continued
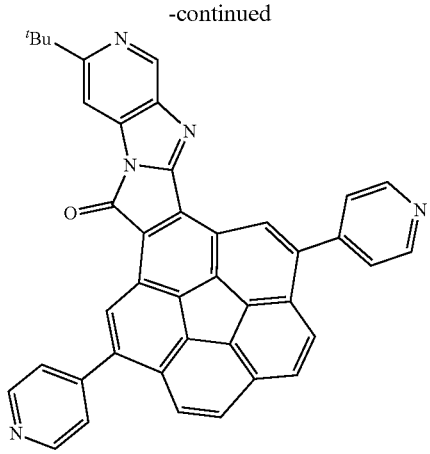
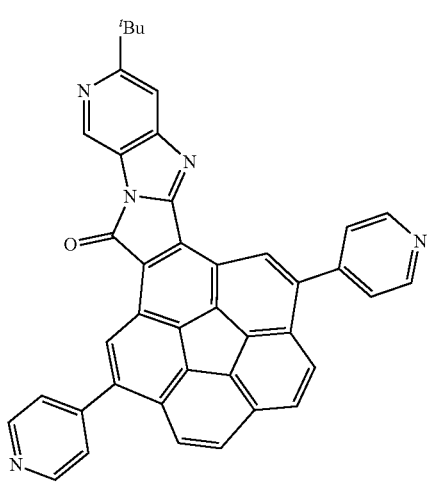
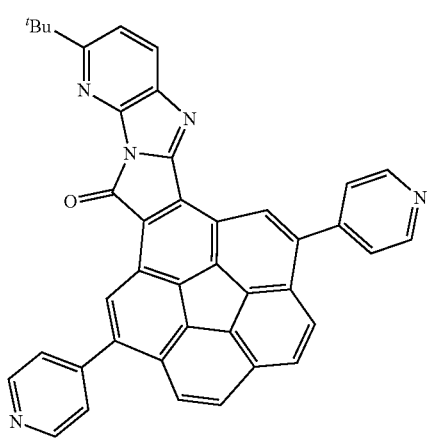
-continued
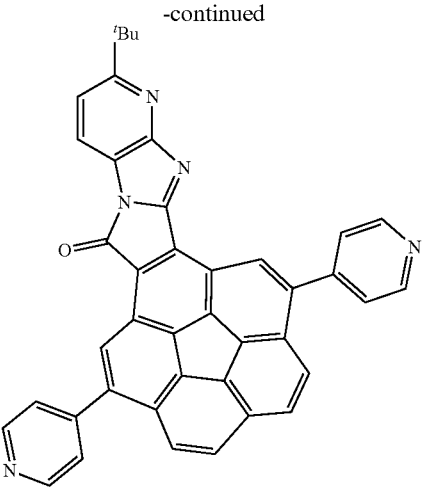
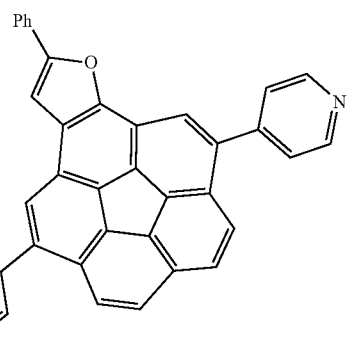
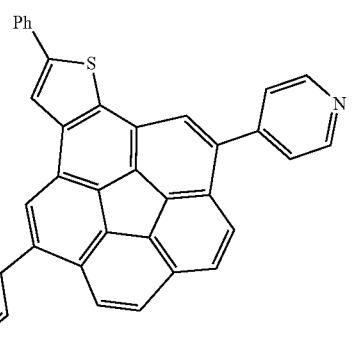
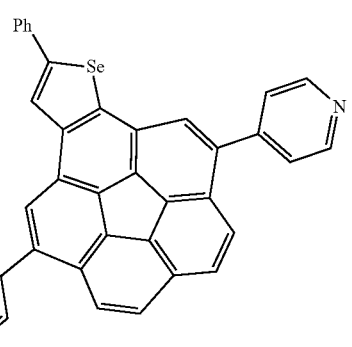

89
-continued

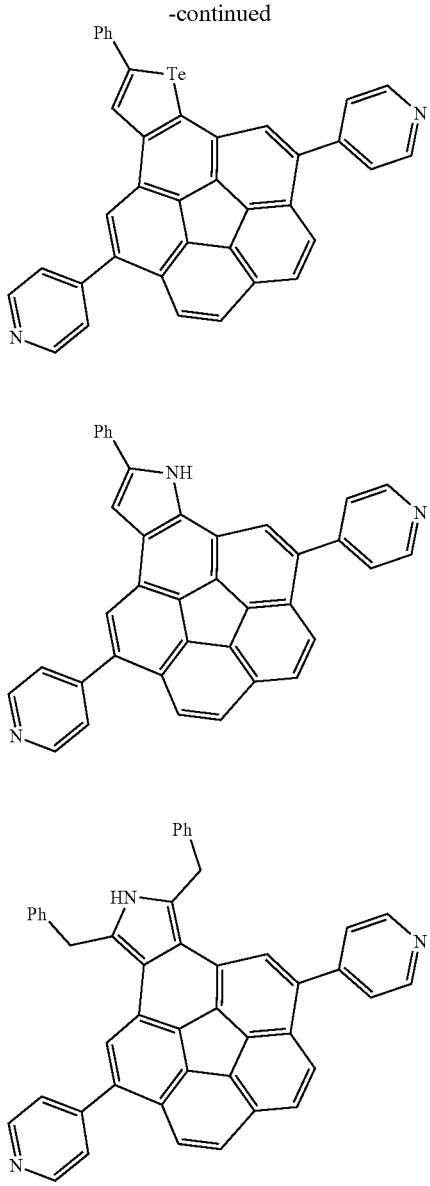

In Group 6, the pyridyl group may be substituted with at least one substituent selected from a C1 to C20 linear alkyl group, a C3 to C20 branched alkyl groups, a C6 to C12 aryl group, and a C3 to C12 heteroaryl group.

[Group 7]

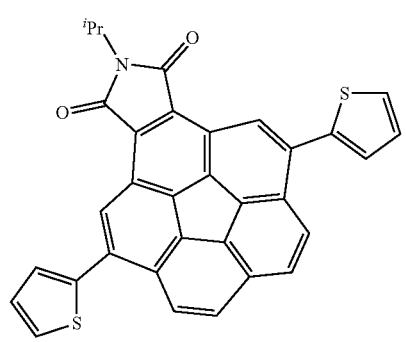

90
-continued

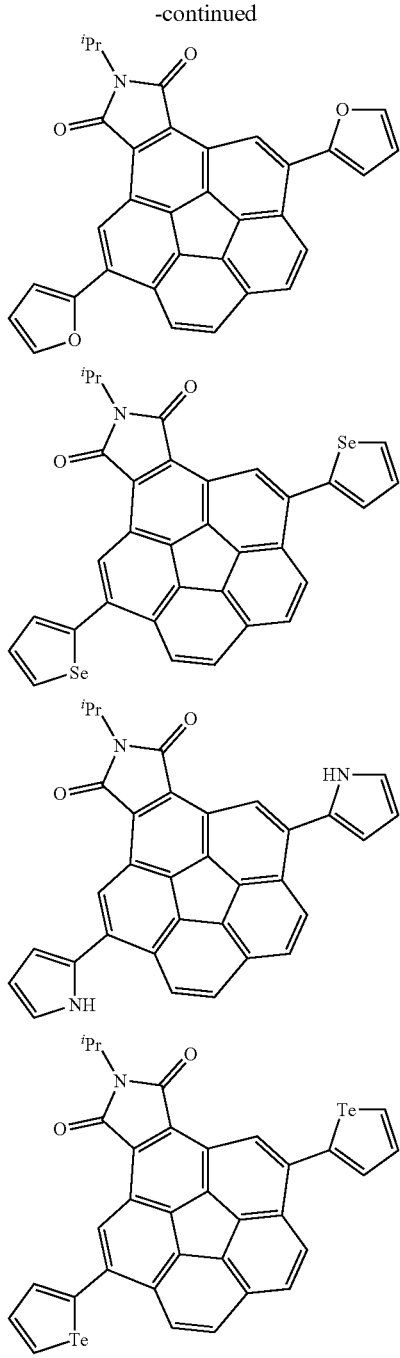

In Group 7, the thienyl group, furanyl group, pyrroyl group, selenophenyl group, or tellurophenyl group may be substituted with at least one substituent selected from a C1 to C20 linear alkyl group, a C3 to C20 branched alkyl group, a C6 to C12 aryl group, and a C3 to C12 heteroaryl group. In addition, the hydrogen of the pyrrolyl group may be substituted with at least one substituent selected from a C1 to C20 linear alkyl group, a C3 to C20 branched alkyl group, a C6 to C12 aryl group, and a C3 to C12 heteroaryl group.

The phenyl (Ph) group of Group 5 or the pyridyl group of Group 7 may be fused to corannulene through an alicyclic hydrocarbon group such as cyclopentadiene. These structures are illustrated in Group 8.

[Group 8]

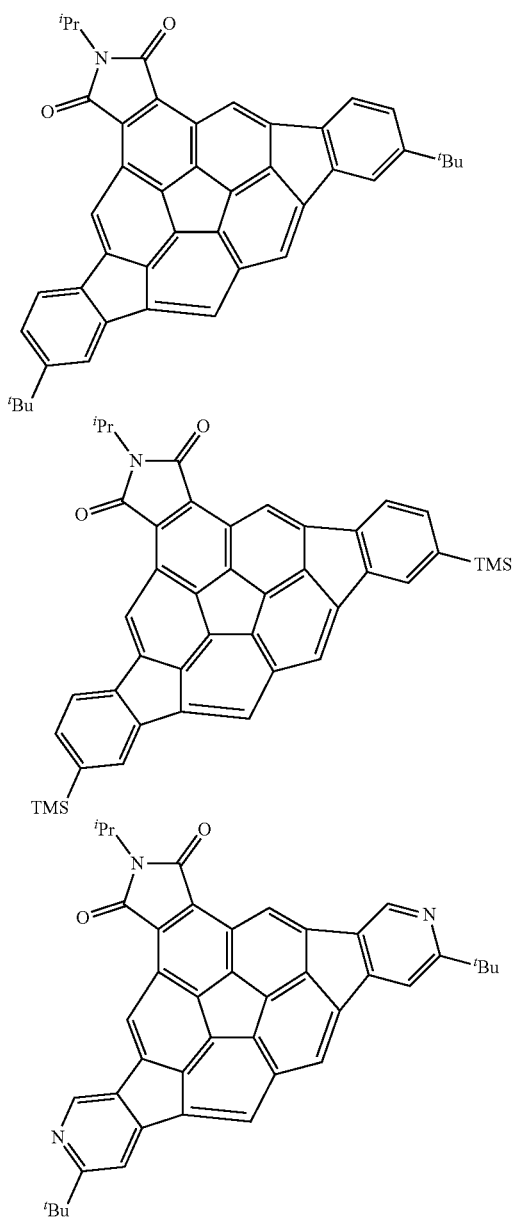

An average distance between the n-type dopant and the p-type semiconductor may be less than or equal to about 6.0 Å, for example, less than or equal to about 5.5 Å, or less than or equal to about 5.0 Å. The n-type dopant may adjust the average distance from the p-type semiconductor within the above range by including a bulky substituent (X) and an additional bulky substituent on the side. When the average distance from the p-type semiconductor is maintained within the above range, the n-type dopant and the p-type semiconductor may be well mixed to form a bulk hetero junction (BHJ).

The n-type dopant may be included in an amount of greater than or equal to about 0.1 mol %, greater than or equal to about 0.5 mol %, or greater than or equal to about 1 mol % and less than or equal to about 30 mol %, less than or equal to about 29 mol %, less than or equal to about 28 mol %, less than or equal to about 27 mol %, less than or equal to about 26 mol %, or less than or equal to about or 25 mol % based on a total amount of the photoelectric conversion layer 30. Within the above ranges, charge mobility of the photoelectric conversion layer 30 may be increased and the n-type dopant effectively suppresses aggregation of the n-type semiconductor (fullerene or fullerene derivative), thereby reducing unnecessary absorption in the blue region and increasing the absorption in the green region.

The n-type dopant in the photoelectric conversion layer 30 may be present alone in an upper portion of the photoelectric conversion layer 30. Herein, the upper portion may refer to an area of less than or equal to about 50%, for example, less than or equal to about 40%, less than or equal to about 30%, less than or equal to about 20%, less than or equal to about 10%, or less than or equal to about 5% from the surface in a thickness direction of the photoelectric conversion layer. The n-type dopant in the upper portion of the photoelectric conversion layer 30 may have a concentration gradient so that the content is increased toward the surface of the upper portion in contact with the second electrode 20.

The photoelectric conversion layer 30 may further include a p-type layer and/or an n-type layer on one surface or both surfaces thereof. The p-type layer may include a p-type semiconductor and the n-type layer may include an n-type semiconductor.

The organic photoelectric device 100 may further include an anti-reflection layer (not shown) on one surface of the first electrode 10 or the second electrode 20. The anti-reflection layer is disposed at a light incidence side and lowers reflectance of light of incident light and thereby light absorbance is further improved. For example, when light enters from the first electrode 10, the anti-reflection layer may be disposed on the first electrode 10 while when light enters from the second electrode 20, the anti-reflection layer may be disposed under the second electrode 20.

The anti-reflection layer may include, for example a material having a refractive index of about 1.6 to about 2.5, and may include for example at least one of a metal oxide, a metal sulfide, and an organic material having a refractive index within the ranges. The anti-reflection layer may include, for example a metal oxide such as an aluminum-containing oxide, a molybdenum-containing oxide, a tungsten-containing oxide, a vanadium-containing oxide, a rhenium-containing oxide, a niobium-containing oxide, a tantalum-containing oxide, a titanium-containing oxide, a nickel-containing oxide, a copper-containing oxide, a cobalt-containing oxide, a manganese-containing oxide, a chromium-containing oxide, a tellurium-containing oxide, or a combination thereof; a metal sulfide such as zinc sulfide; or an organic material such as an amine derivative, but is not limited thereto.

In the organic photoelectric device 100, when light enters from the first electrode 10 or second electrode 20 and the photoelectric conversion layer 30 absorbs light in a desired (and/or alternatively predetermined) wavelength region, excitons may be produced from the inside. The excitons are separated into holes and electrons in the photoelectric conversion layer 30, and the separated holes are transported to an anode that is one of the first electrode 10 and the second electrode 20 and the separated electrons are transported to the cathode that is the other of the first electrode 10 and the second electrode 20 so as to flow a current.

Figure 2:
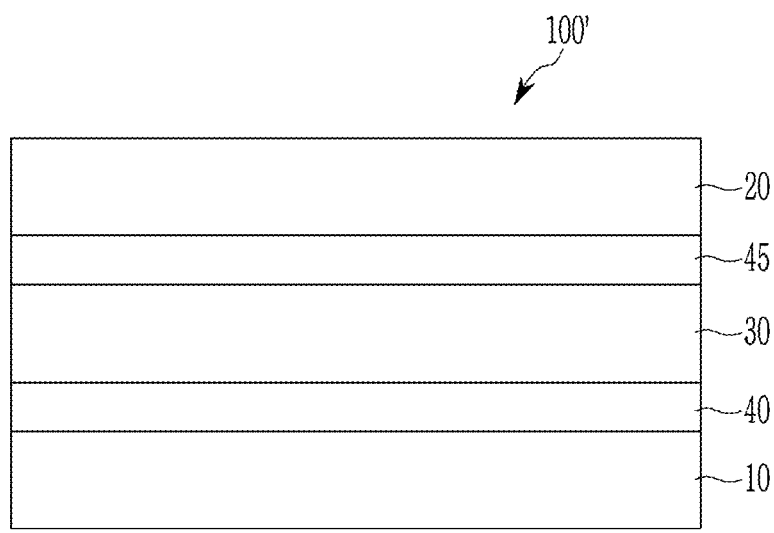
FIG. 2 is a cross-sectional view illustrating an organic photoelectric device according to another embodiment.

The organic photoelectric device 100 may further include at least one charge auxiliary layer between the first electrode 10 and the photoelectric conversion layer 30 and/or between the second electrode 20 and the photoelectric conversion layer 30. The charge auxiliary layer may increase efficiency by facilitating movement of holes and electrons separated from the photoelectric conversion layer 30. For example, as depicted in FIG. 2, an organic photoelectric device 100' in a different embodiment, includes a first charge auxiliary layer 40 between the photoelectric conversion layer 30 and the first electrode 10 and a second charge auxiliary layer 45 between the photoelectric conversion layer 30 and the second electrode 20. In some embodiments, the organic photoelectric device 100' similarly may further include at least one charge auxiliary layer between the first electrode 10 and the photoelectric conversion layer 30 and between the second electrode 20 and the photoelectric conversion layer 30.

The charge auxiliary layer may include at least one selected from a hole injection layer for facilitating hole injection, a hole transport layer for facilitating hole transport, an electron blocking layer for preventing electron transport, an electron injection layer for facilitating electron injection, an electron transport layer for facilitating electron transport, and a hole blocking layer for preventing hole transport.

The charge auxiliary layer may include for example an organic material, an inorganic material, or an organic/inorganic material. The organic material may be an organic material having hole or electron characteristics and the inorganic material may be for example a metal oxide such as a molybdenum oxide, a tungsten oxide, or a nickel oxide.

The hole transport layer (HTL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]piphenyl (α-NPD), m-MTDATA, 4,4',4"-tris(N-carbazolyl)-triphenylamine (TCTA), and a combination thereof, but is not limited thereto.

The electron blocking layer (EBL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4,4'-bis[N-(1-naphthyl)-N-phenyl-amino]piphenyl (α-NPD), m-MTDATA, 4,4',4"-tris(N-carbazolyl)-triphenylamine (TCTA), and a combination thereof, but is not limited thereto.

The electron transport layer (ETL) may include one selected from, for example, 1,4,5,8-naphthalene-tetracarboxylic dianhydride (NTCDA), bathocuproine (BCP), LiF, $Alq_3$, $Gaq_3$, Ings, $Znq_2$, $Zn(BTZ)_2$, $BeBq_2$, and a combination thereof, but is not limited thereto.

The hole blocking layer (HBL) may include one selected from, for example, 1,4,5,8-naphthalene-tetracarboxylic dianhydride (NTCDA), bathocuproine (BCP), LiF, $Alq_3$, $Gaq_3$, Ings, $Znq_2$, $Zn(BTZ)_2$, $BeBq_2$, and a combination thereof, but is not limited thereto.

Either one of the charge auxiliary layers may be omitted.

Hereinafter, an organic photoelectric device according to another embodiment is described.

Figure 3:
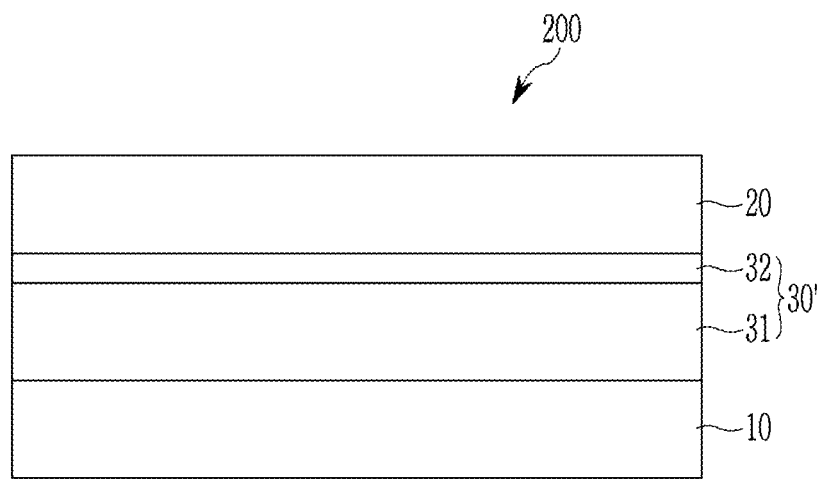
FIG. 3 is a cross-sectional view illustrating an organic photoelectric device according to another embodiment.

FIG. 3 is a cross-sectional view illustrating an organic photoelectric device according to another embodiment.

Referring to FIG. 3, an organic photoelectric device 200 according to an embodiment may include a first electrode 10 and a second electrode 20 facing each other, and a photoelectric conversion layer 30' between the first electrode 10 and the second electrode 20. The photoelectric conversion layer 30' may include a first photoelectric conversion layer 31 and a second photoelectric conversion layer 32 on the first photoelectric conversion layer 31, but is not limited thereto. In FIG. 3, the photoelectric conversion layer including two layers is illustrated, but may be formed of three or more layers.

The first photoelectric conversion layer 31 includes a p-type semiconductor and an n-type semiconductor, and the second photoelectric conversion layer 32 includes a p-type semiconductor, an n-type semiconductor, and an n-type dopant represented by Chemical Formula 1.

In an embodiment, the first photoelectric conversion layer 31 may be a p-type rich layer including the n-type semiconductor more than the p-type semiconductor, and for example, a first composition ratio ($p^1/n^1$) of the p-type semiconductor relative to the n-type semiconductor may be greater than about 1.0. For example, the first composition ratio ($p^1/n^1$) of the p-type semiconductor relative to the n-type semiconductor of the first photoelectric conversion layer 31 may be greater than about 1.0 and less than or equal to about 10.0, for example, about 1.2 to about 5.0, for example, about 1.5 to about 3.5, for example, greater than about 1.5 and less than about 3.5, or for example, about 2.0 to about 3.0.

For example, in the first photoelectric conversion layer 31, the p-type semiconductor is a light absorbing material selectively absorbing one of red light, green light, and blue light, and when the n-type semiconductor is for example fullerene or a fullerene derivative, the first photoelectric conversion layer 31 may relatively more include the p-type semiconductor and accordingly, increase light absorption in a desired (and/or alternatively predetermined) wavelength region and thus external quantum efficiency (EQE) in the desired (and/or alternatively predetermined) wavelength region. Accordingly, wavelength selectivity of the organic photoelectric device 100 may be increased.

For example, in the first photoelectric conversion layer 31, when the p-type semiconductor is a light absorbing material selectively absorbing green light having a maximum absorption wavelength (λmax) in a range of about 520 nm to about 580 nm, and the n-type semiconductor is for example fullerene or a fullerene derivative, the first photoelectric conversion layer 31 may relatively more include the p-type semiconductor and accordingly, increase light absorption in the green wavelength region and thus external quantum efficiency (EQE) in the green wavelength region. Accordingly, green wavelength selectivity of the organic photoelectric device 100 may be increased.

A second composition ratio ($p^2/n^2$) of the p-type semiconductor relative to a sum of the n-type semiconductor and the n-type dopant of the second photoelectric conversion layer 32 may be smaller than the first composition ratio ($p^1/n^1$) of the p-type semiconductor relative to the n-type semiconductor of the first photoelectric conversion layer 31. Within the range, for example, the second composition ratio ($p^2/n^2$) of the p-type semiconductor relative to the sum of the n-type semiconductor and the n-type dopant of the second photoelectric conversion layer 32 may be in a range of about 0.5 to about 1.5, for example, about 0.7 to about 1.3, for example, about 0.8 to about 1.2, or for example, about 1.0.

The first photoelectric conversion layer 31 may be thicker than the second photoelectric conversion layer 32. The first photoelectric conversion layer 31 may have, for example, a thickness of about 5 nm to about 300 nm, and the second photoelectric conversion layer 32 may have, for example, a thickness of about 2 nm to about 40 nm.

On the other hand, the second photoelectric conversion layer 32 is formed to be relatively thin on the first photoelectric conversion layer 31 and thus performs light absorption and photoelectric conversion and simultaneously, may more include the n-type semiconductor than the first photoelectric conversion layer 31 and thus prevent heat resistance deterioration of the organic photoelectric device 100. Accordingly, the organic photoelectric device 100 may be suppressed or prevented from thermal degradation during the subsequent process or operation of the organic photoelectric device 100.

For example, the first photoelectric conversion layer 31 may be a main photoelectric conversion layer selectively absorbing light of a desired (and/or alternatively predetermined) wavelength region and thus photoelectrically converting it, and the second photoelectric conversion layer 32 may be an auxiliary photoelectric conversion layer improving heat resistance and charge mobility as well as increasing the photoelectric conversion of the first photoelectric conversion layer 31.

The first photoelectric conversion layer 31 and the second photoelectric conversion layer 32 may contact each other.

The first electrode 10 may be an anode, the second electrode 20 may be a cathode, and the second photoelectric conversion layer 32 may be disposed closer to a light-receiving side than the first photoelectric conversion layer 31. In other words, the first photoelectric conversion layer 31 may be disposed close to the first electrode 10, and the second photoelectric conversion layer 32 may be close to the second electrode 10.

The n-type dopant may be included in an amount of greater than or equal to about 0.1 mol %, greater than or equal to about 0.5 mol %, or greater than or equal to about 1 mol % and less than or equal to about 30 mol %, less than or equal to about 29 mol %, less than or equal to about 28 mol %, less than or equal to about 27 mol %, less than or equal to about 26 mol %, or less than or equal to about 25 mol % based on a total amount of the second photoelectric conversion layer 32.

Figure 4:
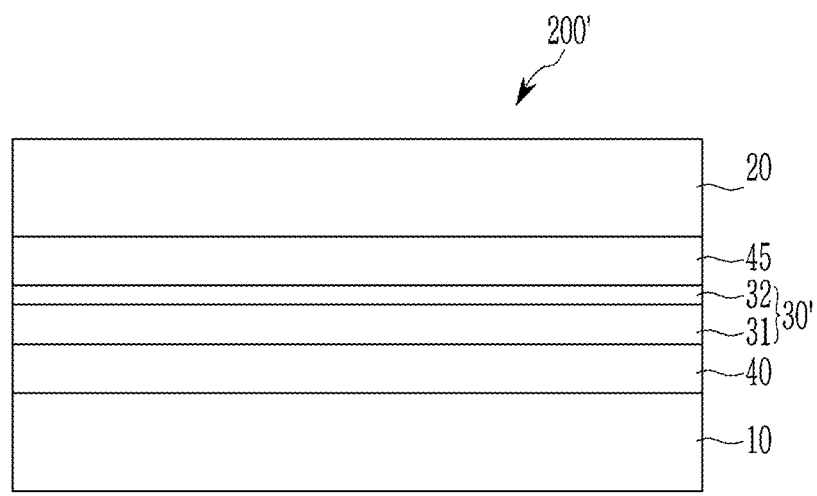
FIG. 4 is a cross-sectional view illustrating an organic photoelectric device according to another embodiment.

The organic photoelectric device 200 may further include at least one charge auxiliary layer between the first electrode 10 and the first photoelectric conversion layer 31 and/or between the second electrode 20 and the second photoelectric conversion layer 32, for example as depicted in FIG. 4. FIG. 4 is a cross-sectional view illustrating an organic photoelectric device according to another embodiment. The organic photoelectric device 200' includes a first charge auxiliary layer 40 between the first electrode 10 and the first photoelectric conversion layer 31 and a second charge auxiliary layer 45 between the second electrode 20 and the second photoelectric conversion layer 32.

The first and second charge auxiliary layers 40 and 45 may promote movement of holes and electrons separated from the first and second photoelectric conversion layers 31 and 32 and thus increase efficiency. Details for the first and second charge auxiliary layers 40 and 45 are the same as the charge auxiliary layer of FIG. 2 described above.

The organic photoelectric device may be applied to a solar cell, an image sensor, a photodetector, a photosensor, and an organic light emitting diode (OLED), but is not limited thereto.

The organic photoelectric device may be for example applied to an image sensor.

Hereinafter, an example of an image sensor including the photoelectric device is described referring to drawings. As an example of an image sensor, an organic CMOS image sensor is described.

Figure 5:
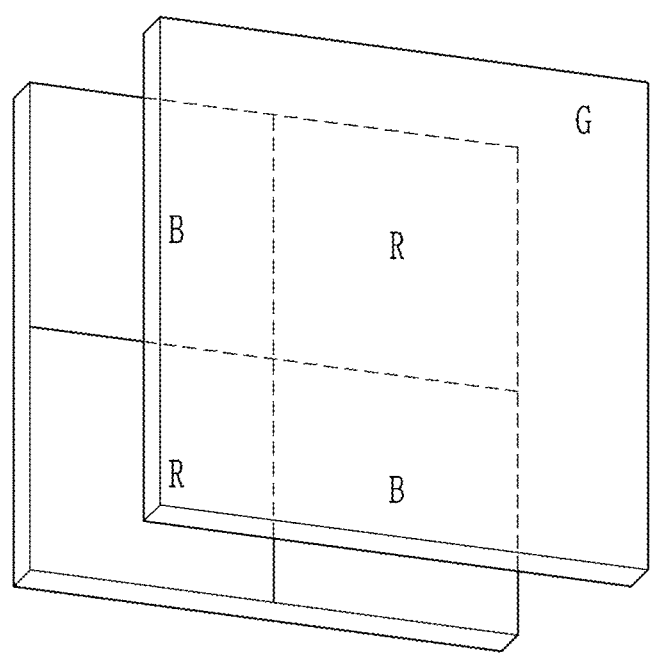
FIG. 5 is a top plan view schematically illustrating an organic CMOS image sensor according to an embodiment.
Figure 6:
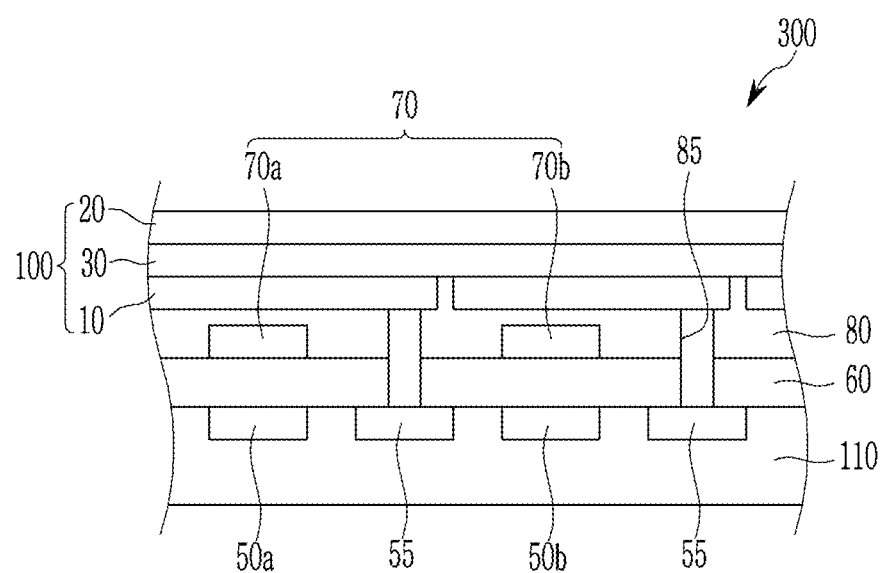
FIG. 6 is a cross-sectional view illustrating an example of the organic CMOS image sensor of FIG. 5.

FIG. 5 is a schematic top plan view of an organic CMOS image sensor according to an embodiment and FIG. 6 is a cross-sectional view showing one example of the organic CMOS image sensor of FIG. 5.

Referring to FIGS. 5 and 6, an organic CMOS image sensor 300 according to an example embodiment includes a semiconductor substrate 110 integrated with photo-sensing devices 50a and 50b, a transmission transistor (not shown) and a charge storage 55, a lower insulation layer 60, a color filter layer 70, an upper insulation layer 80, and an organic photoelectric device 100.

The semiconductor substrate 110 may be a silicon substrate, and is integrated with the photo-sensing devices 50a and 50b, the transmission transistor (not shown), and the charge storage 55. The photo-sensing devices 50a and 50b may be photodiodes.

The photo-sensing devices 50a and 50b, the transmission transistor, and/or the charge storage 55 may be integrated in each pixel, and as shown in the drawing, the photo-sensing devices 50a and 50b may be respectively included in a blue pixel and a red pixel and the charge storage 55 may be included in a green pixel.

The photo-sensing devices 50a and 50b sense light, the information sensed by the photo-sensing devices may be transferred by the transmission transistor, the charge storage 55 is electrically connected to the organic photoelectric device 100 that will be described later, and the information of the charge storage 55 may be transferred by the transmission transistor.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but are not limited thereto. Further, it is not limited to the structure, and the metal wire and pad may be disposed under the photo-sensing device 50a and 50b.

The lower insulation layer 60 is formed on the metal wire and the pad. The lower insulation layer 60 may be made of an inorganic insulating material such as a silicon oxide and/or a silicon nitride, or a low dielectric constant (low K) material such as SiC, SiCOH, SiCO, and SiOF. The lower insulation layer 60 has a trench exposing the charge storage 55. The trench may be filled with fillers.

A color filter layer 70 is formed on the lower insulation layer 60. The color filter layer 70 includes a blue filter 70a formed in a blue pixel and a red filter 70b in a red pixel. In the present embodiment, a green filter is not included, but a green filter may be further included.

The upper insulation layer 80 is formed on the color filter layer 70. The upper insulation layer 80 eliminates a step caused by the color filter layer 70 and smoothens the surface. The upper insulation layer 80 and the lower insulation layer 60 may include a contact hole (not shown) exposing a pad, and a through-hole 85 exposing the charge storage 55 of the green pixel.

The aforementioned organic photoelectric device 100 is formed on the upper insulation layer 80. As described above, the organic photoelectric device 100 includes the first electrode 10, the first and second photoelectric conversion layers 31 and 32, and the second electrode 20. In the drawing, the first electrode 10, the first and second photoelectric conversion layers 31 and 32, and the second electrode 20 are sequentially stacked, but this disclosure is not limited thereto, and for example they may be stacked in an order of the second electrode 20, the second and first photoelectric conversion layers 32 and 31, and the first electrode 10.

The first electrode 10 and the second electrode 20 may be all light-transmitting electrodes and the first and second photoelectric conversion layers 31 and 32 are the same as described above. The first and second photoelectric conversion layers 31 and 32 may for example selectively absorb light in a green wavelength region and may replace a color filter of a green pixel.

Light in a green wavelength region of light that enters from the second electrode 20 is mainly absorbed by the first and second photoelectric conversion layers 31 and 32 and photoelectrically converted and light in a remaining wavelength region is transmitted through the first electrode 10 and is sensed by the photo-sensing devices 50a and 50b.

Focusing lens (not shown) may be further formed on the organic photoelectric device 100. The focusing lens may control a direction of incident light and gather the light in one region. The focusing lens may have a shape of, for example, a cylinder or a hemisphere, but is not limited thereto.

As described above, the organic photoelectric device 100 has a stack structure thereby a size of an image sensor may be reduced to realize a down-sized image sensor.

Figure 7:
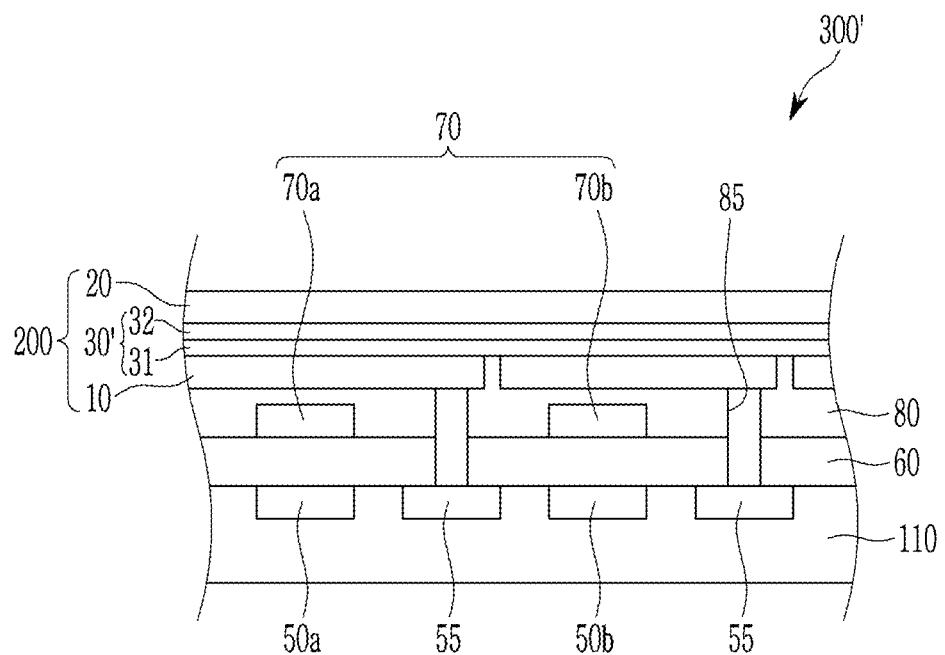
FIG. 7 is a cross-sectional view illustrating another example of an organic CMOS image sensor.

Although FIG. 6 as an example illustrates a structure in which the organic photoelectric device of FIG. 1 is stacked, the structure in which the organic photoelectric device of FIG. 3 is stacked may also be applied as shown in FIG. 7. Additionally, although not illustrated, the organic CMOS image sensor 300 of FIG. 6 may further include at least one charge auxiliary layer between the first electrode 10 and the photoelectric conversion layer 30 and/or between the second electrode 20 and the photoelectric conversion layer 30. Additionally, although not illustrated, the organic CMOS image sensor 300' of FIG. 7 may further include at least one charge auxiliary layer between the first electrode 10 and the first photoelectric conversion layer 31 and/or between the second electrode 20 and the second photoelectric conversion layer 32.

The organic photoelectric device selectively absorbing light in a green wavelength region is for example stacked but this disclosure is not limited thereto. For example, an organic photoelectric device selectively absorbing light in a blue wavelength region may be stacked and a green photo-sensing device and a red photo-sensing device may be integrated in the semiconductor substrate 110 or an organic photoelectric device selectively absorbing light in a red wavelength region may be stacked and a green photo-sensing device and a blue photo-sensing device may be integrated in the semiconductor substrate 110.

Figure 8:
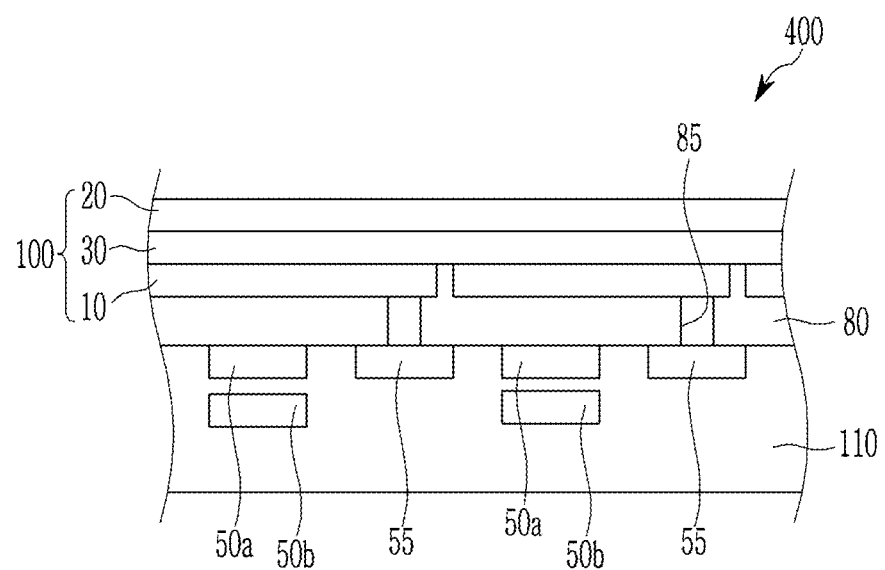
FIG. 8 is a cross-sectional view illustrating another example of an organic CMOS image sensor.

FIG. 8 is a cross-sectional view showing another example of the organic CMOS image sensor.

The organic CMOS image sensor 400 according to the present embodiment like the above embodiment includes a semiconductor substrate 110 integrated with photo-sensing devices 50a and 50b, a transmission transistor (not shown), and a charge storage 55, an upper insulation layer 80 having a through-hole 85, and an organic photoelectric device 100.

However, in the CMOS image sensor 400 according to the present embodiment unlike the above embodiment, the photo-sensing devices 50a and 50b are stacked in a vertical direction, but the color filter layer 70 is omitted. The photo-sensing devices 50a and 50b are electrically connected to charge storage (not shown) and may be transferred by the transmission transistor. The photo-sensing devices 50a and 50b may selectively absorb light in each wavelength region depending on a stacking depth.

Focusing lens (not shown) may be further formed on the organic photoelectric device 100. The focusing lens may control a direction of incident light and gather the light in one region. The focusing lens may have a shape of, for example, a cylinder or a hemisphere, but is not limited thereto.

As described above, the organic photoelectric device selectively absorbing light in a green wavelength region is stacked and the red photo-sensing device and the blue photo-sensing device are stacked, and thereby a size of an image sensor may be reduced to realize a down-sized image sensor.

Although FIG. 8 as an example illustrates a structure in which the organic photoelectric device of FIG. 1 is stacked, the structure in which each organic photoelectric device of FIGS. 2 to 4 is stacked may also be applied. Additionally, although not illustrated, the organic CMOS image sensor 400 of FIG. 8 may further include at least one charge auxiliary layer between the first electrode 10 and the photoelectric conversion layer 30 and/or between the second electrode 20 and the photoelectric conversion layer 30.

In FIG. 8, the organic photoelectric device selectively absorbing light in a green wavelength region is for example stacked, but this disclosure is not limited thereto. For example, an organic photoelectric device selectively absorbing light in a blue wavelength region may be stacked and a green photo-sensing device and a red photo-sensing device may be integrated in the semiconductor substrate 110 or an organic photoelectric device selectively absorbing light in a red wavelength region may be stacked and a green photo-sensing device and a blue photo-sensing device may be integrated in the semiconductor substrate 110.

Figure 9:
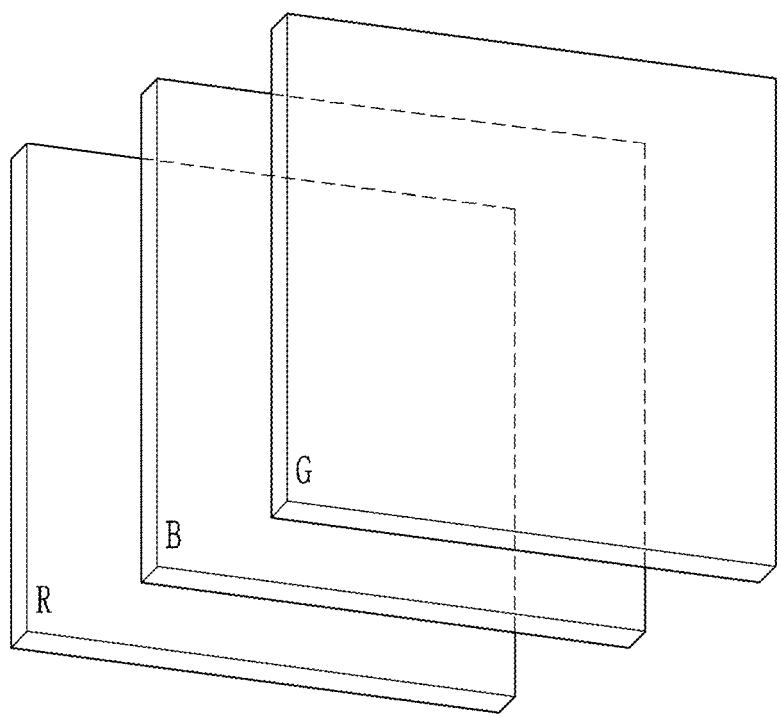
FIG. 9 is a top plan view schematically illustrating an organic CMOS image sensor according to another embodiment.
Figure 10:
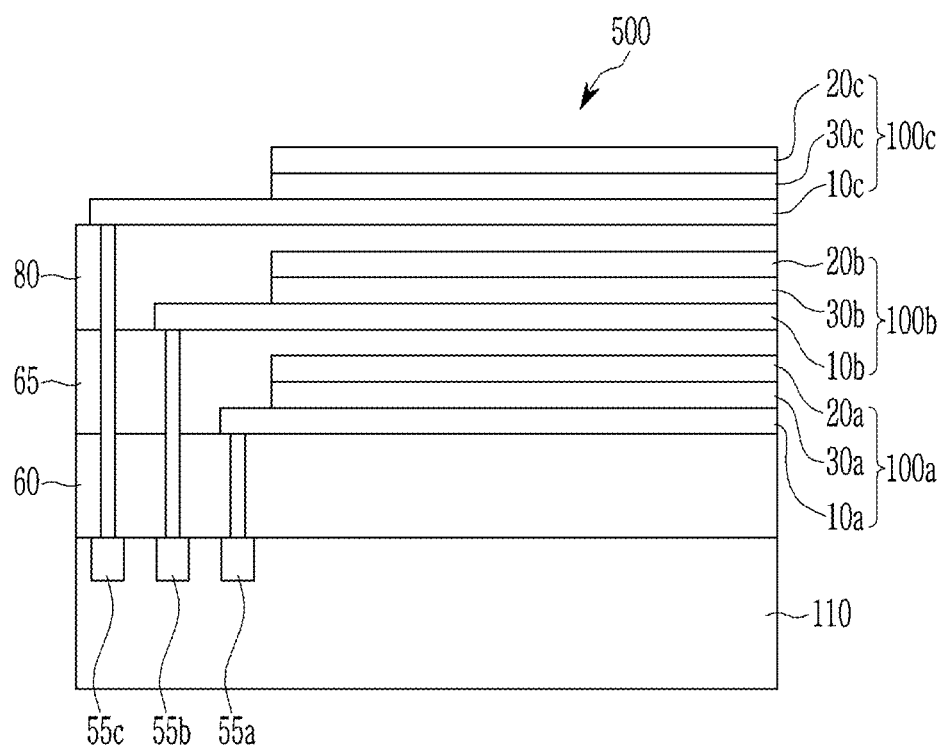
FIG. 10 is a cross-sectional view of the organic CMOS image sensor of FIG. 9.

FIG. 9 is a schematic top plan view showing an organic CMOS image sensor according to another embodiment and FIG. 10 is a cross-sectional view of the organic CMOS image sensor of FIG. 9.

The organic CMOS image sensor 500 according to the present embodiment includes a green photoelectric device selectively absorbing light in a green wavelength region, a blue photoelectric device selectively absorbing light in a blue wavelength region, and a red photoelectric device selectively absorbing light in a red wavelength region that are stacked.

The organic CMOS image sensor 500 according to the present embodiment includes a semiconductor substrate 110, a lower insulation layer 60, an intermediate insulation layer 65, an upper insulation layer 80, a first organic photoelectric device 100a, a second organic photoelectric device 100b, and a third organic photoelectric device 100c.

The semiconductor substrate 110 may be a silicon substrate, and is integrated with the transmission transistor (not shown) and the charge storages 55a, 55b, and 55c.

A metal line (not shown) and pad (not shown) are formed on the semiconductor substrate 110 and a lower insulation layer 60 is formed on the metal line and pad.

The first organic photoelectric device 100a is formed on the lower insulation layer 60.

The first organic photoelectric device 100a includes a first electrode 10a and a second electrode 20a facing each other and a photoelectric conversion layer 30a disposed between the first electrode 10a and the second electrode 20a. The first electrode 10a, the second electrode 20a, and the photoelectric conversion layer 30a are the same as described above and the photoelectric conversion layer 30a may selectively absorb light in one wavelength region of red, blue, and green. For example, the first organic photoelectric device 100a may be a red organic photoelectric device.

In the drawing, the first electrode 10a, the photoelectric conversion layer 30a, and the second electrode 20a are sequentially stacked, but this disclosure is not limited thereto, and for example they may be stacked in an order of the second electrode 20a, the photoelectric conversion layer 30a, and the first electrode 10a.

The intermediate insulation layer 65 is formed on the first organic photoelectric device 100a.

The second organic photoelectric device 100b is formed on the intermediate insulation layer 65.

The second organic photoelectric device 100b includes a first electrode 10b and a second electrode 20b facing each other and a photoelectric conversion layer 30b disposed between the first electrode 10b and the second electrode 20b. The first electrode 10b, the second electrode 20b, and the photoelectric conversion layer 30b are the same as described above and the photoelectric conversion layer 30b may selectively absorb light in one wavelength region of red, blue and green. For example, the second photoelectric device 100b may be a blue organic photoelectric device.

In the drawing, the first electrode 10b, the photoelectric conversion layer 30b, and the second electrode 20b are sequentially stacked, but this disclosure is not limited thereto, and for example they may be stacked in an order of the second electrode 20b, the photoelectric conversion layer 30b, and the first electrode 10b.

The upper insulation layer 80 is formed on the second organic photoelectric device 100b. The lower insulation layer 60, the intermediate insulation layer 65, and the upper insulation layer 80 have a plurality of through-holes exposing the charge storages 55a, 55b, and 55c.

The third organic photoelectric device 100c is formed on the upper insulation layer 80. The third organic photoelectric device 100c includes a first electrode 10c and a second electrode 20c facing each other and a photoelectric conversion layer 30c disposed between the first electrode 10c and the second electrode 20c. The first electrode 10c, the second electrode 20c, and the photoelectric conversion layer 30c are the same as described above and the photoelectric conversion layer 30c may selectively absorb light in one wavelength region of red, blue, and green. For example, the third organic photoelectric device 100c may be a green photoelectric device.

In the drawing, the first electrode 10c, the photoelectric conversion layer 30c, and the second electrode 20c are sequentially stacked, but this disclosure is not limited thereto, and for example they may be stacked in an order of the second electrode 20c, the photoelectric conversion layer 30c, and the first electrode 10c.

Focusing lens (not shown) may be further formed on the organic photoelectric device 100c. The focusing lens may control a direction of incident light and gather the light in one region. The focusing lens may have a shape of, for example, a cylinder or a hemisphere, but is not limited thereto.

In the drawing, the organic photoelectric device of FIG. 1 is as an example is illustrated as the first organic photoelectric device 100a, the second organic photoelectric device 100b, and the third organic photoelectric device 100c, but each organic photoelectric device of FIGS. 2 to 4 may be applied in the same manner. Additionally, although not illustrated, the first organic photoelectric device 100a may further include at least one charge auxiliary layer between the first electrode 10a and the photoelectric conversion layer 30a and/or between the second electrode 20a and the photoelectric conversion layer 30a. Also, the second organic photoelectric device 100b may further include at least one charge auxiliary layer between the first electrode 10b and the photoelectric conversion layer 30b and/or between the second electrode 20b and the photoelectric conversion layer 30b. Also, the third organic photoelectric device 100c may further include at least one charge auxiliary layer between the first electrode 10c and the photoelectric conversion layer 30c and/or between the second electrode 20c and the photoelectric conversion layer 30c.

In the drawing, the organic photoelectric device of FIG. 1 is as an example illustrated as the first organic photoelectric device 100a, the second organic photoelectric device 100b, and the third organic photoelectric device 100c, but is not limited thereto. One or two of the first organic photoelectric device 100a, second organic photoelectric device 100b and third organic photoelectric device 100c may be the organic photoelectric device of FIG. 1.

In the drawing, the first organic photoelectric device 100a, the second organic photoelectric device 100b, and the third organic photoelectric device 100c are sequentially stacked, but the present disclosure is not limited thereto, and they may be stacked in various orders.

As described above, the first organic photoelectric device 100a, the second organic photoelectric device 100b, and the third organic photoelectric device 100c that absorb light in different wavelength regions are stacked, and thereby a size of an image sensor may be reduced to realize a down-sized image sensor.

Image sensors according to example embodiments may be applied to, for example, various electronic devices such as a mobile phone or a digital camera, but is not limited thereto.

Figure 11:
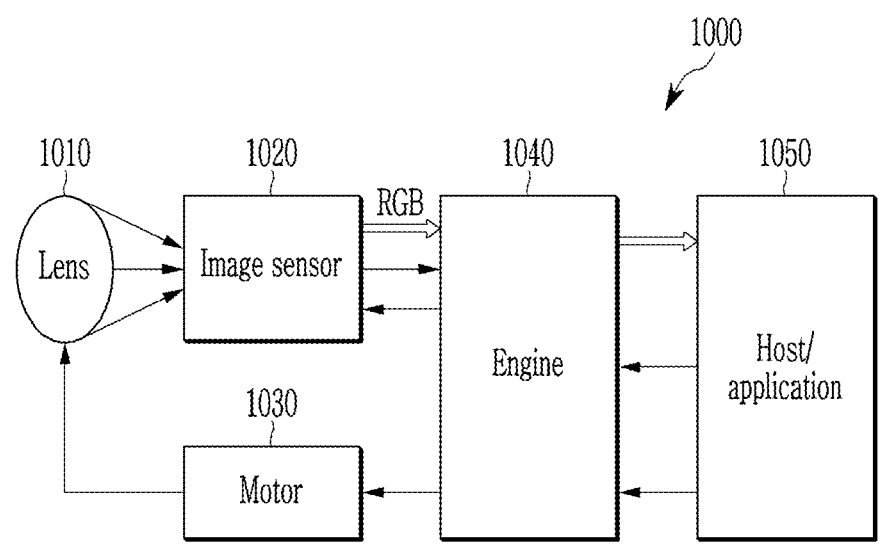
FIG. 11 is a block diagram of a digital camera including an image sensor according to an embodiment

For example, FIG. 11 is a block diagram of a digital camera including an image sensor according to an embodiment.

Referring to FIG. 11, a digital camera 1000 includes a lens 1010, an image sensor 1020, a motor 1030, and an engine 1040. The image sensor 1020 may be one of image sensors according to embodiments shown in FIGS. 5 to 10 discussed above.

The lens 1010 concentrates incident light on the image sensor 1020. The image sensor 1020 generates RGB data for received light through the lens 1010. In some embodiments, the image sensor 1020 may interface with the engine 1040. The motor 1030 may adjust the focus of the lens 1010 or perform shuttering in response to a control signal received from the engine 1040. The engine 1040 may control the image sensor 1020 and the motor 1030. The engine 1040 may be connected to a host/application 1050.

In example embodiments, the motor 1030, engine 1040, and host/application 1050 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Hereinafter, the present disclosure is illustrated in more detail with reference to examples. However, these examples are non-limiting, and the present scope is not limited thereto.

Manufacture of Organic Optoelectronic Device

Example 1-1

ITO is sputtered on a glass substrate to form a 150 nm-thick anode. On the anode, a compound represented by Chemical Formula A is deposited to form a 5 nm-thick electron blocking layer. On the electron blocking film, a 90 nm-thick photoelectric conversion layer is formed by codepositing a compound represented by Chemical Formula B as a p-type semiconductor and C60 as an n-type semiconductor in a volume ratio of 1.5:1 and in addition, a compound represented by Chemical Formula C-1 as an n-type dopant in 1 volume % based on a total volume of the photoelectric conversion layer. On the photoelectric conversion layer, ITO is sputtered to form a 7 nm-thick cathode. Subsequently, aluminum oxide ($Al_2O_3$) is deposited on the cathode to form a 50 nm-thick anti-reflection layer, and then sealed with a glass plate to manufacture an organic photoelectric device.

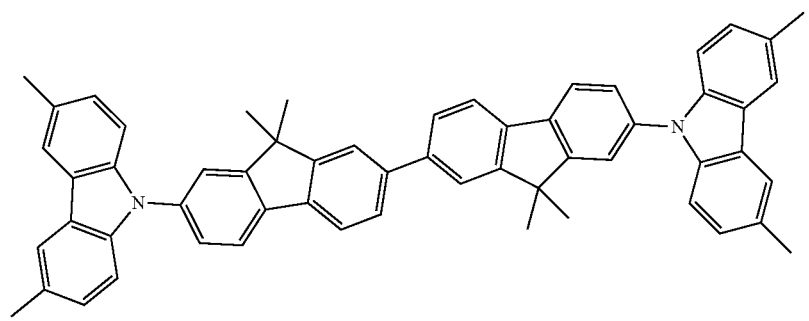

[Chemical Formula A]

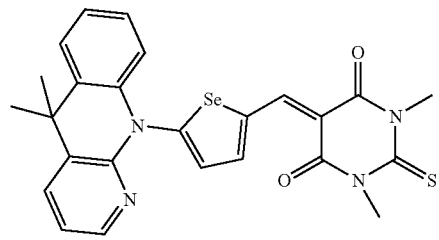

[Chemical Formula B]

Example 1-2

An organic photoelectric device is manufactured according to the same method as Example 1-1 except that the compound represented by Chemical Formula C-1 as an n-type dopant is codeposited to be 5 volume % based on a total volume of the photoelectric conversion layer.

Example 1-3

An organic photoelectric device is manufactured according to the same method as Example 1-1 except that the compound represented by Chemical Formula C-1 as an n-type dopant is codeposited to be 10 volume % based on a total volume of the photoelectric conversion layer.

Example 1-4

An organic photoelectric device is manufactured according to the same method as Example 1-1 except that a compound represented by Chemical Formula C-2 as an n-type dopant is used.

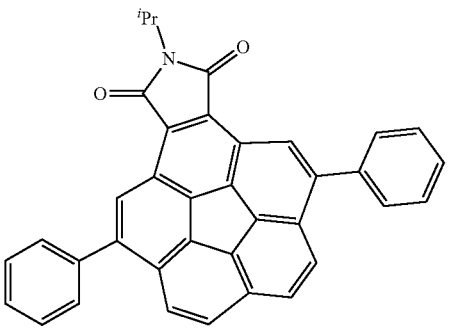

[Chemical Formula C-2]

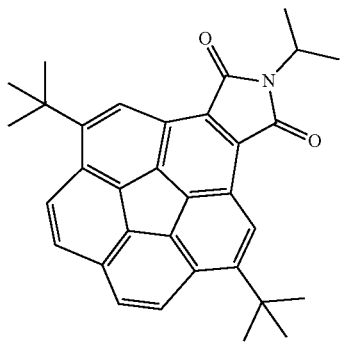

[Chemical Formula C-1]

Example 1-5

An organic photoelectric device is manufactured according to the same method as Example 1-1 except that the compound represented by Chemical Formula B as a p-type semiconductor and C60 as an n-type semiconductor are codeposited in a volume ratio of 1.2:1.

Example 1-6

An organic photoelectric device is manufactured according to the same method as Example 1-1 except that the compound represented by Chemical Formula B as a p-type semiconductor and C60 as an n-type semiconductor are codeposited in a volume ratio of 1:1 to form a photoelectric conversion layer.

Example 2-1

ITO is sputtered on a glass substrate to form a 150 nm-thick anode. On the anode, a 5 nm-thick electron blocking layer is formed by depositing the compound represented by Chemical Formula A. On the electron blocking film, a 70 nm-thick first photoelectric conversion layer is formed by codepositing the compound represented by Chemical Formula B as a p-type semiconductor and C60 as an n-type semiconductor in a volume ratio of 2.5:1. Subsequently, a 20 nm-thick second photoelectric conversion layer is codeposited by using the compound represented by Chemical Formula B as a p-type semiconductor and C60 as an n-type semiconductor in a volume ratio of 1.5:1 and in addition, the compound represented by Chemical Formula C-1 as an n-type dopant in an amount of 1 volume % based on the total volume of the second photoelectric conversion layer. On the second photoelectric conversion layer, ITO is sputtered to form a 7 nm-thick cathode. Subsequently, aluminum oxide ($Al_2O_3$) is deposited on the cathode to form a 50 nm-thick anti-reflection layer and then, sealed with a glass plate to manufacture an organic photoelectric device.

Example 2-2

An organic photoelectric device is manufactured according to the same method as Example 2-1 except that the compound represented by Chemical Formula C-1 as an n-type dopant is codeposited to be 5 volume % based on the total volume of the second photoelectric conversion layer.

Example 2-3

An organic photoelectric device is manufactured according to the same method as Example 2-1 except that the compound represented by Chemical Formula C-1 as an n-type dopant is codeposited to be 10 volume % based on the total volume of the second photoelectric conversion layer.

Example 2-4

An organic photoelectric device is manufactured according to the same method as Example 2-1 except that the compound represented by Chemical Formula C-2 is used as an n-type dopant.

Example 2-5

An organic photoelectric device is manufactured according to the same method as Example 2-1 except that the compound represented by Chemical Formula B as a p-type semiconductor and C60 as an n-type semiconductor are codeposited in a volume ratio of 2.5:1 to form a first photoelectric conversion layer.

Example 2-6

An organic photoelectric device is manufactured according to the same method as Example 2-1 except that the compound represented by Chemical Formula B as a p-type semiconductor and C60 as an n-type semiconductor are codeposited in a volume ratio of 3:1 to form a first photoelectric conversion layer.

Comparative Example 1-1

An organic photoelectric device is manufactured according to the same method as Example 1-1 except that the n-type dopant is not used.

Comparative Example 2-1

Figure 12:
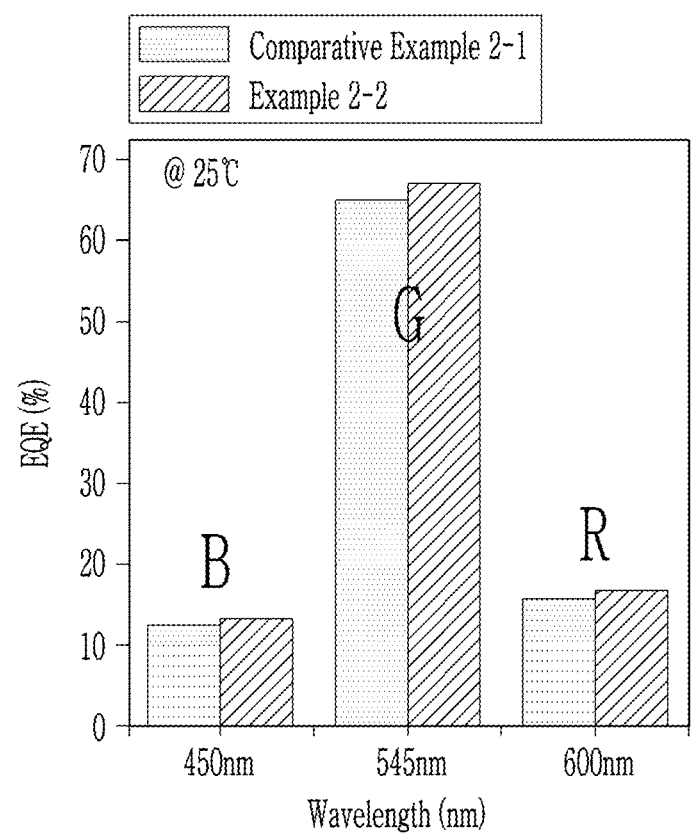
FIG. 12 is a graph showing external quantum efficiency at room temperature (25° C.) of the organic photoelectric devices of Example 2-2 and Comparative Example 2-1.
Figure 13:
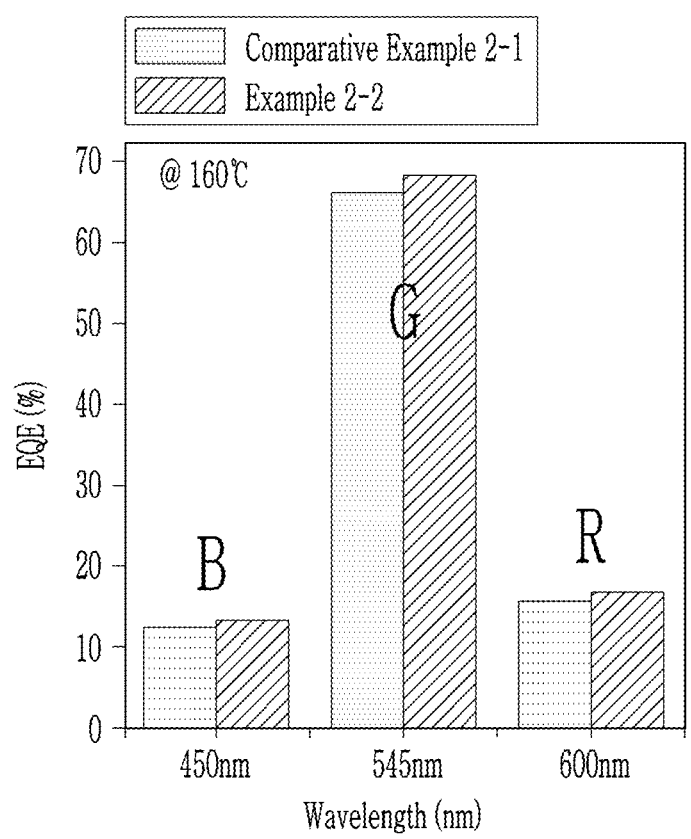
FIG. 13 is a graph illustrating external quantum efficiency at high temperature (160° C.) of the organic photoelectric devices according to Example 2-2 and Comparative Example 2-1.

An organic photoelectric device is manufactured according to the same method as Example 2-1 except that the n-type dopant is not used.
Evaluation 1: External Quantum Efficiency at Room Temperature and High Temperature Photoelectric conversion efficiency (EQE) of the organic photoelectric devices according to Examples 1-1 to 2-6 and Comparative Examples 1-1 and 2-1 is evaluated. The external quantum efficiency (EQE) is evaluated in an Incident Photon to Current Efficiency (IPCE) method at 3 V in a wavelength region of 400 nm to 720 nm ($\Delta_{max}$=550 nm). The results of the organic photoelectric devices according to Example 2-2 and Comparative Example 2-1 are shown in FIGS. 12 and 13. FIG. 12 is a graph showing external quantum efficiency at room temperature (25° C.) of the organic photoelectric devices of Example 2-2 and Comparative Example 2-1, and FIG. 13 is a graph illustrating external quantum efficiency at a high temperature (160° C.) of the organic photoelectric devices according to Example 2-2 and Comparative Example 2-1.

Referring to FIGS. 12 and 13, the organic photoelectric device according to Example 2-2 exhibits improved external quantum efficiency (EQE) at room temperature and at a high temperature compared with the organic photoelectric device according to Comparative Example 2-1.
Evaluation 2: Charge Mobility and Trap Density Charge mobility and trap density of the organic photoelectric devices according to Examples 1-1 to 2-6 and Comparative Examples 1-1 and 2-1 are evaluated. The charge mobility and the trap density are evaluated with reference to an article (Nature Communications 5, 5784 (2014)). Specifically, the charge mobility is evaluated by measuring resistance (R) and capacitance (C) of the photoelectric conversion layers of the organic photoelectric device through an impedance analysis and thus $R^c$ delay thereof. The trap density is evaluated by using a built-in potential measured through the impedance analysis and electric capacity of the photoelectric conversion layers depending on a thickness and a frequency.

Figure 14:
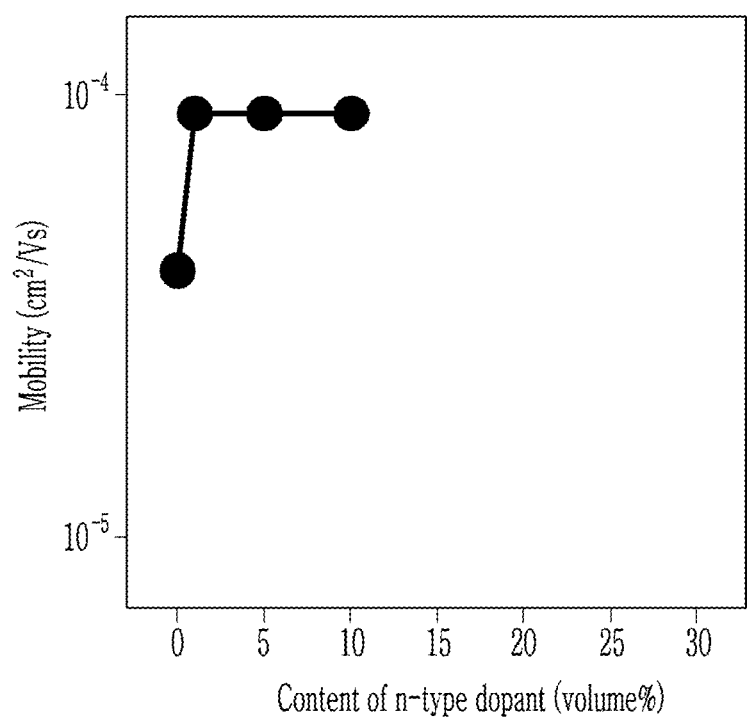
FIG. 14 is a graph illustrating charge mobility of the organic photoelectric device according to a content of the n-type dopant.
Figure 15:
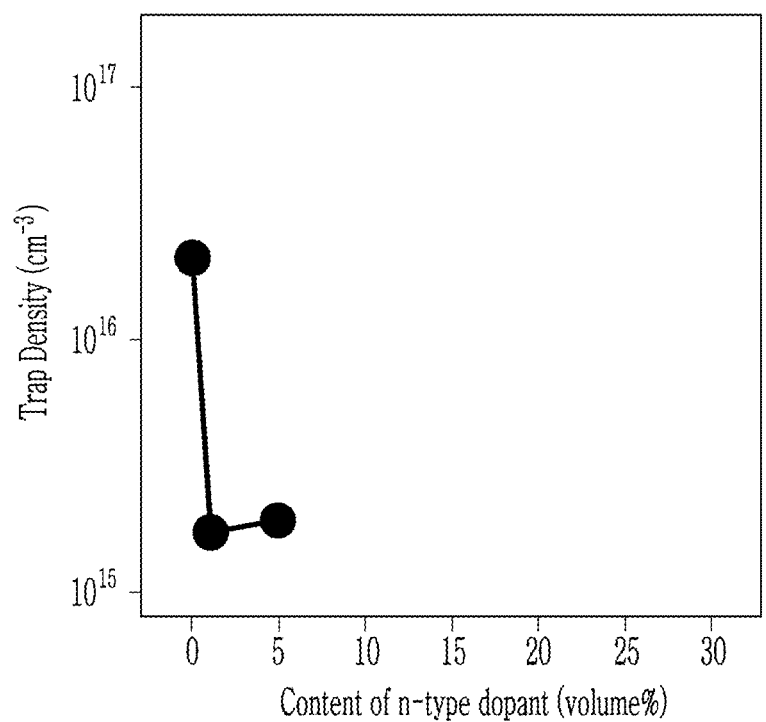
FIG. 15 is a graph illustrating trap density of the organic photoelectric device according to a content of the n-type dopant.

When the n-type dopant is 1 volume % (Example 2-1), 5 volume % (Example 2-2), and 0 volume % (Comparative Example 2-1), the results of the organic photoelectric devices are shown in FIGS. 14 and 15. FIG. 14 is a graph illustrating charge mobility of the organic photoelectric device according to a content of the n-type dopant, and FIG. 15 is a graph illustrating trap density of the organic photoelectric device according to a content of the n-type dopant.

Referring to FIGS. 14 and 15, when the n-type dopant is 1 volume % (Example 2-1) and 5 volume % (Example 2-2), the charge mobility is greatly increased, but the trap density is greatly decreased, compared with 0 volume % (Comparative Example 2-1).
Evaluation 3: Remaining Charge Characteristics and Response Time (Lag Time)

Remaining charge characteristics and response time (lag time) of the organic photoelectric devices according to Examples 1-1 to 2-6 and Comparative Examples 1-1 and 2-1 are evaluated. The remaining charge characteristics and the response time are evaluated by irradiating the organic photoelectric devices of Examples 1-1 to 2-6 and Comparative Examples 1-1 and 2-1 from an upper electrode (a cathode) with LED light at a wavelength of 530 nm, applying an electric field with intensity of 3 V/100 nm to the organic photoelectric devices, turning the LED light off, and then, measuring after-image currents. The results of the organic photoelectric devices according to Example 2-2 and Comparative Example 2-1 are shown in FIGS. 16 and 17.

Figure 16:
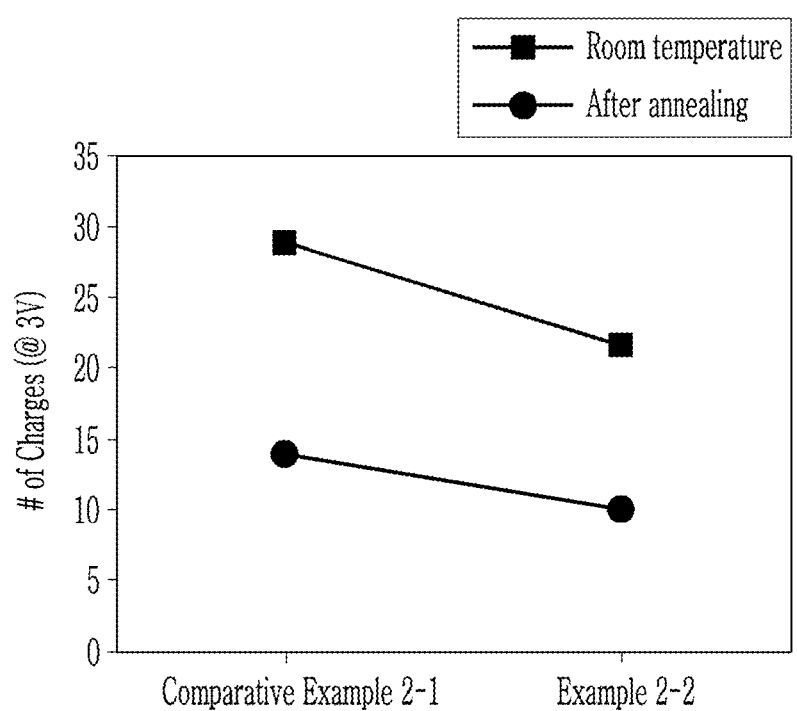
FIG. 16 is a graph illustrating the amount of remaining charges at room temperature and high temperature (after annealing) of the organic photoelectric devices according to Example 2-2 and Comparative Example 2-1.
Figure 17:
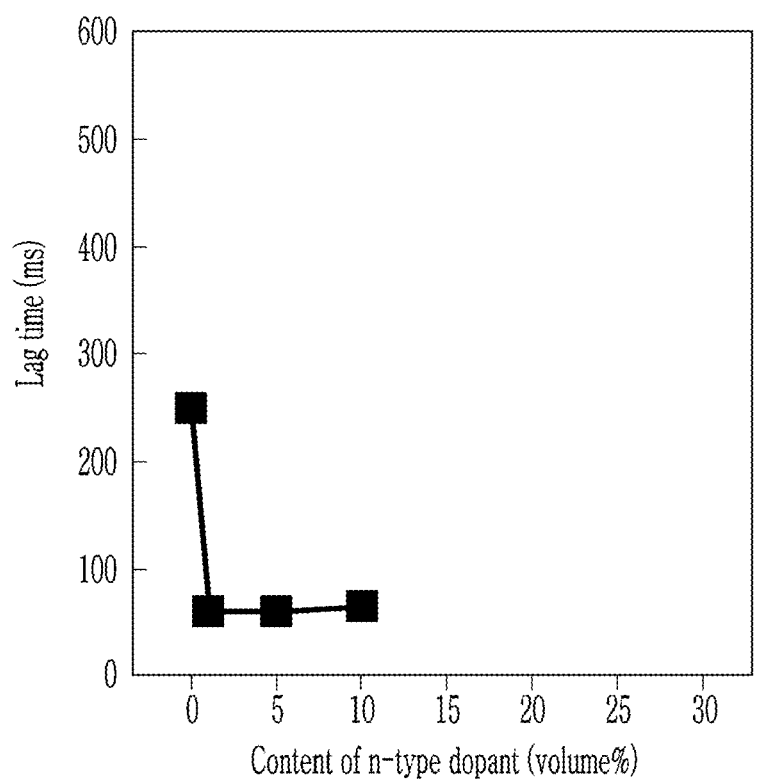
FIG. 17 is a graph illustrating a response time (lag time) of an organic photoelectric device according to a content of an n-type dopant.

FIG. 16 is a graph illustrating the amount of remaining charges at room temperature and high temperature (after annealing) of the organic photoelectric devices according to Example 2-2 and Comparative Example 2-1, and FIG. 17 is a graph illustrating a response time (lag time) of an organic photoelectric device according to a content of an n-type dopant.

Referring to FIG. 16, when the n-type dopant is 5 volume % (Example 2-2) compared with 0 volume % (Comparative Example 2-1), a current charge amount is greatly decreased at room temperature and a high temperature. In addition, referring to FIG. 17, when the n-type dopant is 1 volume % (Example 2-1), 5 volume % (Example 2-2), and 10 volume % (Example 2-3) compared with 0 volume % (Comparative Example 2-1), the response time is greatly reduced.

While this disclosure has been described in connection with what is presently considered to be practical example embodiments, it is to be understood that inventive concepts are not limited to the disclosed embodiments. On the contrary, inventive concepts cover various modifications and equivalent arrangements included within the spirit and scope of the appended claims.

What is claimed is:
1. An organic photoelectric device, comprising:
a first electrode and a second electrode facing each other; and
a photoelectric conversion layer between the first electrode and the second electrode,
the photoelectric conversion layer including a p-type semiconductor, an n-type semiconductor, and an n-type dopant,
the n-type dopant represented by Chemical Formula 1,

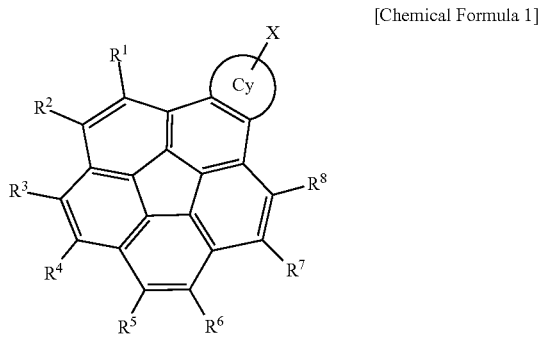

[Chemical Formula 1]

wherein, in Chemical Formula 1,
Cy is a cyclic hydrocarbon group selected from a C3 to C20 alicyclic hydrocarbon group and a C6 to C20 aromatic hydrocarbon group, or a fused ring group of two or more cyclic hydrocarbon groups,
X is at least one bulky substituent selected from a substituted or unsubstituted C3 to C30 branched alkyl group, a substituted or unsubstituted C3 to C30 cycloalkyl group, a substituted or unsubstituted C3 to C30 heterocycloalkyl group, a substituted or unsubstituted C6 to C30 aryl group, and a substituted or unsubstituted C2 to C30 heteroaryl group, and $R^1$ to $R^8$ are independently hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof,
provided that at least one of $R^1$ to $R^8$ is a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof.

2. The organic photoelectric device of claim 1, wherein at least one of the p-type semiconductor and the n-type semiconductor is a light absorbing material configured to selectively absorb one of red light, green light, and blue light.

3. The organic photoelectric device of claim 1, wherein the n-type semiconductor comprises fullerene or a fullerene derivative.

4. The organic photoelectric device of claim 1, wherein one of the p-type semiconductor and the n-type semiconductor is a light absorbing material that is configured to selectively absorb green light having a maximum absorption wavelength at about 520 nm to about 580 nm.

5. The organic photoelectric device of claim 1, wherein in Chemical Formula 1, at least one of $R^1$ to $R^3$ and at least one of $R^6$ to $R^8$ are the same or different, and
at least one of $R^1$ to $R^3$ and at least one of $R^6$ to $R^8$ are a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof.

6. The organic photoelectric device of claim 1, wherein in Chemical Formula 1, at least one bulky substituent of $R^1$ to $R^3$ and at least one bulky substituent of $R^6$ to $R^8$ are present symmetrically with respect to an axis through Cy.

7. The organic photoelectric device of claim 1, wherein in Chemical Formula 1,
at least one of $R^1$ and $R^2$ and at least one of $R^7$ and $R^8$ are the same or different, and
at least one of $R^1$ and $R^2$ and at least one of $R^7$ and $R^8$ are a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof.

8. The organic photoelectric device of claim 1, wherein in Chemical Formula 1,
$R^2$ and $R^7$ are a bulky substituent selected from a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof, and
$R^1$, $R^3$, $R^4$, $R^5$, $R^6$, and $R^8$ are hydrogen, deuterium, a halogen, a cyano group, a C1 to C20 linear alkyl group, or a combination thereof.

9. The organic photoelectric device of claim 1, wherein the n-type dopant represented by Chemical Formula 1 is a compound represented by Chemical Formula 1A:

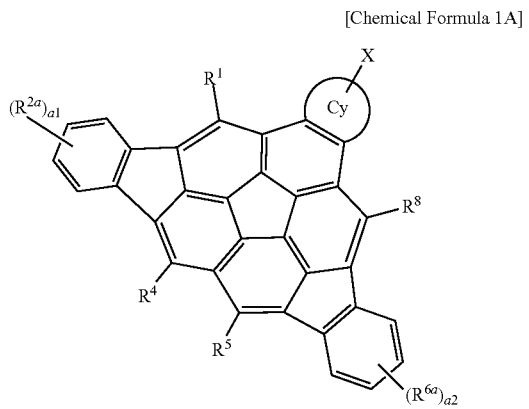

[Chemical Formula 1A]

wherein, in Chemical Formula 1,
Cy is a cyclic hydrocarbon group selected from a C3 to C20 alicyclic hydrocarbon group and a C6 to C20 aromatic hydrocarbon group or a fused ring group of two or more cyclic hydrocarbon groups,
X is at least one bulky substituent selected from a substituted or unsubstituted C3 to C30 branched alkyl group, a substituted or unsubstituted C3 to C30 cycloalkyl group, a substituted or unsubstituted C3 to C30 heterocycloalkyl group, a substituted or unsubstituted C6 to C30 aryl group, and a substituted or unsubstituted C2 to C30 heteroaryl group,
$R^1$, $R^{2a}$, $R^4$, $R^5$, $R^{6a}$, and $R^8$ are independently hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, and
a1 and a2 are independently an integer of 1 to 4.

10. The organic photoelectric device of claim 1, wherein the cyclic hydrocarbon group in Cy is a heterocyclic group including at least one functional group selected from —N═, —NR—, —O—, —S—, —Se—, —Te—, —C(═O)—, —C(═S)—, —C(═Se)—, —C(═Te)—, —C(═C(CN)$_2$)—, and —C(═NR)— in a ring wherein R is a C1 to C10 alkyl group.

11. The organic photoelectric device of claim 1, wherein the n-type dopant in the photoelectric conversion layer is in an upper portion of the photoelectric conversion layer.

12. The organic photoelectric device of claim 1, wherein a content of the n-type dopant increases in a direction toward a surface of an upper portion of the photoelectric conversion layer.

13. The organic photoelectric device of claim 1, wherein the photoelectric conversion layer comprises a first photoelectric conversion layer and a second photoelectric conversion layer,
the first photoelectric conversion layer comprises a p-type semiconductor and an n-type semiconductor, and
the second photoelectric conversion layer comprises a p-type semiconductor, an n-type semiconductor, and the n-type dopant represented by Chemical Formula 1.

14. The organic photoelectric device of claim 13, wherein a second composition ratio ($p^2/n^2$) of the p-type semiconductor relative to a total amount of the n-type semiconductor and the n-type dopant of the second photoelectric conversion layer is smaller than a first composition ratio ($p^1/n^1$) of the p-type semiconductor relative to the n-type semiconductor of the first photoelectric conversion layer.

15. The organic photoelectric device of claim 13, wherein the first photoelectric conversion layer is thicker than the second photoelectric conversion layer.

16. An organic photoelectric device, comprising:
a first electrode and a second electrode facing each other; and
a photoelectric conversion layer between the first electrode and the second electrode,
the photoelectric conversion layer including a p-type semiconductor, an n-type semiconductor, and an n-type dopant,
the n-type dopant represented by Chemical Formula 1,

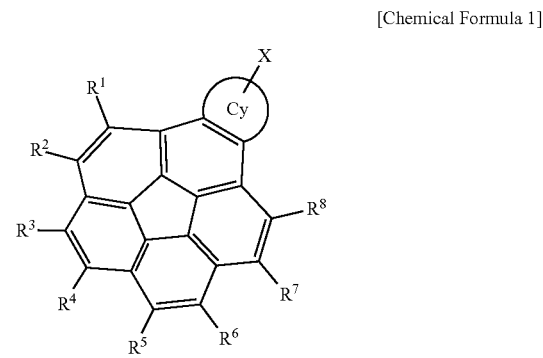

[Chemical Formula 1]

wherein, in Chemical Formula 1,
Cy includes a C3 to C20 alicyclic hydrocarbon group and a C6 to C20 aromatic hydrocarbon group, or a fused ring group of two or more cyclic hydrocarbon groups, X includes a substituted or unsubstituted C3 to C30 branched alkyl group, a substituted or unsubstituted C3 to C30 cycloalkyl group, a substituted or unsubstituted C3 to C30 heterocycloalkyl group, a substituted or unsubstituted C6 to C30 aryl group, and a substituted or unsubstituted C2 to C30 heteroaryl group, and $R^1$ to $R^8$ are independently hydrogen, deuterium, a halogen, a cyano group, a substituted or unsubstituted C1 to C20 linear or branched alkyl group, a substituted or unsubstituted C1 to C20 linear or branched alkoxy group, a substituted or unsubstituted C3 to C20 linear or branched alkylsilyl group, a substituted or unsubstituted C2 to C20 linear or branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, or a combination thereof, provided that at least one of $R^1$ to $R^8$ includes a substituted or unsubstituted C3 to C20 branched alkyl group, a substituted or unsubstituted C3 to C20 branched alkoxy group, a substituted or unsubstituted C3 to C20 branched alkylsilyl group, a substituted or unsubstituted C3 to C20 branched heteroalkyl group, a substituted or unsubstituted C6 to C30 aryl group, a substituted or unsubstituted C2 to C30 heteroaryl group, a substituted or unsubstituted C3 to C30 cycloalkyl group, a substituted or unsubstituted C3 to C30 heterocycloalkyl group, and a combination thereof.

17. The organic photoelectric device of claim 16, wherein the n-type semiconductor is a fullerene or a fullerene derivative.

18. The organic photoelectric device of claim 16, wherein the n-type semiconductor is a light absorbing material that is configured to selective absorb green light having a maximum absorption wavelength in a range of about 520 nm to about 580 nm.

19. An image sensor comprising:
the organic photoelectric device of claim 1.

20. An electronic device comprising:
the image sensor of claim 19.

21. An image sensor comprising:
the organic photoelectric device of claim 16.

22. An electronic device comprising:
The image sensor of claim 21.

* * * * *